(12) United States Patent
Lee et al.

(10) Patent No.: US 11,217,677 B2
(45) Date of Patent: *Jan. 4, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Byounghoon Lee, Suwon-si (KR); Jongho Park, Suwon-si (KR); Wandon Kim, Seongnam-si (KR); Sangjin Hyun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 102 days.

This patent is subject to a terminal disclaimer.

(21) Appl. No.: 16/584,464

(22) Filed: Sep. 26, 2019

(65) Prior Publication Data

US 2020/0287013 A1 Sep. 10, 2020

(30) Foreign Application Priority Data

Mar. 8, 2019 (KR) ........................ 10-2019-0027042

(51) Int. Cl.
*H01L 29/49* (2006.01)
*H01L 27/088* (2006.01)
(Continued)

(52) U.S. Cl.
CPC .... *H01L 29/4966* (2013.01); *H01L 21/28088* (2013.01); *H01L 21/28185* (2013.01);
(Continued)

(58) Field of Classification Search
CPC ............. H01L 29/4966; H01L 27/0886; H01L 29/785; H01L 29/51; H01L 21/28185;
(Continued)

(56) References Cited

U.S. PATENT DOCUMENTS 6,521,526 B2 2/2003 Dong et al.
7,700,429 B2 4/2010 Kim et al.
(Continued)

FOREIGN PATENT DOCUMENTS

KR 10-0398037 B1 9/2003

*Primary Examiner* — Su C Kim
(74) *Attorney, Agent, or Firm* — Volentine, Whitt & Francos, PLLC

(57) ABSTRACT

A semiconductor device includes a substrate having first and second active regions, first and second active patterns on the first and second active regions, first and second gate electrodes running across the first and second active patterns, and a high-k dielectric layer between the first active pattern and the first gate electrode and between the second active pattern and the second gate electrode. The first gate electrode includes a work function metal pattern and an electrode pattern. The second gate electrode includes a first work function metal pattern, a second work function metal pattern, and an electrode pattern. The first work function metal pattern contains the same impurity as that of the high-k dielectric layer. An impurity concentration of the first work function metal pattern of the second gate electrode is greater than that of the work function metal pattern of the first gate electrode.

20 Claims, 70 Drawing Sheets

(51) Int. Cl.
*H01L 29/78* (2006.01)
*H01L 29/51* (2006.01)
*H01L 21/28* (2006.01)
*H01L 21/8234* (2006.01)
*H01L 29/423* (2006.01)
*H01L 29/66* (2006.01)
*H01L 21/3215* (2006.01)
*H01L 21/3115* (2006.01)

(52) U.S. Cl.
CPC .......... *H01L 21/82345* (2013.01); *H01L 21/823431* (2013.01); *H01L 27/0886* (2013.01); *H01L 29/42392* (2013.01); *H01L 29/51* (2013.01); *H01L 29/66795* (2013.01); *H01L 29/785* (2013.01); *H01L 29/7853* (2013.01); *H01L 21/3115* (2013.01); *H01L 21/3215* (2013.01)

(58) Field of Classification Search
CPC ......... H01L 21/28088; H01L 21/82345; H01L 21/823431; H01L 29/7853; H01L 29/42392; H01L 29/66795; H01L 21/3215; H01L 21/3115; H01L 27/088; H01L 29/78; H01L 29/66045; H01L 29/36; H01L 29/40114; H01L 21/02172; H01L 21/762
See application file for complete search history.

(56) References Cited

U.S. PATENT DOCUMENTS

| | | |
|---|---|---|
| 9,287,181 B2 | 3/2016 | Tseng et al. |
| 9,502,403 B2 | 11/2016 | Xie |
| 9,564,489 B2 | 2/2017 | Yeo et al. |
| 9,640,400 B1 | 5/2017 | Cheng et al. |
| 9,960,053 B2 | 5/2018 | Hou et al. |
| 10,128,376 B2 | 11/2018 | Choi et al. |
| 10,559,687 B2 * | 2/2020 | Song ................ H01L 29/66545 |
| 2018/0012767 A1 | 1/2018 | Aoyama |
| 2018/0012811 A1 | 1/2018 | Li |

* cited by examiner

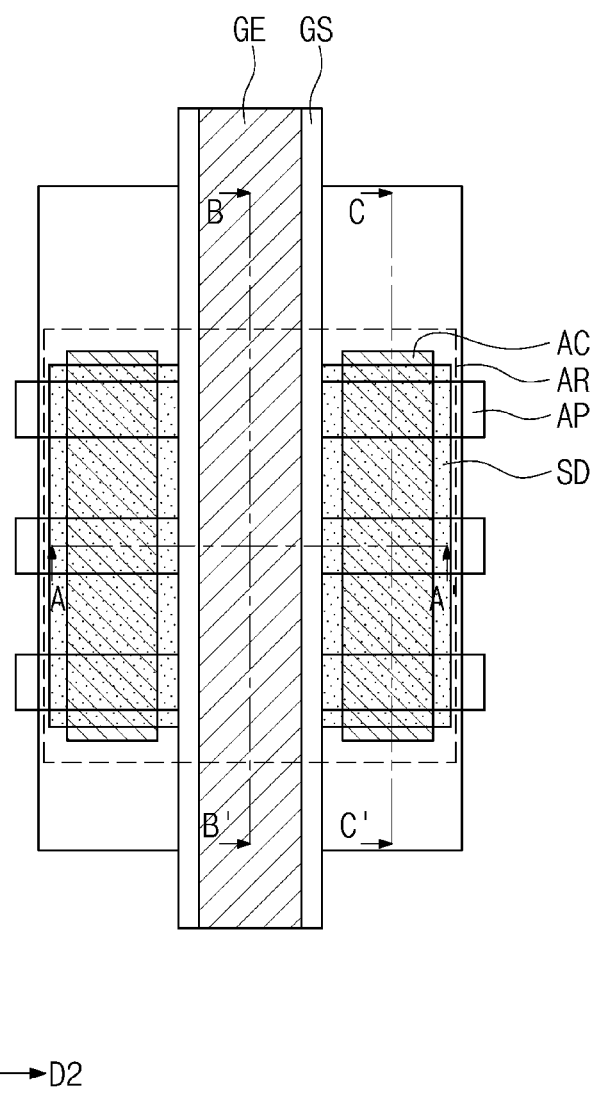

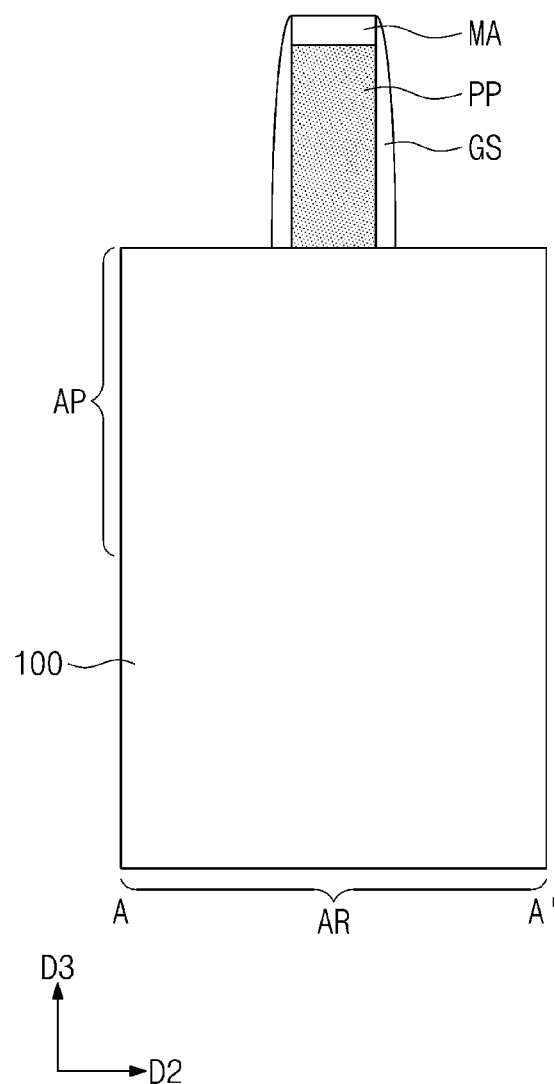

FIG. 8
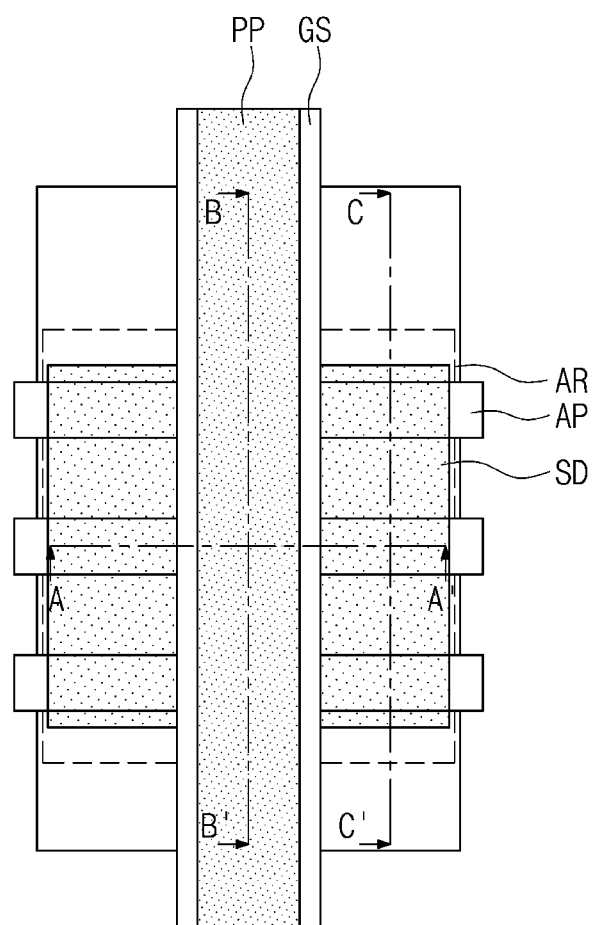
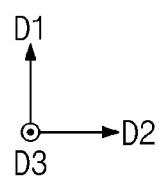

FIG. 25
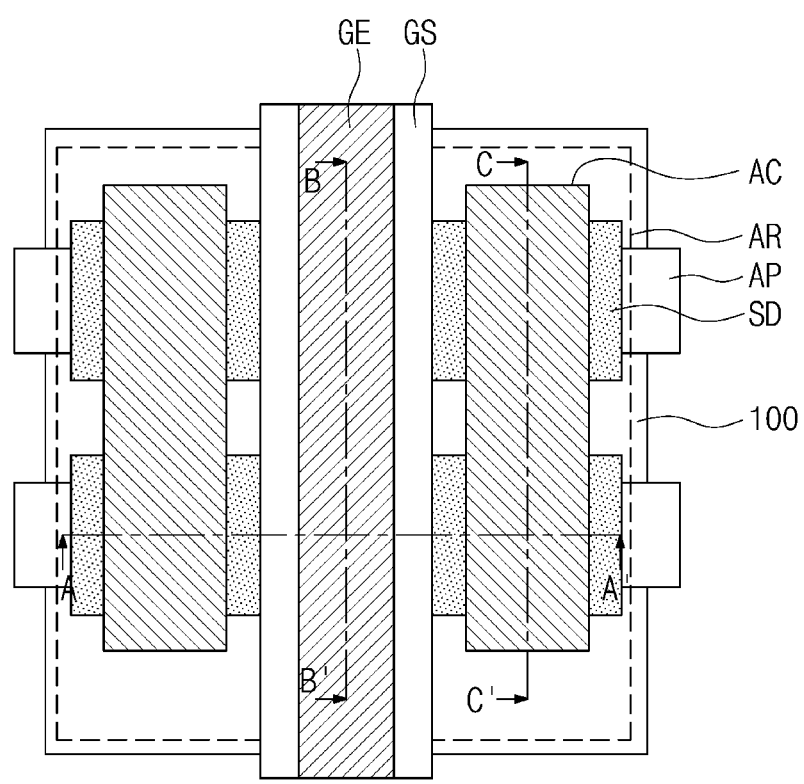
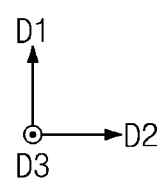

FIG. 27
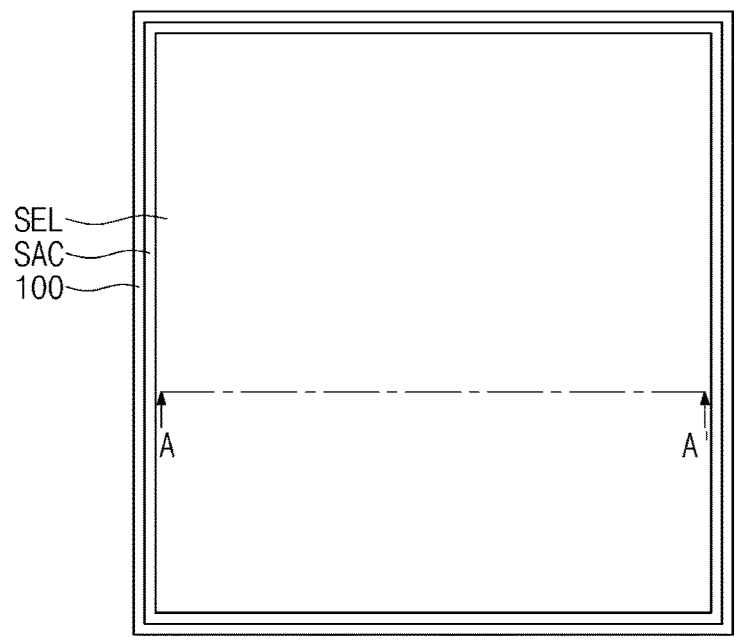
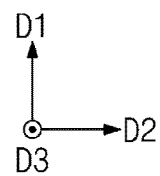
FIG. 28
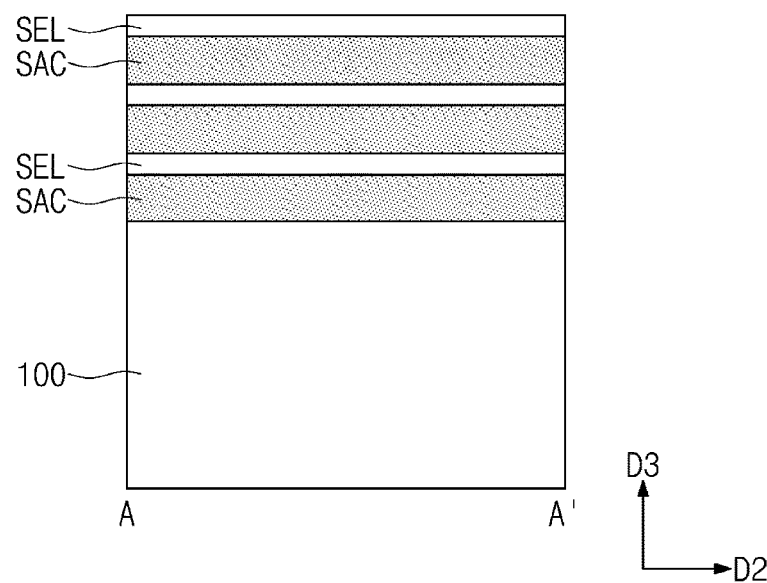
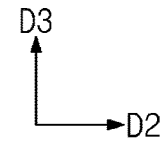

FIG. 29
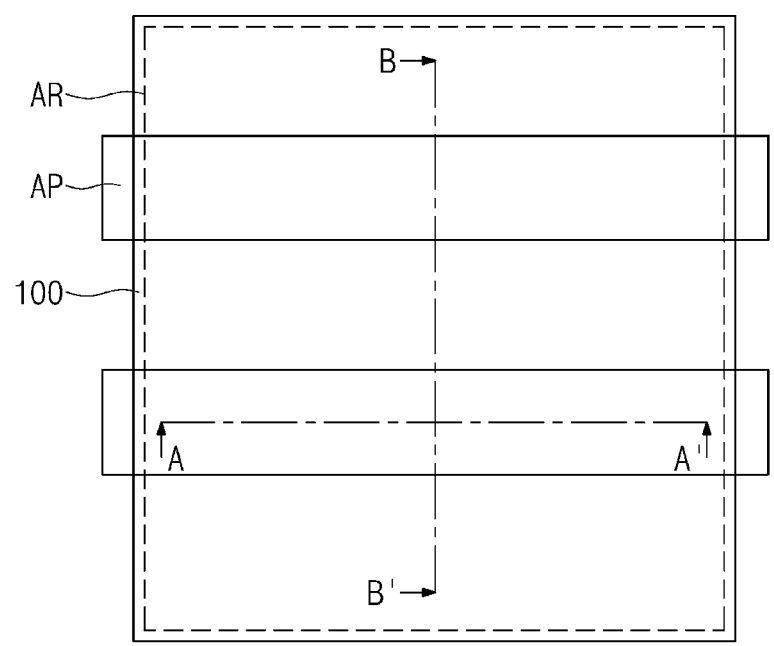
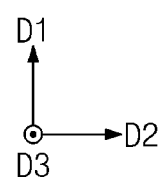

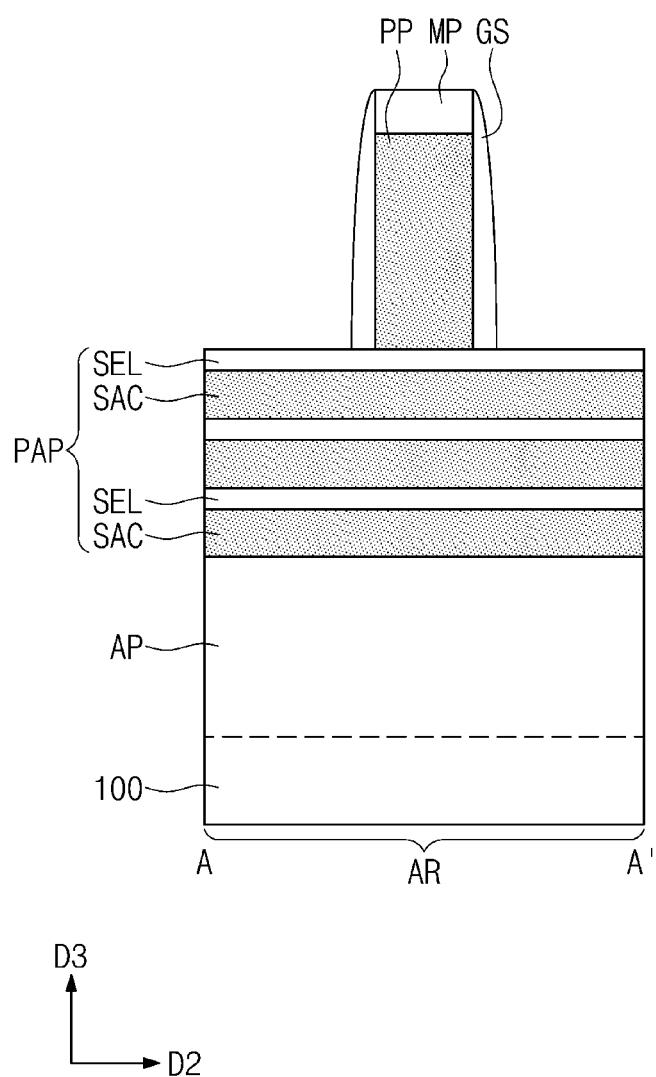

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2019-0027042 filed on Mar. 8, 2019 in the Korean Intellectual Property Office, the entire contents of which are hereby incorporated by reference.

BACKGROUND

The present disclosure relates to a semiconductor device, and more particularly, to a semiconductor device including a field effect transistor and a method of fabricating the same.

A semiconductor device includes an integrated circuit consisting of metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various researches have been developed to fabricate semiconductor devices having superior performances while overcoming limitations due to high integration of the semiconductor devices.

SUMMARY

Some example embodiments of the present disclosure provide a semiconductor device with improved electrical characteristics.

According to some example embodiments of the present disclosure, a semiconductor device may include: a substrate having a first active region and a second active region; a first active pattern and a second active pattern respectively on the first active region and the second active region; a first gate electrode and a second gate electrode respectively running across the first active pattern and the second active pattern; and a high-k dielectric layer between the first active pattern and the first gate electrode and between the second active pattern and the second gate electrode. The first gate electrode may include: a work function metal pattern on the high-k dielectric layer; and an electrode pattern on the work function metal pattern. The second gate electrode may include: a first work function metal pattern on the high-k dielectric layer; a second work function metal pattern on the first work function metal pattern; and an electrode pattern on the second work function metal pattern. The first work function metal pattern may contain an impurity identical to an impurity of the high-k dielectric layer. An impurity concentration of the first work function metal pattern of the second gate electrode may be greater than an impurity concentration of the work function metal pattern of the first gate electrode.

According to some example embodiments of the present disclosure, a semiconductor device may include: a substrate; a device isolation layer on the substrate and defining an active pattern, a channel region of the active pattern vertically protruding beyond the device isolation layer; a gate electrode running across the channel region; and a high-k dielectric layer between the channel region and the gate electrode. The gate electrode may include: a work function metal pattern on the high-k dielectric layer; and an electrode pattern on the work function metal pattern. The high-k dielectric layer may include: a first part on a sidewall of the channel region; and a second part on a top surface of the channel region. The work function metal pattern and the high-k dielectric layer may contain the same impurity. An impurity concentration of the first part of the high-k dielectric layer may be less than an impurity concentration of the work function metal pattern.

According to some example embodiments of the present disclosure, a semiconductor device may include: a substrate; a first semiconductor pattern and a second semiconductor pattern vertically stacked on the substrate, the first and second semiconductor patterns being vertically spaced apart from each other; a gate electrode on the first and second semiconductor patterns; and a high-k dielectric layer between the gate electrode and the first and second semiconductor patterns. The gate electrode may include: a first work function metal pattern on the high-k dielectric layer; and an electrode pattern on the first work function metal pattern. The high-k dielectric layer and the gate electrode may fill a first space between the first and second semiconductor patterns. The first work function metal pattern and the high-k dielectric layer may contain the same impurity. An impurity concentration of the high-k dielectric layer may be less than an impurity concentration of the first work function metal pattern.

According to some example embodiments of the present disclosure, a method of fabricating a semiconductor device may include: forming on a substrate a device isolation layer defining an active pattern; forming a high-k dielectric layer on an upper portion of the active pattern, the upper portion protruding beyond the device isolation layer; forming on the high-k dielectric layer an impurity-doped layer containing an impurity; and performing an annealing process on the impurity-doped layer to implant the impurity into the high-k dielectric layer.

BRIEF DESCRIPTION OF THE DRAWINGS

FIG. 1 illustrates a plan view showing a semiconductor device according to some example embodiments of the present disclosure.

FIGS. 4, 6, 8, 10, and 12 illustrate plan views showing a method of fabricating a semiconductor device according to some example embodiments of the present disclosure.

FIGS. 5, 7A, 9A, 11A, and 13A illustrate cross-sectional views taken along line A-A' of FIGS. 4, 6, 8, 10, and 12, respectively.

FIG. 25 illustrates a plan view showing a semiconductor device according to some example embodiments of the present disclosure.

FIGS. 27, 29, 31, 33, 35, 37, and 39 illustrate plan views showing a method of fabricating a semiconductor device according to some example embodiments of the present disclosure.

FIGS. 28, 30A, 32A, 34A, 36A, 38A, and 40A illustrate cross-sectional views taken along line A-A' of FIGS. 27, 29, 31, 33, 35, 37, and 39, respectively.

DETAILED DESCRIPTION OF EMBODIMENTS

Figure 2A:
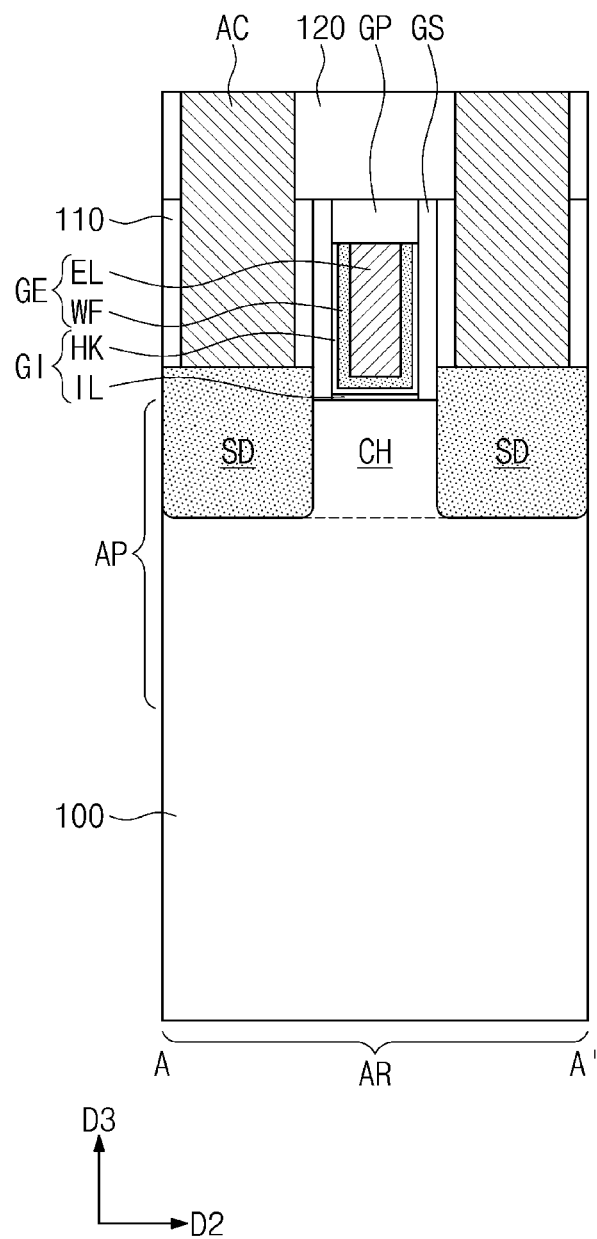
FIGS. 2A, 2B, and 2C illustrate cross-sectional views respectively taken along lines A-A', B-B', and C-C' of FIG. 1.
Figure 2B:
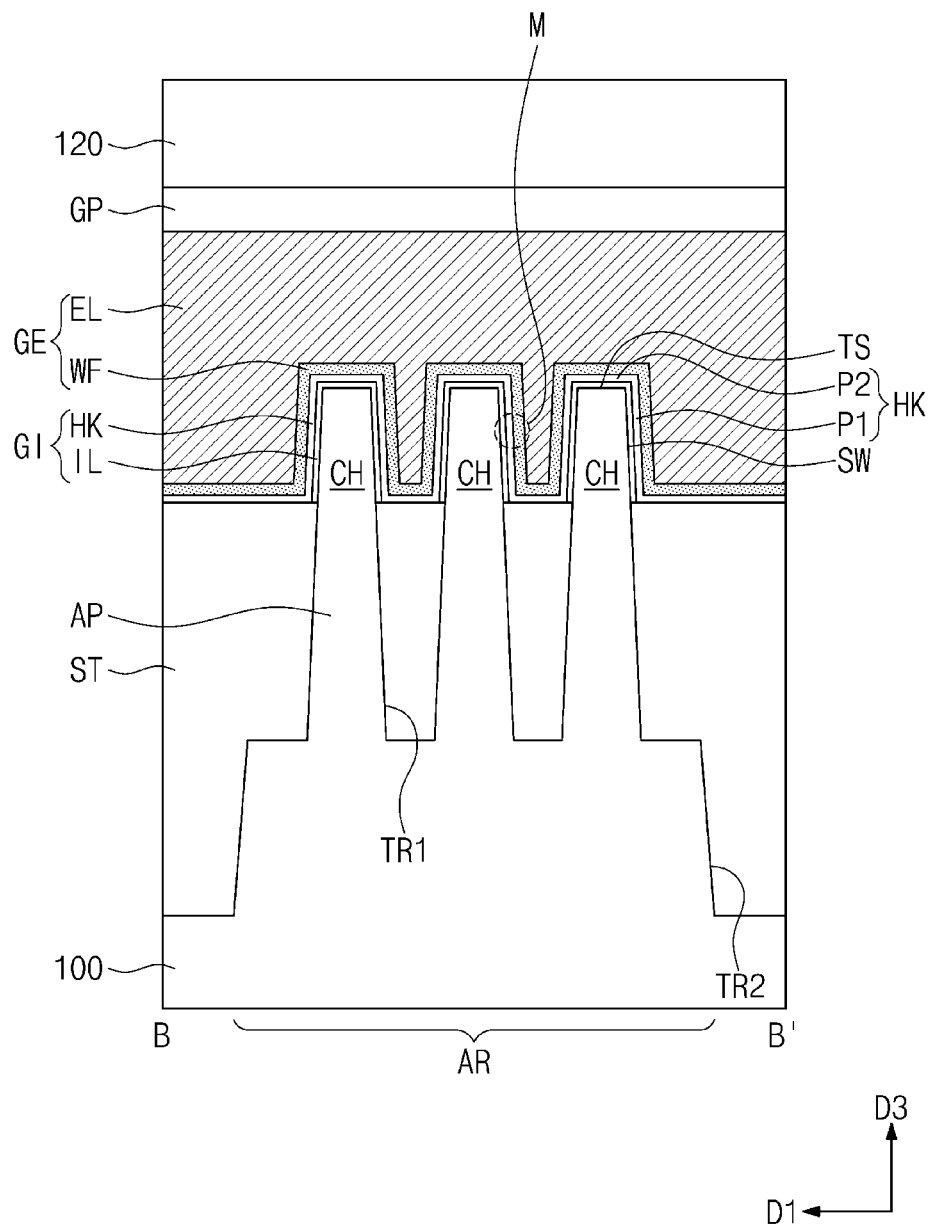
Figure 2C:
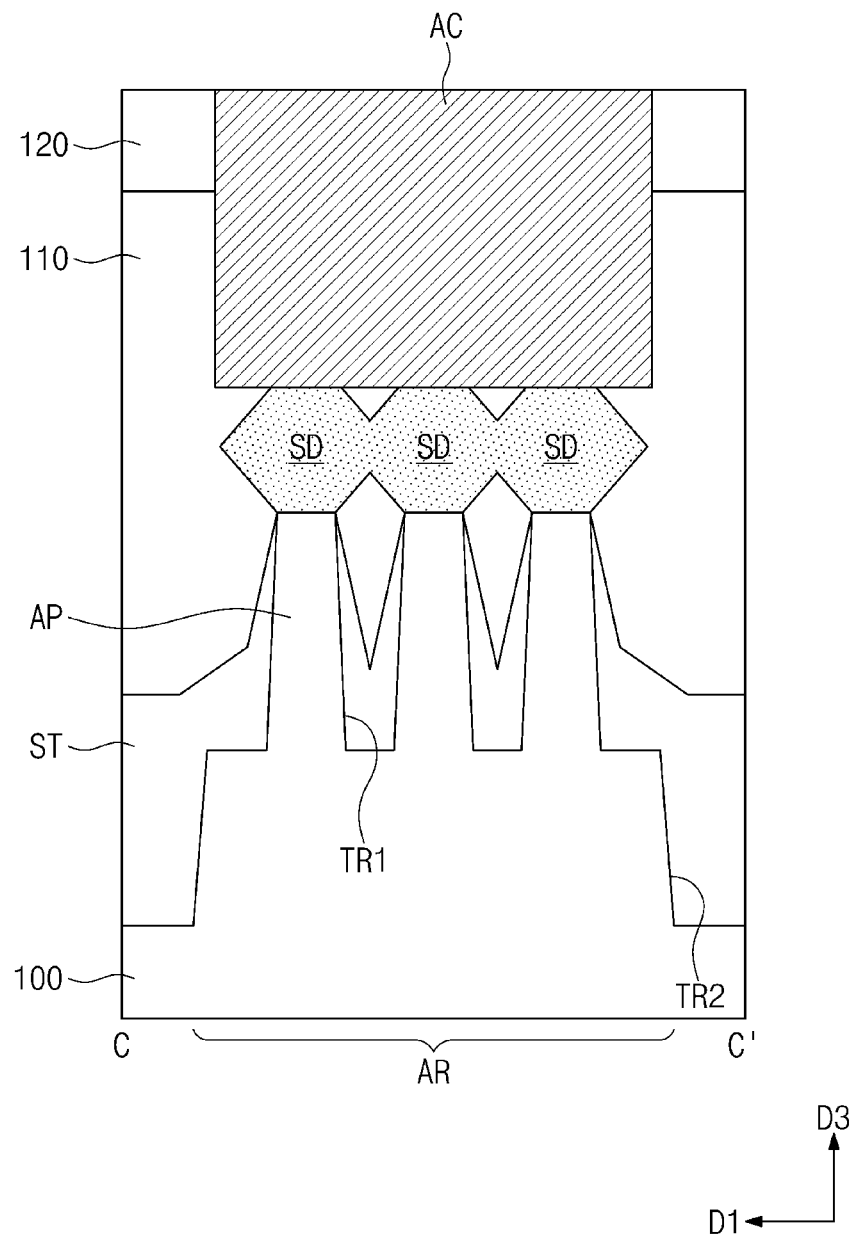
Figure 3:
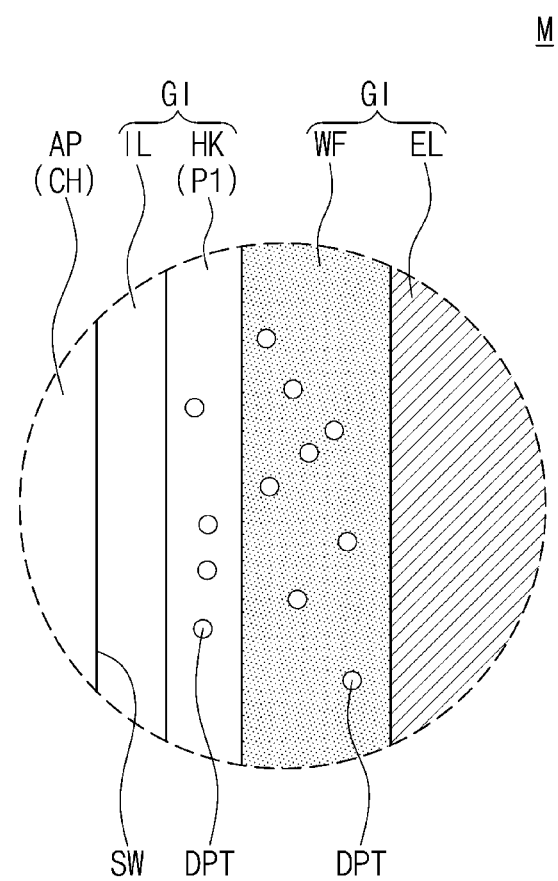
FIG. 3 illustrates an enlarged cross-sectional view of section M shown in FIG. 2B.

FIG. 1 illustrates a plan view showing a semiconductor device according to some example embodiments of the present disclosure. FIGS. 2A, 2B, and 2C illustrate cross-sectional views respectively taken along lines A-A', B-B', and C-C' of FIG. 1. FIG. 3 illustrates an enlarged cross-sectional view of section M shown in FIG. 2B.

Referring to FIGS. 1, 2A to 2C, and 3, a substrate 100 may be provided to include an active region AR. The substrate 100 may be a compound semiconductor substrate or a semiconductor substrate including silicon, germanium, silicon-germanium, or the like. For example, the substrate 100 may be a silicon substrate.

In certain embodiments, the active region AR may be a logic cell region that includes logic transistors constituting a logic circuit of a semiconductor device. For example, logic transistors constituting a logic circuit may be disposed on the logic cell region of the substrate 100. The active region AR may include one of the logic transistors.

The active region AR may be defined by a second trench TR2 formed on an upper portion of the substrate 100. Active patterns AP may be provided on the active region AR. The active patterns AP may extend in a second direction D2. The active patterns AP may be vertically protruding portions of the substrate 100. A first trench TR1 may be defined between neighboring active patterns AP. The first trench TR1 may be shallower than the second trench TR2.

A device isolation layer ST may fill the first and second trenches TR1 and TR2. The device isolation layer ST may include a silicon oxide layer. The active patterns AP may have their upper portions that vertically protrude beyond the device isolation layer ST (see FIG. 2C). Each of the upper portions of the active patterns AP may have a fin shape. The device isolation layer ST may not cover the upper portions of the active patterns AP. The device isolation layer ST may cover lower sidewalls of the active patterns AP.

Source/drain patterns SD may be provided on the upper portions of the active patterns AP. The source/drain patterns SD may be regions doped with p-type or n-type impurities. A channel region CH may be interposed between a pair of source/drain patterns SD. The source/drain patterns SD may be epitaxial patterns formed by a selective epitaxial growth process. The source/drain patterns SD may have their top surfaces at a higher level than that of top surfaces of the channel regions CH.

For example, when the source/drain patterns SD are regions doped with p-type impurities, the source/drain patterns SD may include a semiconductor element (e.g., SiGe) whose lattice constant is greater than that of a semiconductor element of the substrate 100. As a result, the source/drain patterns SD may provide the channel regions CH with compressive stress.

For another example, when the source/drain patterns SD are regions doped with n-type impurities, the source/drain patterns SD may include the same semiconductor element (e.g., Si) as that of the substrate 100.

A gate electrode GE may be provided to extend in a first direction D1, while running across the active patterns AP. The gate electrode GE may cross over the active region AR. The gate electrode GE may vertically overlap the channel regions CH. The gate electrode GE may surround a top surface TS and opposite sidewalls SW of each of the channel regions CH (see FIG. 2B).

A pair of gate spacers GS may be disposed on opposite sidewalls of the gate electrode GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. The gate spacers GS may include one or more of SiCN, SiCON, and SiN. Alternatively, the gate spacers GS may include a multi-layer consisting of two or more of SiCN, SiCON, and SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120 which will be discussed below. For example, the gate capping pattern GP may include one or more of SiON, SiCN, SiCON, and SiN.

A gate dielectric pattern GI may be interposed between the gate electrode GE and the active pattern AP. The gate dielectric pattern GI may extend along a bottom surface of the gate electrode GE. The gate dielectric pattern GI may include an interface layer IL and a high-k dielectric layer HK between the interface layer IL and the gate electrode GE.

The interface layer IL may cover the top surface TS and the opposite sidewalls SW of the channel region CH. The high-k dielectric layer HK may also be interposed between the gate electrode GE and the gate spacers GS. The high-k dielectric layer HK may extend from the active pattern AP to a next adjacent active pattern AP. As such, the high-k dielectric layer HK may cover a top surface of the device isolation layer ST beneath the gate electrode GE (see FIG. 2B).

For example, the interface layer IL may include a silicon oxide layer. The high-k dielectric layer HK may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrode GE may include a work function metal pattern WF and an electrode pattern EL on the work function metal pattern WF. The work function metal pattern WF may be provided on the high-k dielectric layer HK. For example, the high-k dielectric layer HK may be interposed between the work function metal pattern WF and the channel region CH.

The work function metal pattern WF may include one or more of a metal nitride layer (e.g., TiN, TaN, AN, WN, MoN, WCN, or LaN), a metal nitride layer doped with either aluminum or silicon (e.g., TiAlN or TiSiN), and a metal oxide layer (e.g., $Al_2O_3$ or LaO). The electrode pattern EL may have resistance less than that of the work function metal pattern WF. For example, the electrode pattern EL may include at least one low-resistance metal, such as aluminum (Al), tungsten (W), titanium (Ti), and tantalum (Ta).

Returning to FIG. 3, the high-k dielectric layer HK on the channel region CH may include a first part P1 on the sidewall SW of the channel region CH and a second part P2 on the top surface TS of the channel region CH. The second part P2 may be parallel to a top surface of the substrate 100. The first part P1 may extend from the second part P2 along the sidewall SW of the channel region CH to the top surface of the device isolation layer ST.

The high-k dielectric layer HK may include impurities DPT. The impurities DPT may be uniformly doped within the high-k dielectric layer HK. For example, an impurity concentration of the first part P1 of the high-k dielectric layer HK may be substantially the same as that of the second part P2 of the high-k dielectric layer HK.

The work function metal pattern WF may also include the impurities DPT. An impurity concentration of the work function metal pattern WF may be greater than that of the high-k dielectric layer HK. For example, the high-k dielectric layer HK may have an impurity concentration ranging from 0.1 at % to 5 at %, and the work function metal pattern WF may have an impurity concentration ranging from 1 at % to 10 at %.

The impurities DPT may be selected from the group consisting of nitrogen (N), fluorine (F), phosphorous (P), boron (B), and a combination thereof. For example, the impurities DPT may include nitrogen (N) and fluorine (F). In certain embodiments, the impurities DPT may include fluorine (F). In this case, a fluorine (F) concentration of the high-k dielectric layer HK on the top surface TS of the channel region CH may be substantially the same as that of the high-k dielectric layer HK on the sidewall SW of the channel region CH. The work function metal pattern WF may have a fluorine (F) concentration greater than that of the high-k dielectric layer HK.

A first interlayer dielectric layer 110 may be provided on the substrate 100. The first interlayer dielectric layer 110 may cover the gate spacers GS and the source/drain patterns SD. The first interlayer dielectric layer 110 may have a top surface substantially coplanar with that of the gate capping pattern GP and those of the gate spacers GS. The first interlayer dielectric layer 110 may be provided thereon with a second interlayer dielectric layer 120 covering the gate capping pattern GP. For example, the first and second interlayer dielectric layers 110 and 120 may include a silicon oxide layer.

Active contacts AC may be provided adjacent to opposite sides of the gate electrode GE. The active contacts AC may penetrate the first and second interlayer dielectric layers 110 and 120 and have electrical connection with the source/drain patterns SD. The active contacts AC may include at least one metallic material, for example, aluminum, copper, tungsten, molybdenum, and cobalt.

A silicide layer (not shown) may be interposed between the source/drain patterns SD and the active contact AC. The active contact AC may be electrically connected through the silicide layer to the source/drain patterns SD. The silicide layer may include metal silicide, for example, one or more of titanium silicide, tantalum silicide, tungsten silicide, nickel silicide, and cobalt silicide.

Although not shown, a gate contact may be provided to penetrate the second interlayer dielectric layer 120 and the gate capping pattern GP and to have electrical connection with the gate electrode GE. The gate contact may include the same metallic material as that of the active contacts AC.

According to some example embodiments of the present disclosure, the high-k dielectric layer HK may include the impurities DPT. Although the high-k dielectric layer HK has a three-dimensional structure covering the top surface TS and the sidewall SW of the channel region CH, the high-k dielectric layer HK may have a uniform impurity concentration. Because the high-k dielectric layer HK includes the impurities DPT uniformly distributed therein, it may be possible to prevent current leakage through the high-k dielectric layer HK and to improve characteristics of the high-k dielectric layer HK. Furthermore, a change in kind and concentration of the impurities DPT may adjust characteristics of the high-k dielectric layer HK to meet design goals.

Figure 11A:
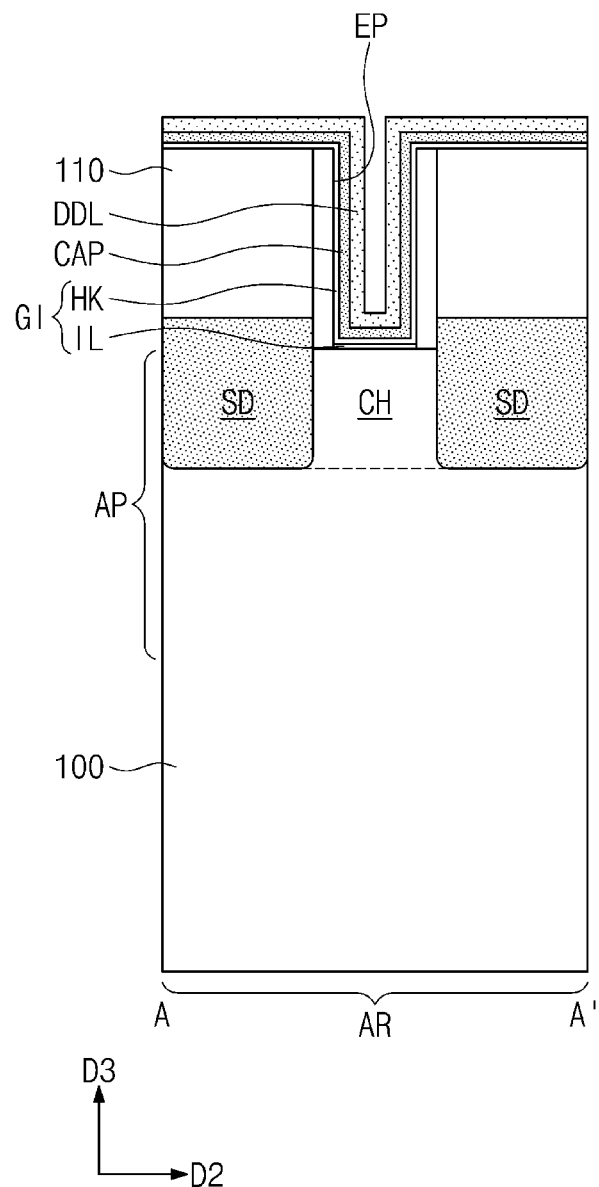
Figure 11B:
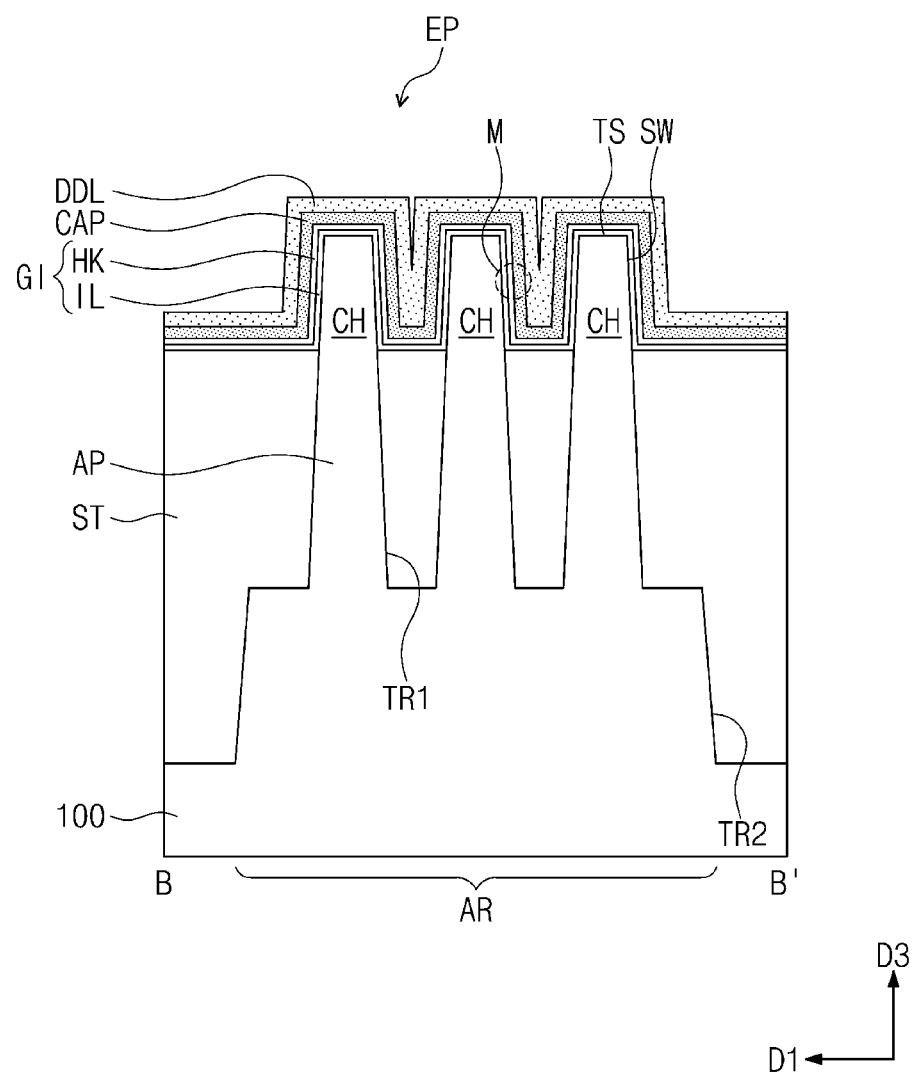
Figure 11C:
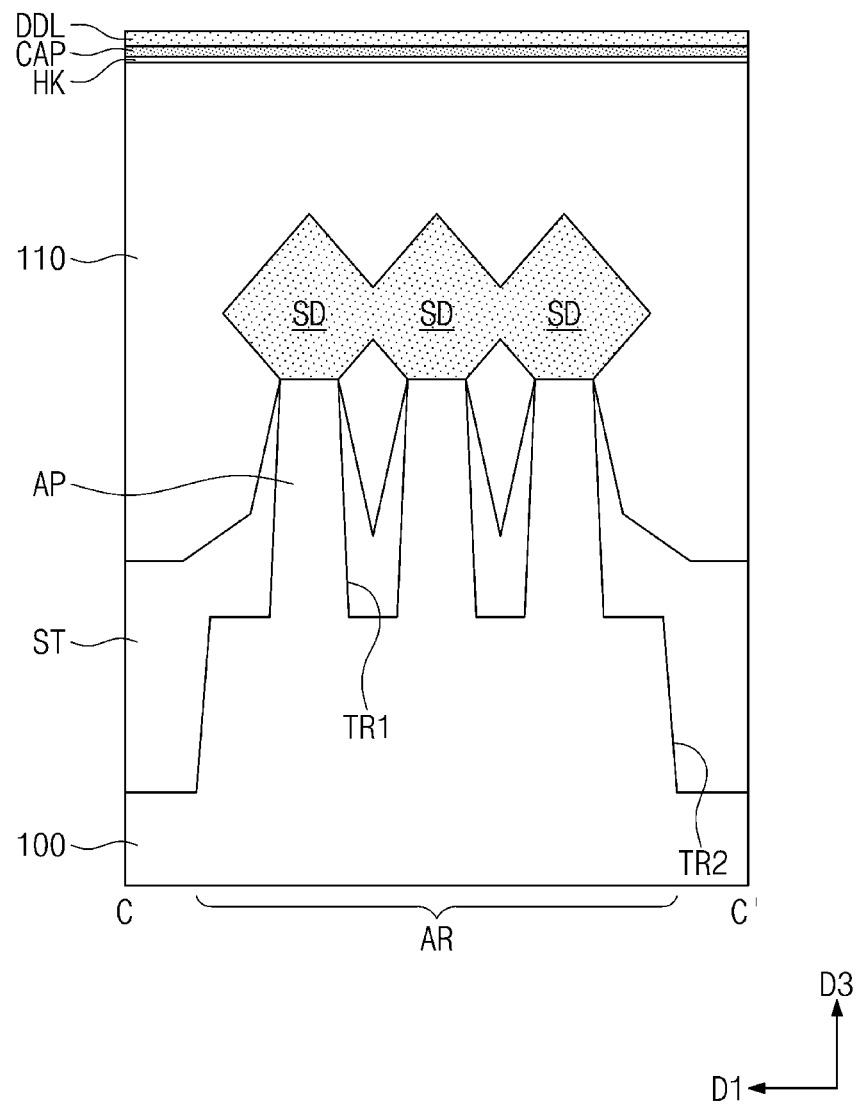
Figure 12:
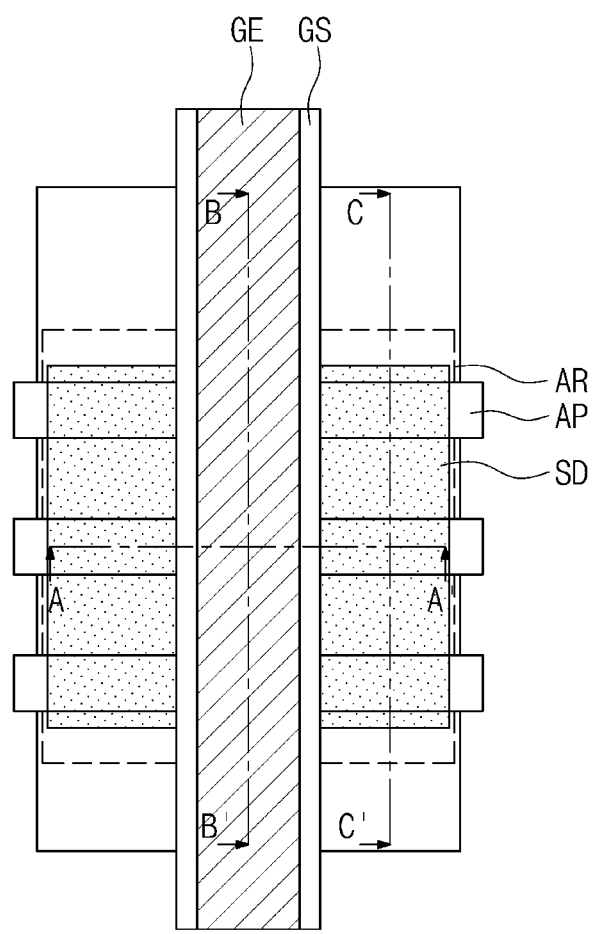
Figure 13A:
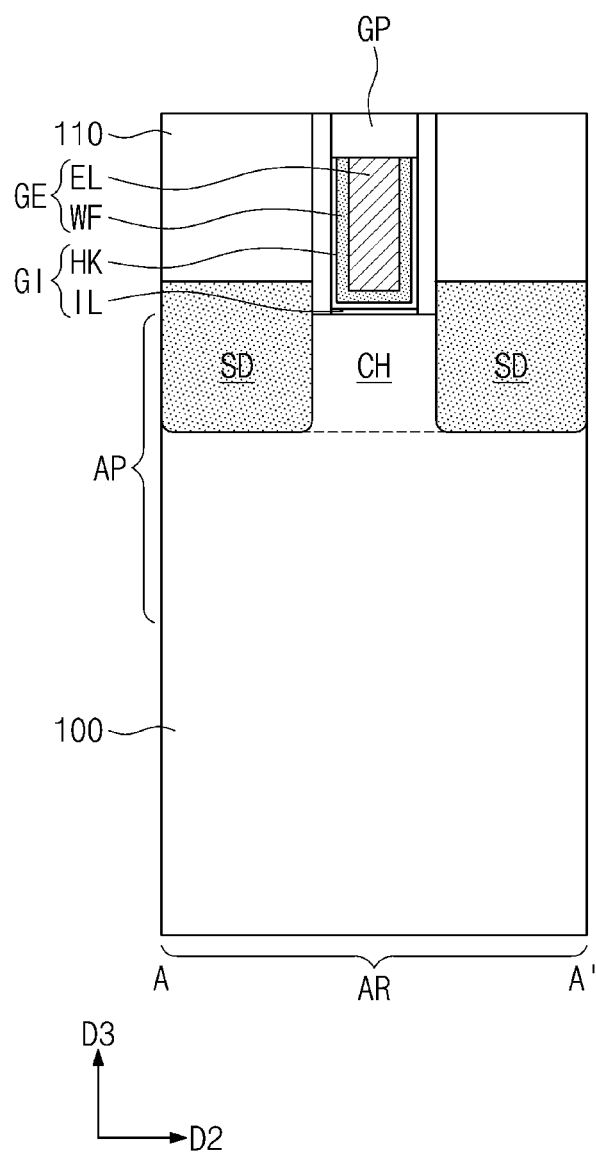
Figure 13B:
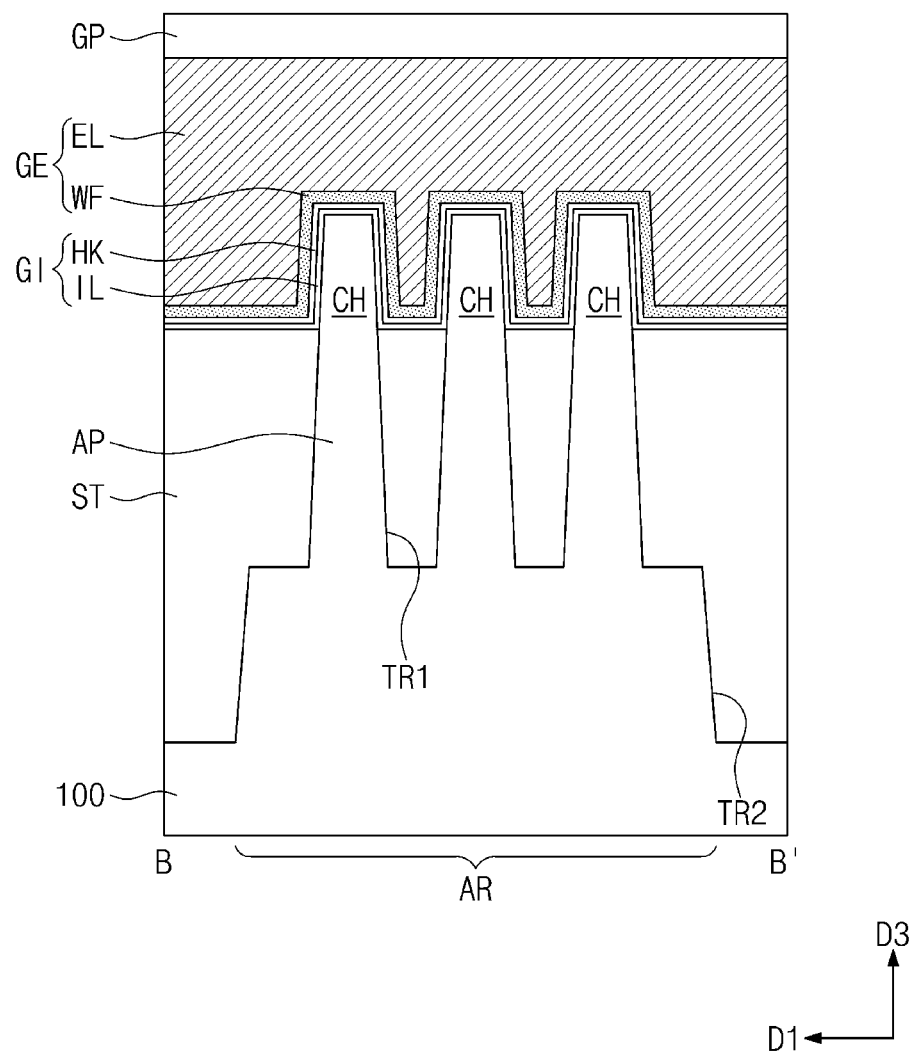
Figure 13C:
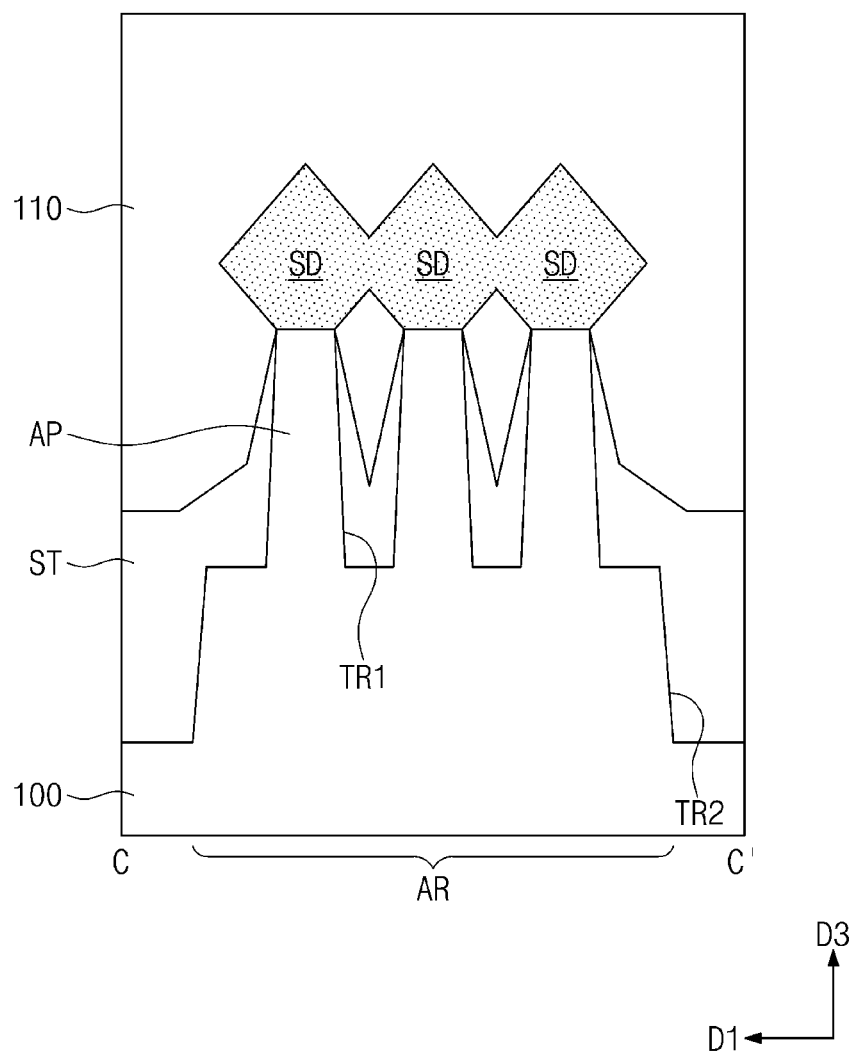
Figure 14A:
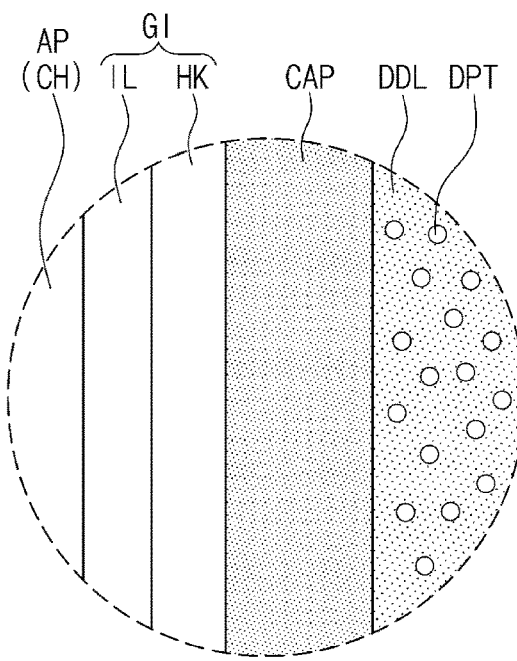
FIGS. 14A and 14B illustrate enlarged cross-sectional views of section M depicted in FIG. 11B, showing a doping method according to some example embodiments of the present disclosure.
Figure 14B:
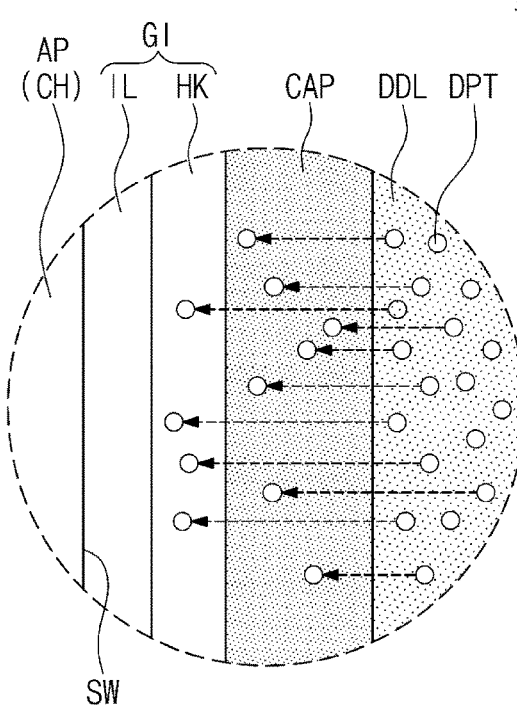

FIGS. 4, 6, 8, 10, and 12 illustrate plan views showing a method of fabricating a semiconductor device according to some example embodiments of the present disclosure. FIGS. 5, 7A, 9A, 11A, and 13A illustrate cross-sectional views taken along line A-A' of FIGS. 4, 6, 8, 10, and 12, respectively. FIGS. 7B, 9B, 11B, and 13B illustrate cross-sectional views taken along line B-B' of FIGS. 6, 8, 10, and 12, respectively. FIGS. 7C, 9C, 11C, and 13C illustrate cross-sectional views taken along line C-C' of FIGS. 6, 8, 10, and 12, respectively. FIGS. 14A and 14B illustrate enlarged cross-sectional views of section M depicted in FIG. 11B, showing a doping method according to some example embodiments of the present disclosure.

Figure 4:
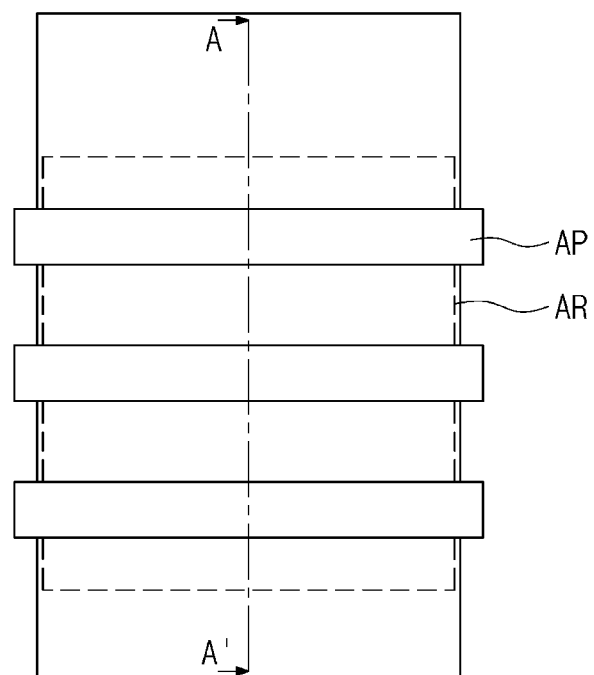
Figure 5:
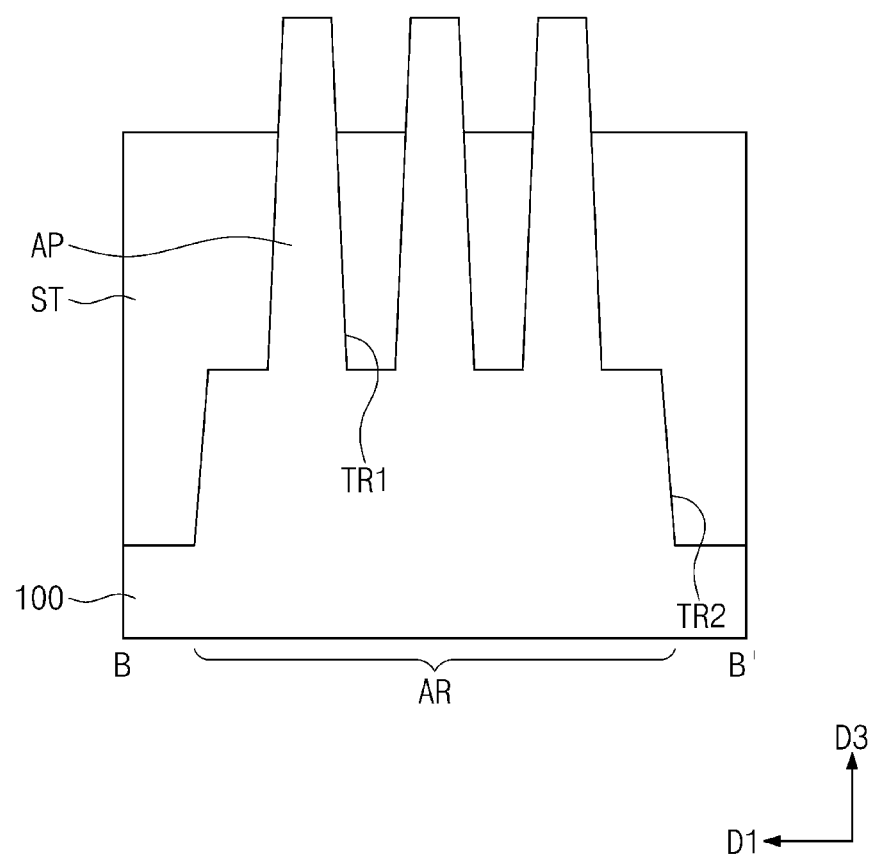
Figure 6:
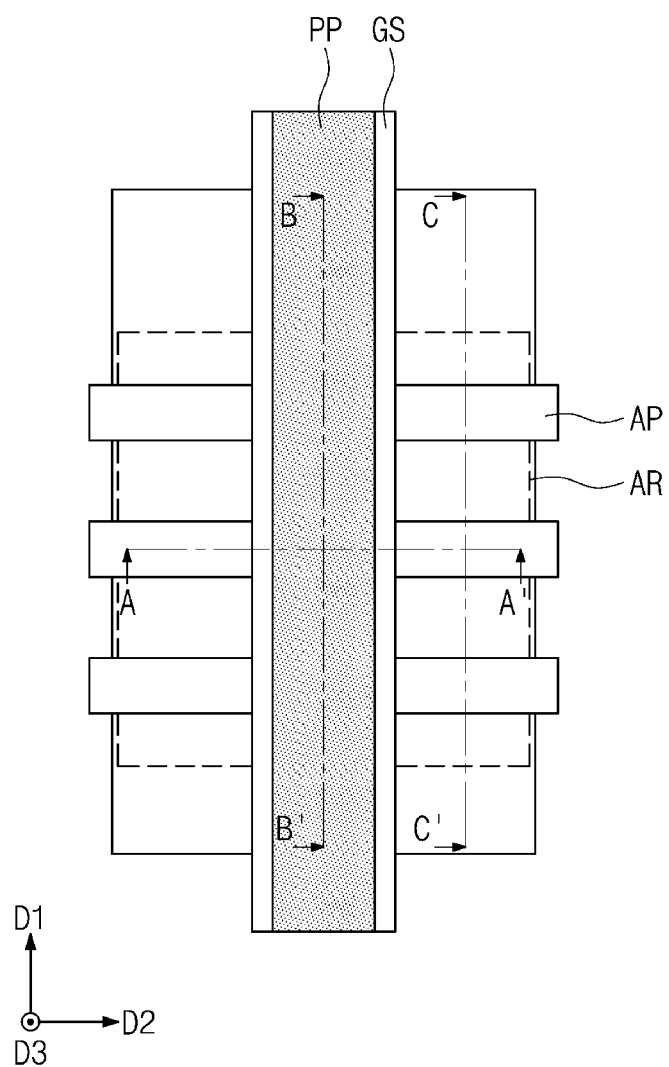
Figure 7B:
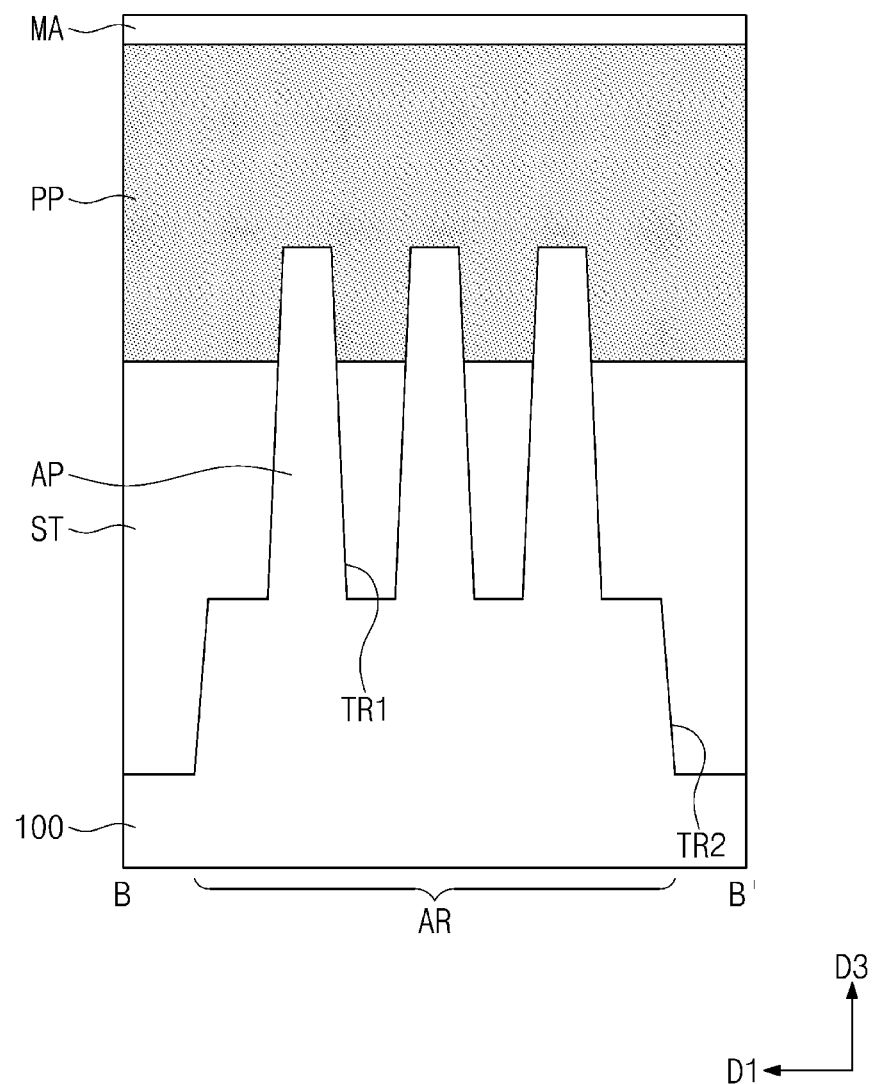
FIGS. 7B, 9B, 11B, and 13B illustrate cross-sectional views taken along line B-B' of FIGS. 6, 8, 10, and 12, respectively.
Figure 7C:
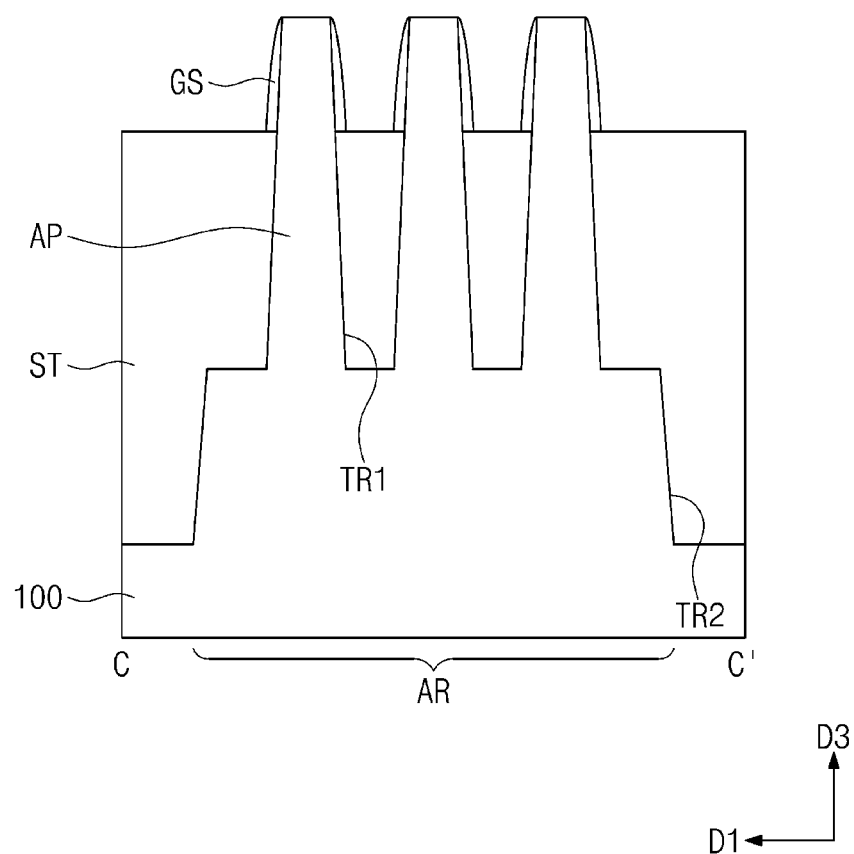
FIGS. 7C, 9C, 11C, and 13C illustrate cross-sectional views taken along line C-C' of FIGS. 6, 8, 10, and 12, respectively.
Figure 9A:
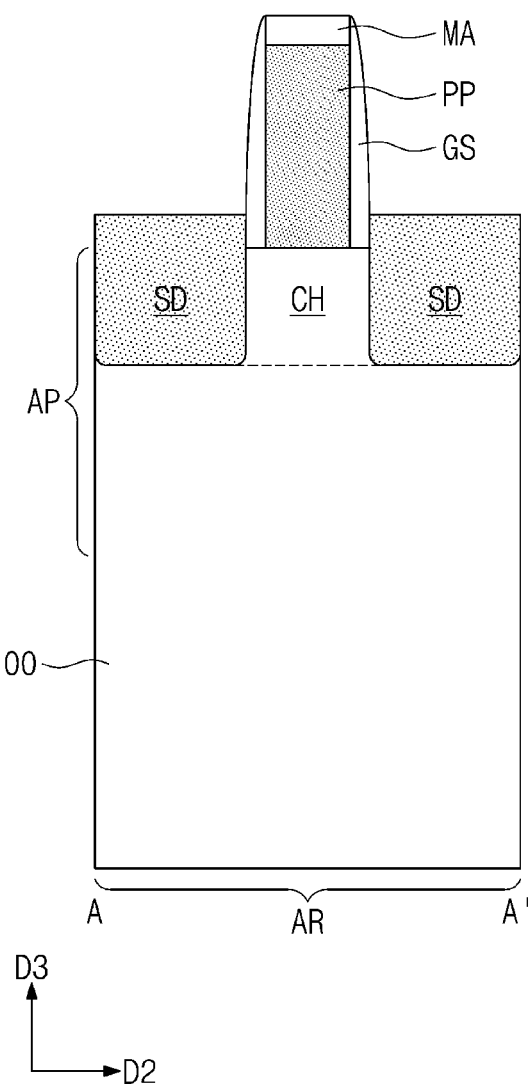
Figure 9B:
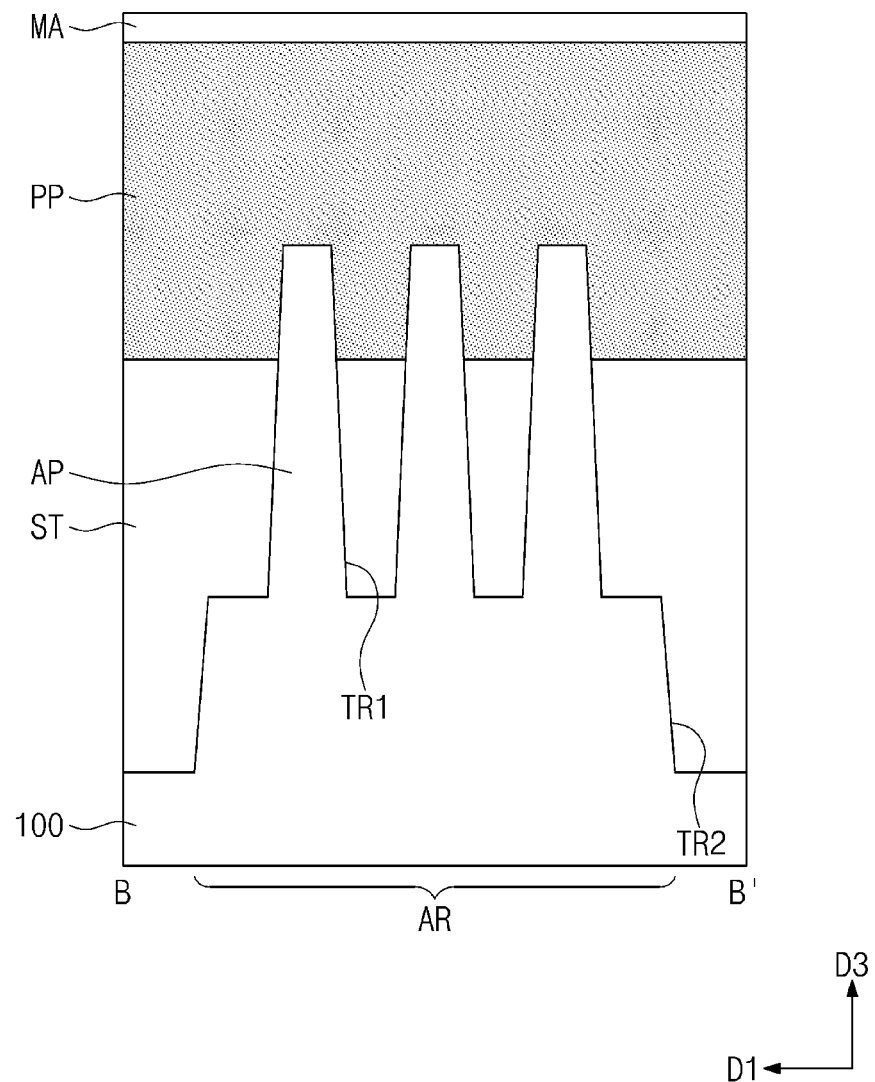
Figure 9C:
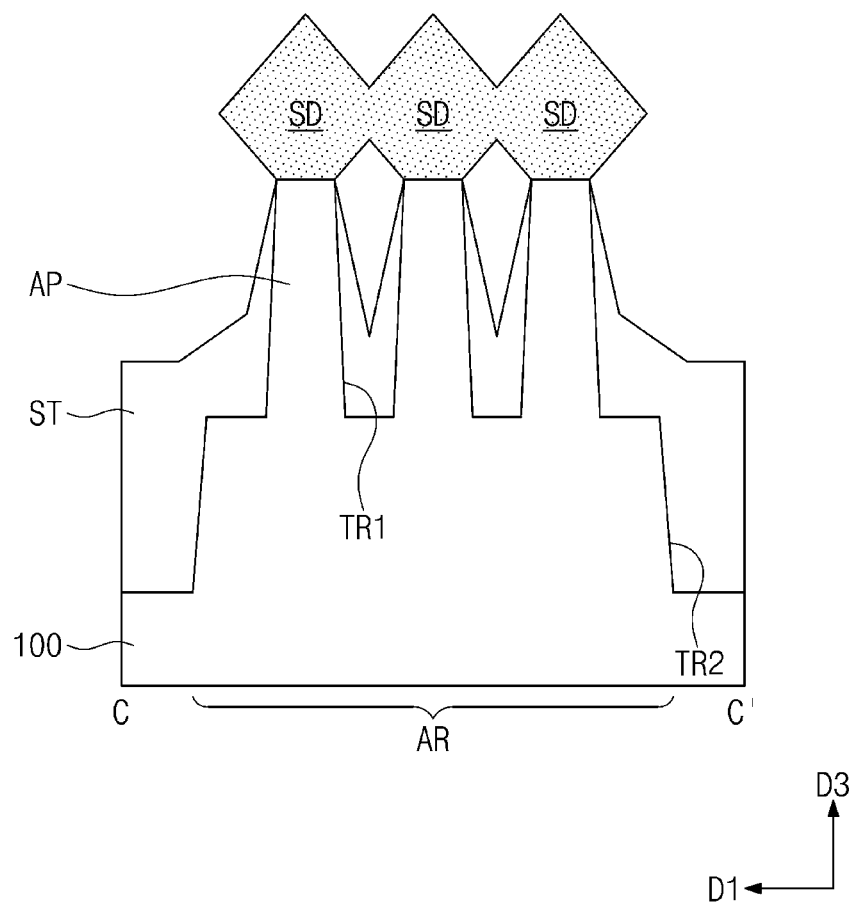
Figure 10:
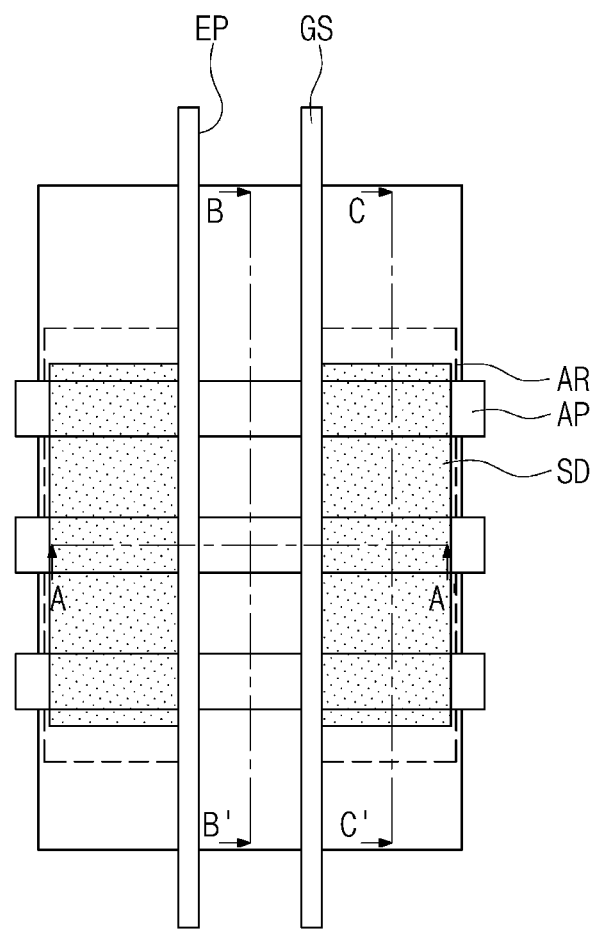

Referring to FIGS. 4 and 5, a substrate 100 may be provided. An upper portion of the substrate 100 may be patterned to form active patterns AP. A first trench TR1 may be formed between the active patterns AP. The substrate 100 may be patterned to form a second trench TR2 defining an active region AR. The second trench TR2 may be formed deeper than the first trench TR1.

A device isolation layer ST may be formed on the substrate 100, filling the first and second trenches TR1 and TR2. The device isolation layer ST may include a dielectric material, such as a silicon oxide layer. The device isolation layer ST may be recessed until the active patterns AP are exposed on their upper portions. Therefore, the upper portions of the active patterns AP may vertically protrude beyond the device isolation layer ST.

Referring to FIGS. 6 and 7A to 7C, a sacrificial pattern PP may be formed to run across the active patterns AP. The sacrificial pattern PP may be formed to have a linear or bar shape extending in a first direction D1.

For example, the formation of the sacrificial pattern PP may include forming a sacrificial layer on an entire surface of the substrate 100, forming a hardmask pattern MA on the sacrificial layer, and using the hardmask pattern MA as an etching mask to pattern the sacrificial layer. The sacrificial layer may include a polysilicon layer.

A pair of gate spacers GS may be formed on opposite sidewalls of the sacrificial pattern PP. The gate spacers GS may also be formed on opposite sidewalls of each of the active patterns AP. The opposite sidewalls of each of the active patterns AP may be exposed portions that are not covered with the device isolation layer ST and the sacrificial pattern PP.

The formation of the gate spacers GS may include conformally forming a gate spacer layer on the entire surface of the substrate 100 and anisotropically etching the gate spacer layer. The gate spacer layer may include one or more of SiCN, SiCON, and SiN. Alternatively, the gate spacer layer may be a multi-layer including two or more of SiCN, SiCON, and SiN.

Referring to FIGS. 8 and 9A to 9C, a pair of source/drain patterns SD may be formed on the upper portion of each of the active patterns AP. The pair of source/drain patterns SD may be formed on opposite sides of the sacrificial pattern PP.

For example, the hardmask pattern MA and the gate spacers GS may be used as an etching mask to etch the upper portions of the active patterns AP, which may result in the formation of recesses. While the upper portions of the active patterns AP are etched, the gate spacers GS may also be removed from the opposite sidewalls of each of the active patterns AP. During the etching of the upper portions of the active patterns AP, the device isolation layer ST may be recessed on its upper portion between the active patterns AP.

The recesses of the active patterns AP may have inner sidewalls that serve as seed layers used for performing a selective epitaxial growth process to form the source/drain patterns SD. The formation of the source/drain patterns SD may define a channel region CH between a pair of source/drain patterns SD. For example, the selective epitaxial growth process may include a chemical vapor deposition (CVD) process or a molecular beam epitaxy (MBE) process.

The source/drain patterns SD may be doped to have one of p and n types. For example, impurities may be in-situ implanted during the selective epitaxial growth process for the formation of the source/drain patterns SD. For another example, impurities may be implanted into the source/drain patterns SD after the formation of the source/drain patterns SD.

Referring to FIGS. 10 and 11A to 11C, a first interlayer dielectric layer 110 may be formed to cover the source/drain patterns SD, the hardmask pattern MA, and the gate spacers GS. The first interlayer dielectric layer 110 may include, for example, a silicon oxide layer.

The first interlayer dielectric layer 110 may be planarized until a top surface of the sacrificial pattern PP is exposed. An etch-back or chemical mechanical polishing (CMP) process may be used to planarize the first interlayer dielectric layer 110. The hardmask pattern MA may be removed during the planarization process. As a result, a top surface of the first interlayer dielectric layer 110 may be substantially coplanar with that of the sacrificial pattern PP and those of the gate spacers GS.

The exposed sacrificial pattern PP may be selectively removed to form an empty space EP. The empty space EP may be defined between a pair of gate spacers GS. A gate dielectric pattern GI may be formed in the empty space EP. The gate dielectric pattern GI may include an interface layer IL and a high-k dielectric layer HK.

For example, the interface layer IL may be formed on a top surface TS and a sidewall SW of the channel region CH exposed to the empty space EP. The formation of the interface layer IL may include oxidizing the exposed upper portion of the active pattern AP. The interface layer IL may include a silicon oxide layer.

The high-k dielectric layer HK may be conformally formed on the interface layer IL. The high-k dielectric layer HK may partially fill the empty space EP. The high-k dielectric layer HK may cover inner sidewalls of the gate spacers GS. The high-k dielectric layer HK may be formed using a high-k dielectric material.

A capping layer CAP may be formed on the gate dielectric pattern GI. The capping layer CAP may partially fill the empty space EP. The capping layer CAP may include one or more of a metal nitride layer, a metal nitride layer doped with either aluminum or silicon, and a metal oxide layer.

An impurity-doped layer DDL may be formed on the capping layer CAP. The impurity-doped layer DDL may partially or completely fill the empty space EP. The impurity-doped layer DDL may be conformally formed on the top surface TS and the sidewall SW of the channel region CH.

According to some example embodiments of the present disclosure, the high-k dielectric layer HK may be doped through the impurity-doped layer DDL. The following will discuss in detail a method of doping the high-k dielectric layer HK with reference to FIGS. 14A and 14B.

Referring to FIG. 14A, the impurity-doped layer DDL may be doped with impurities DPT. In certain embodiments, the implantation of the impurities DPT into the impurity-doped layer DDL may include that the impurities DPT are in-situ implanted while the impurity-doped layer DDL is deposited. For example, during the deposition of the impurity-doped layer DDL, an impurity gas may be introduced into a chamber to uniformly dope the impurities into the impurity-doped layer DDL.

The impurity-doped layer DDL may include, for example, a silicon layer or polysilicon layer. The impurities DPT may be selected from the group consisting of nitrogen (N), fluorine (F), phosphorous (P), boron (B), and a combination thereof. An impurity concentration of the impurity-doped layer DDL may be adjusted to have a range from 0.1 at % to 20 at %.

Referring to FIG. 14B, an annealing process may be performed on the impurity-doped layer DDL. The annealing process may allow the impurities DPT to diffuse from the impurity-doped layer DDL to the high-k dielectric layer HK. A portion of the impurities DPT in the impurity-doped layer DDL may migrate from the impurity-doped layer DDL through the capping layer CAP to the high-k dielectric layer HK. Another portion of the impurities DPT in the impurity-doped layer DDL may migrate from the impurity-doped layer DDL to the capping layer CAP. For example, due to a difference in diffusion distance of the impurities DPT, the portion of the impurities DPT may be implanted into the high-k dielectric layer HK, and the other portion of the impurities DPT may be implanted into the capping layer CAP.

The capping layer CAP may be in direct contact with the impurity-doped layer DDL, and the high-k dielectric layer HK may be spaced apart from the impurity-doped layer DDL across the capping layer CAP. Thus, the capping layer CAP may have an impurity concentration greater than that of the high-k dielectric layer HK.

Because the impurity-doped layer DDL is conformally formed on the top surface TS and the sidewall SW of the channel region CH, an impurity concentration of the high-k dielectric layer HK on the top surface TS of the channel region CH may be substantially the same as that of the high-k dielectric layer HK on the sidewall SW of the channel region CH. For example, the impurity-doped layer DDL may cause the high-k dielectric layer HK be doped to have a uniform impurity concentration.

Referring to FIGS. 12 and 13A to 13C, the impurity-doped layer DDL may be selectively removed. A gate electrode GE may be formed to fill the empty space EP. A gate capping pattern GP may be formed on the gate electrode GE.

The formation of the gate electrode GE may include forming a work function metal pattern WF on the gate dielectric pattern GI and forming an electrode pattern EL on the work function metal pattern WF.

In certain embodiments, the capping layer CAP may not be removed, but may remain. The remaining capping layer CAP may constitute the work function metal pattern WF. In other embodiments, after the impurity-doped layer DDL is removed, the capping layer CAP may be selectively removed. The work function metal pattern WF and the electrode pattern EL may be sequentially formed on the gate dielectric pattern GI that is exposed.

Referring back to FIGS. 1 and 2A to 2C, a second interlayer dielectric layer 120 may be formed on the first interlayer dielectric layer 110. The second interlayer dielectric layer 120 may include a silicon oxide layer or a low-k oxide layer. For example, the low-k oxide layer may include a carbon-doped silicon oxide layer, such as SiCOH. The second interlayer dielectric layer 120 may be formed by chemical vapor deposition (CVD).

Active contacts AC may be formed to penetrate the second and first interlayer dielectric layers 120 and 110 and to have electrical connection with the source/drain patterns SD. Although not shown, a gate contact may be formed to penetrate the second interlayer dielectric layer 120 and the gate capping pattern GP and to have electrical connection with the gate electrode GE.

Figure 15:
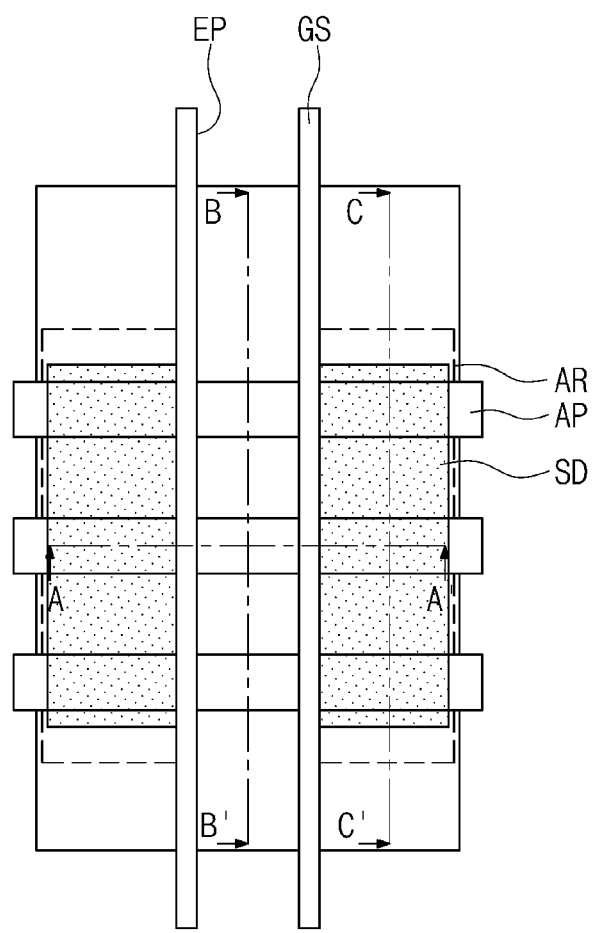
FIG. 15 illustrates a plan view showing a method of fabricating a semiconductor device according to some example embodiments of the present disclosure.
Figure 16A:
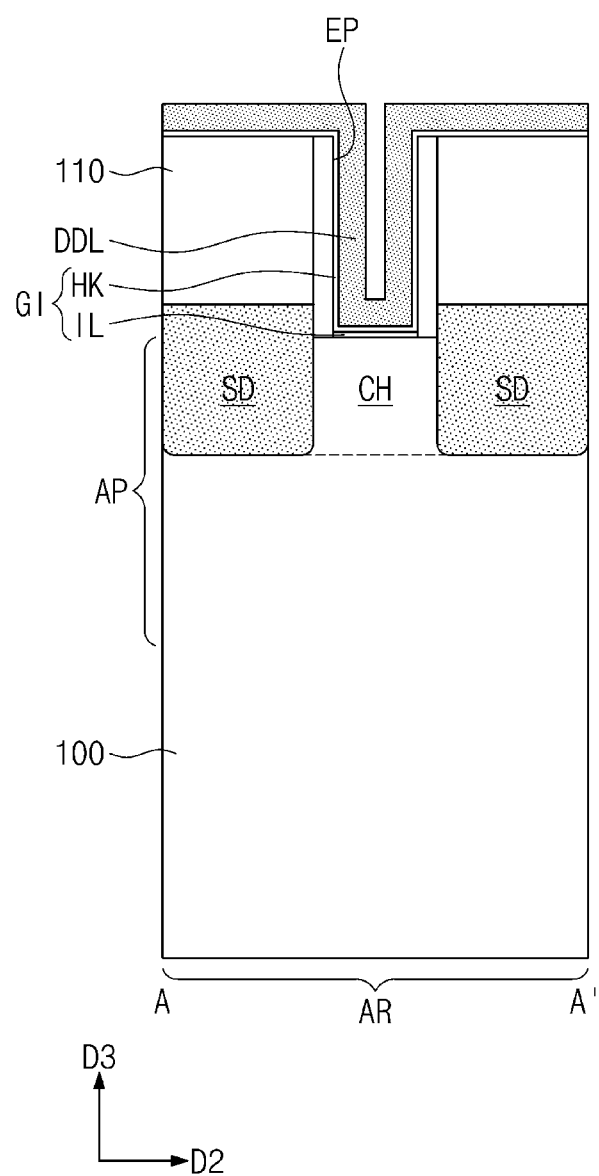
FIGS. 16A, 16B, and 16C illustrate cross-sectional views respectively taken along lines A-A', B-B', and C-C' of FIG. 15.
Figure 16B:
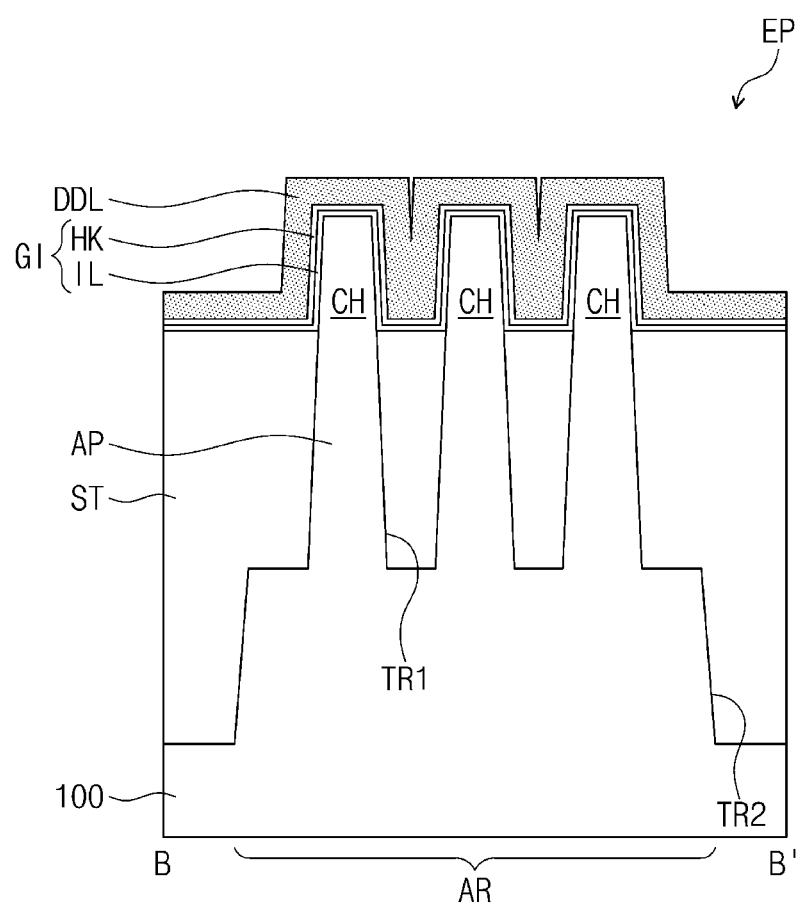
Figure 16C:
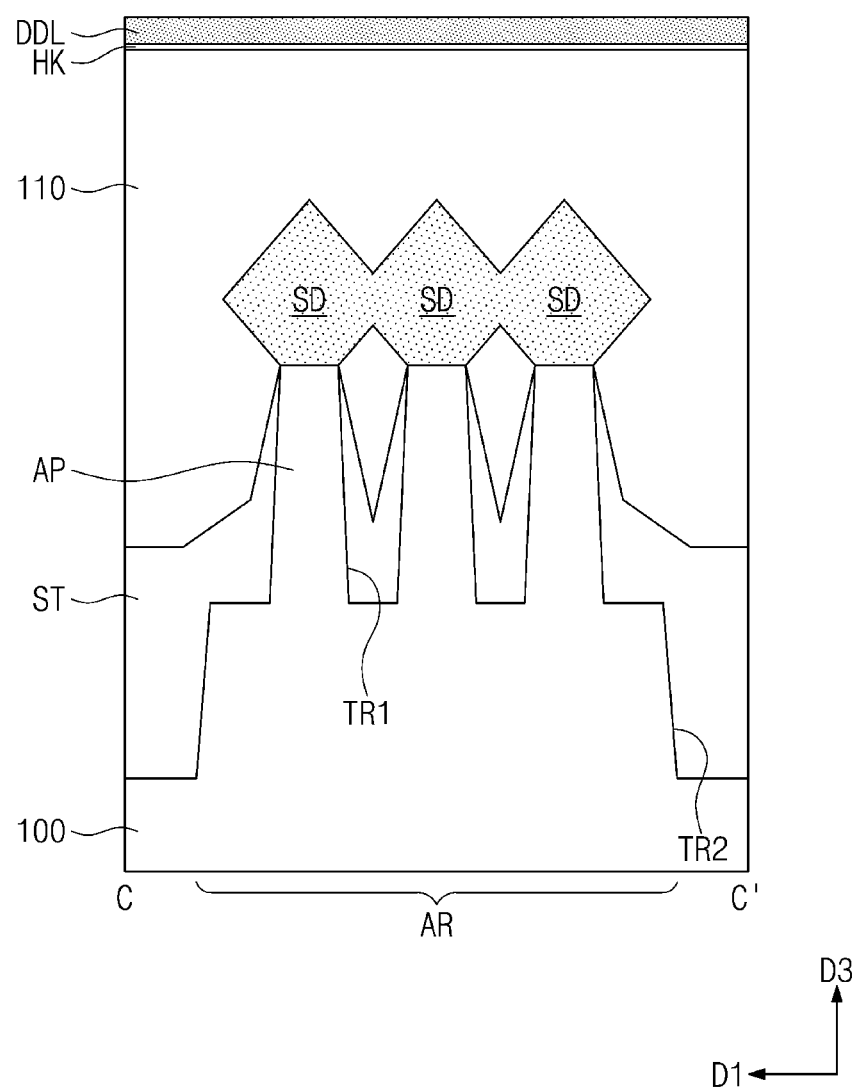

FIG. 15 illustrates a plan view showing a method of fabricating a semiconductor device according to some example embodiments of the present disclosure. FIGS. 16A, 16B, and 16C illustrate cross-sectional views respectively taken along lines A-A', B-B', and C-C' of FIG. 15. In the embodiment that follows, a detailed description of technical features repetitive to the fabrication method discussed above with reference to FIGS. 1 to 14B will be omitted, and a difference thereof will be discussed in detail.

Referring to FIGS. 15 and 16A to 16C, differently from that discussed above with reference to FIGS. 10 and 11A to 11C, the capping layer CAP may be omitted. For example, the impurity-doped layer DDL may be formed directly on the high-k dielectric layer HK. The impurity-doped layer DDL may undergo an annealing process to cause impurities to diffuse directly into the high-k dielectric layer HK from the impurity-doped layer DDL. Afterwards, the impurity-doped layer DDL may be removed, and then the work function metal pattern WF and the electrode pattern EL may be sequentially formed on the high-k dielectric layer HK (see FIGS. 12 and 13A to 13C).

Figure 17:
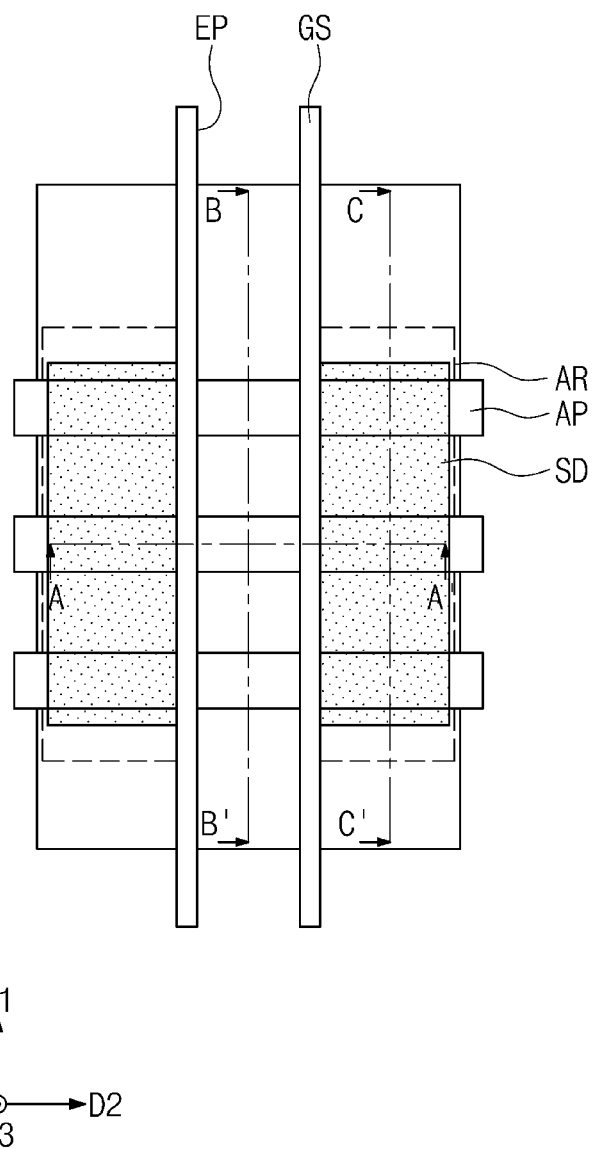
FIG. 17 illustrates a plan view showing a method of fabricating a semiconductor device according to some example embodiments of the present disclosure.
Figure 18A:
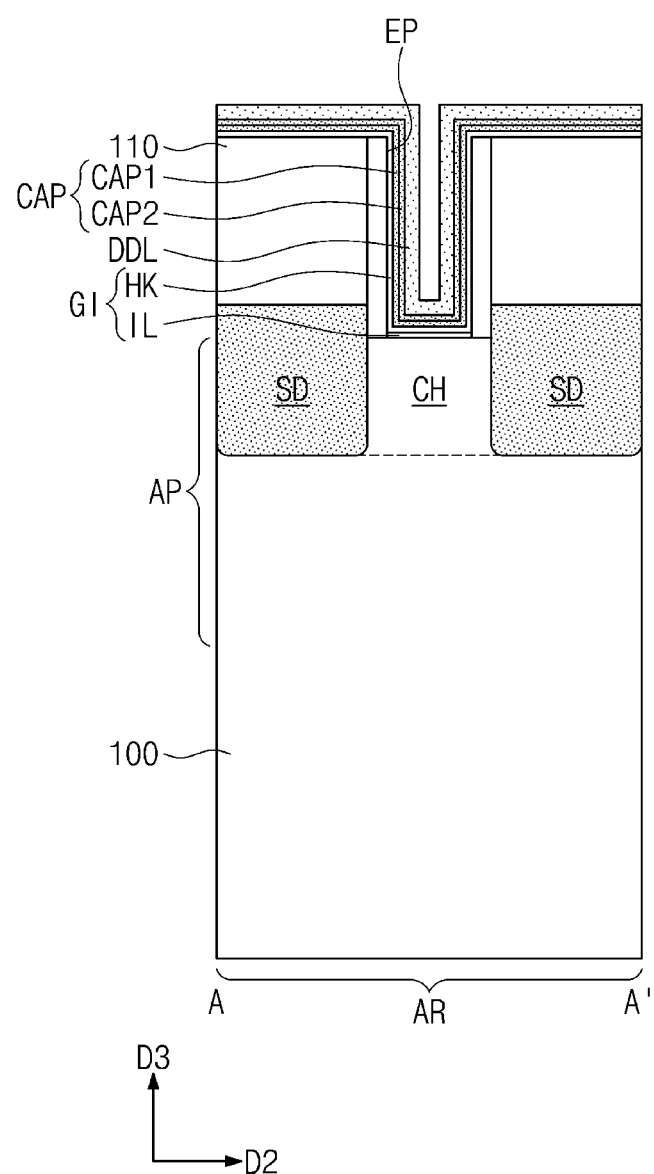
FIGS. 18A, 18B, and 18C illustrate cross-sectional views respectively taken along lines A-A', B-B', and C-C' of FIG. 17.
Figure 18B:
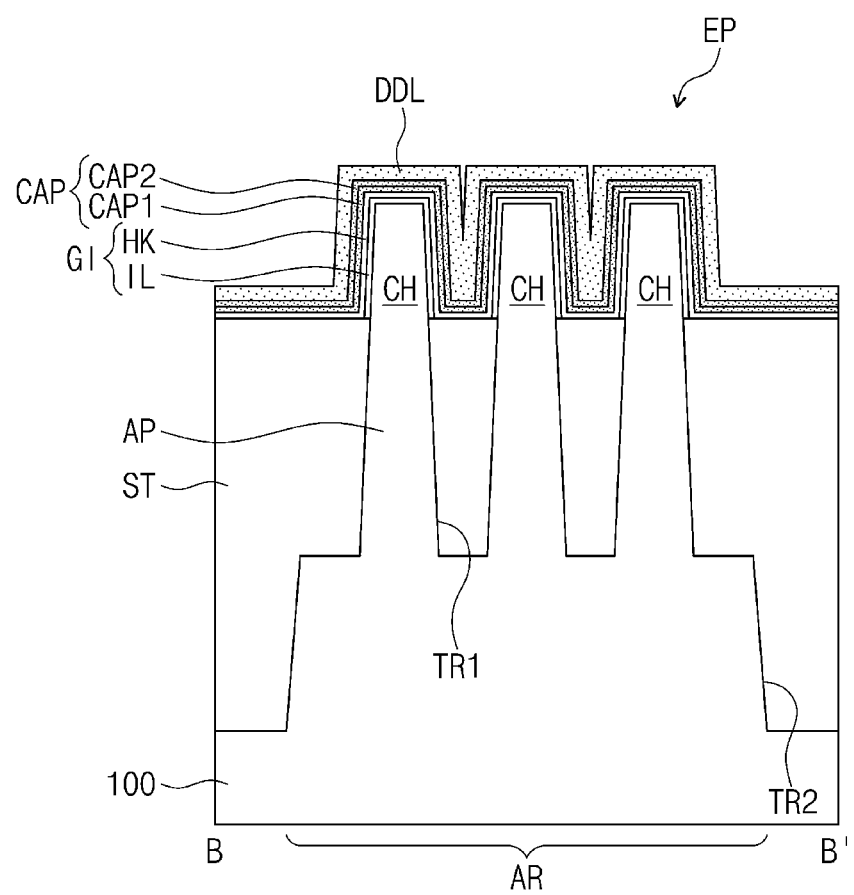
Figure 18C:
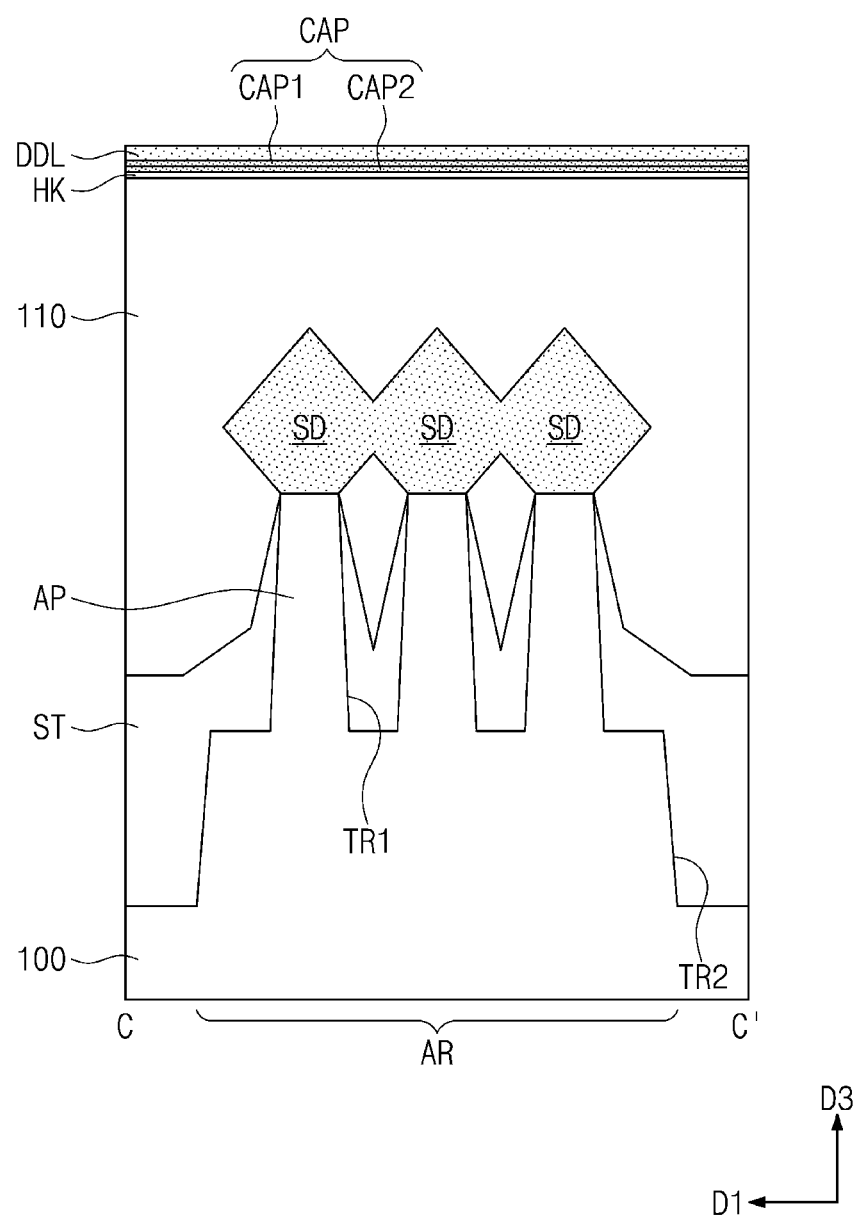

FIG. 17 illustrates a plan view showing a method of fabricating a semiconductor device according to some example embodiments of the present disclosure. FIGS. 18A, 18B, and 18C illustrate cross-sectional views respectively taken along lines A-A', B-B', and C-C' of FIG. 17. In the embodiment that follows, a detailed description of technical features repetitive to the fabrication method discussed above with reference to FIGS. 1 to 14B will be omitted, and a difference thereof will be discussed in detail.

Referring to FIGS. 17 and 18A to 18C, differently from that discussed above with reference to FIGS. 10 and 11A to 11C, the capping layer CAP may include a plurality of layers. For example, the capping layer CAP may include a first capping layer CAP1 and a second capping layer CAP2. The first capping layer CAP1 and the second capping layer CAP2 may be formed of different materials from each other. For example, the first capping layer CAP1 may be formed of a metal nitride layer (e.g., TiN), and the second capping layer CAP2 may be formed of a silicon-doped metal nitride layer (e.g., TiSiN). According to the present embodiment, because the capping layer CAP is designed to have a multi-layered structure, it may be possible to adjust a doping concentration and profile of the high-k dielectric layer HK.

Figure 19:
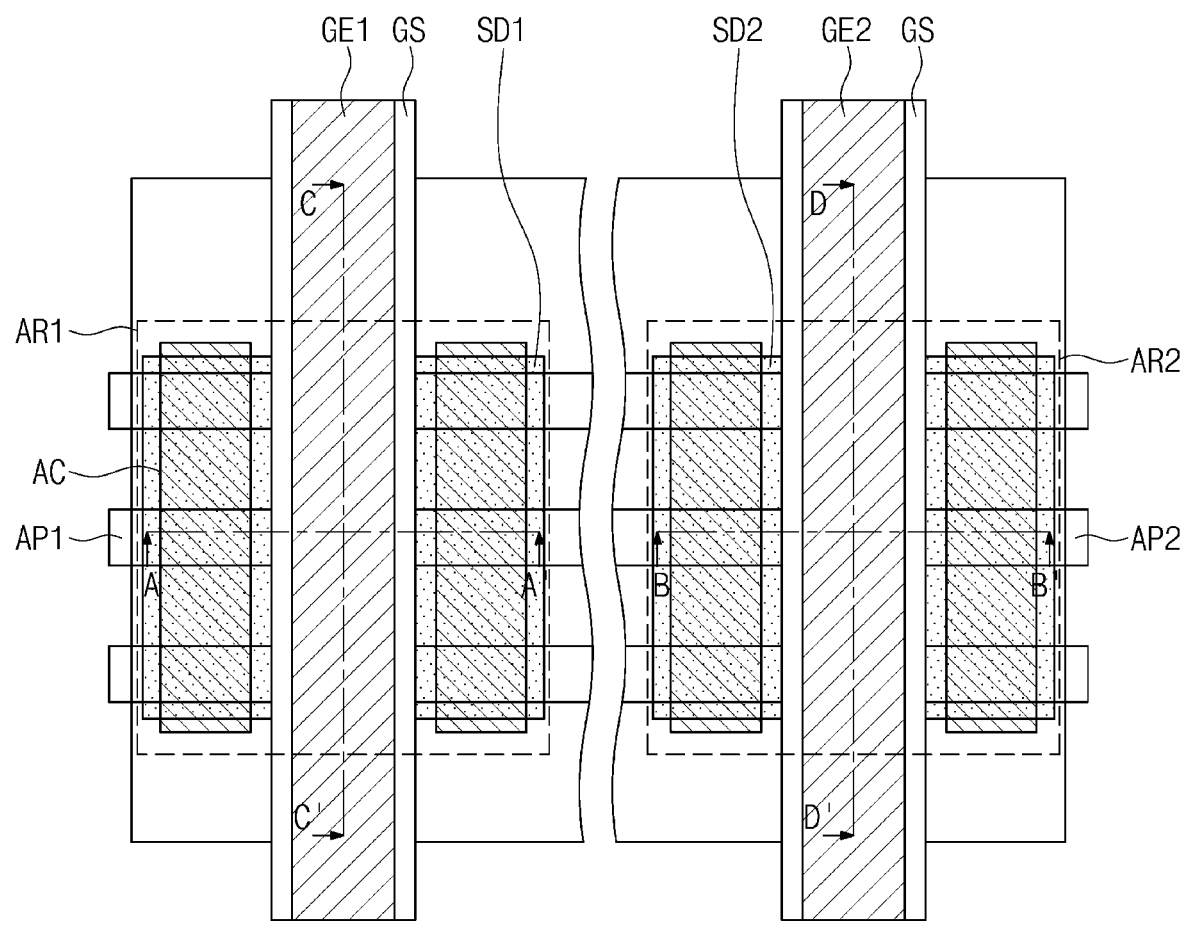
FIG. 19 illustrates a plan view showing a semiconductor device according to some example embodiments of the present disclosure.
Figure 20A:
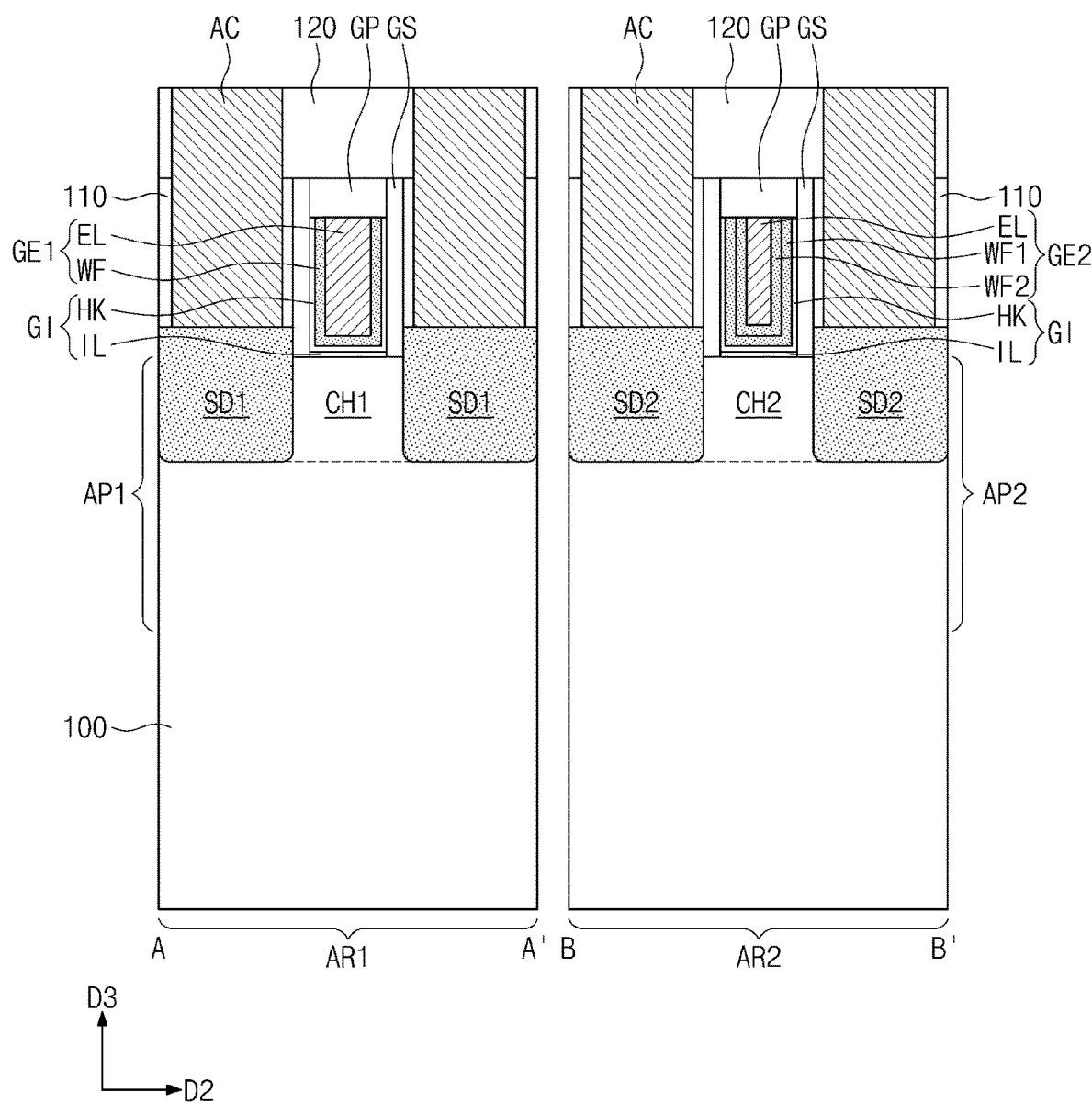
FIG. 20A illustrates a cross-sectional view taken along lines A-A' and B-B' of FIG. 19.
Figure 20B:
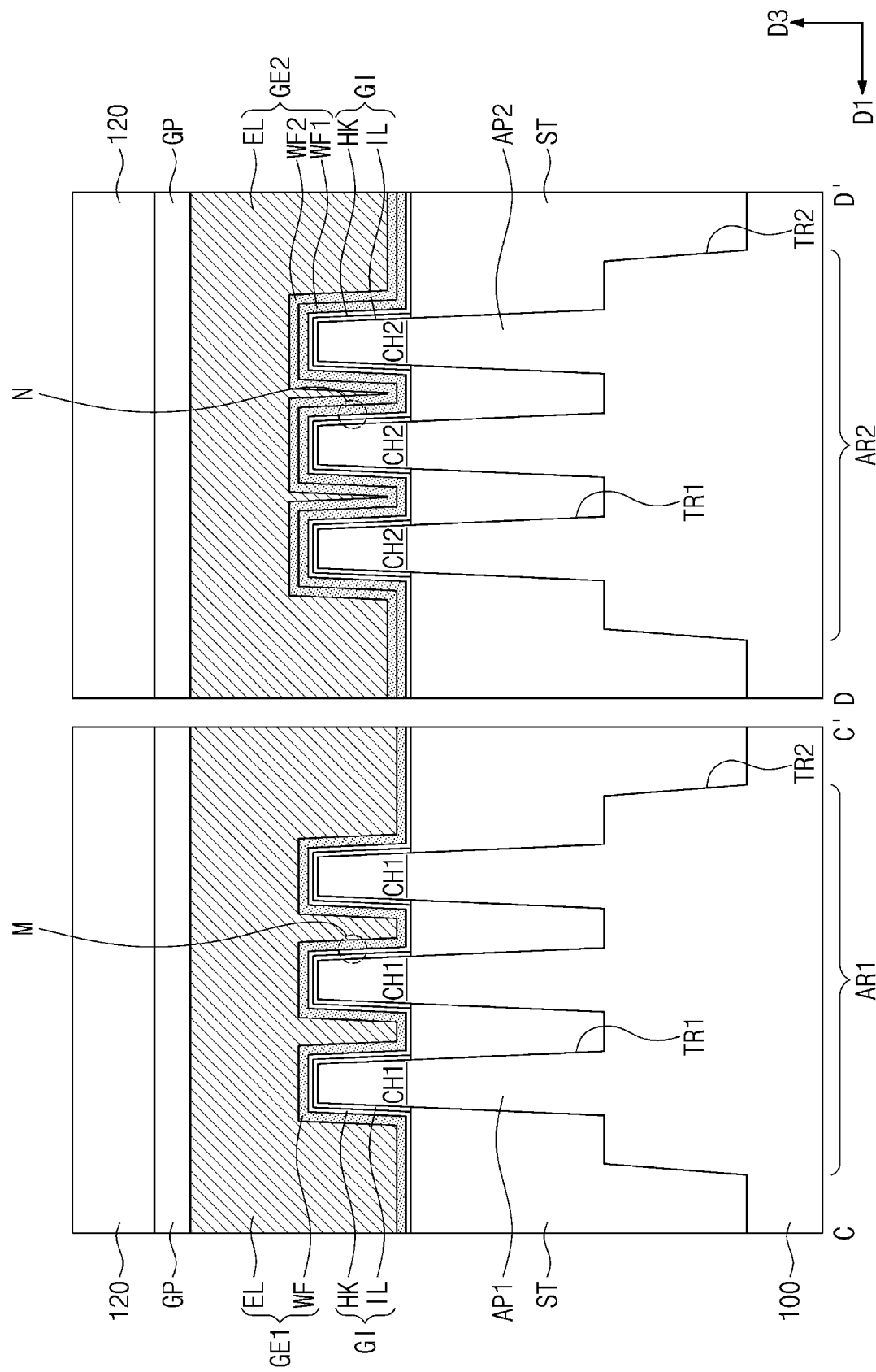
FIG. 20B illustrates a cross-sectional view taken along lines C-C' and D-D' of FIG. 19.
Figure 21A:
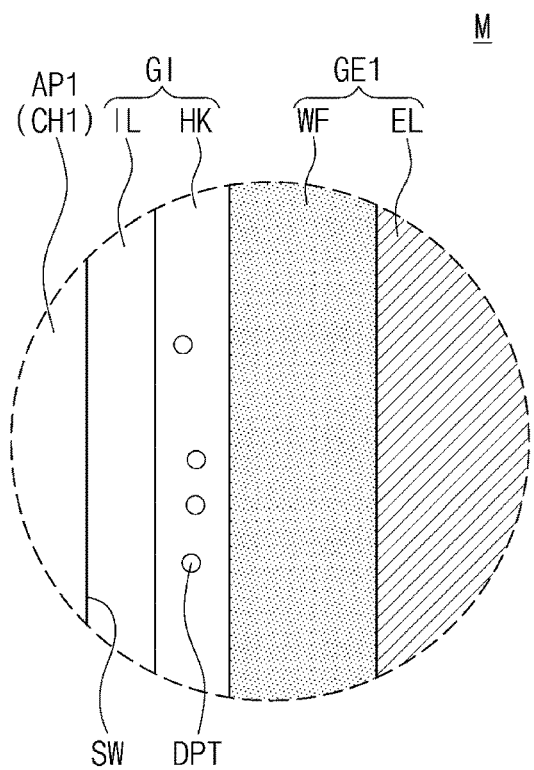
FIG. 21A illustrates an enlarged view of section M shown in FIG. 20B.
Figure 21B:
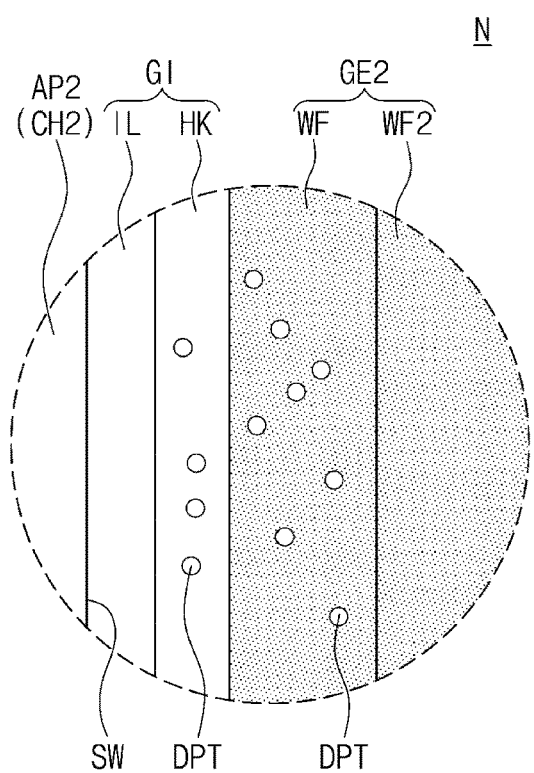
FIG. 21B illustrates an enlarged cross-sectional view of section N shown in FIG. 20B.

FIG. 19 illustrates a plan view showing a semiconductor device according to some example embodiments of the present disclosure. FIG. 20A illustrates a cross-sectional view taken along lines A-A' and B-B' of FIG. 19. FIG. 20B illustrates a cross-sectional view taken along lines C-C' and D-D' of FIG. 19. FIG. 21A illustrates an enlarged view of section M shown in FIG. 20B. FIG. 21B illustrates an enlarged cross-sectional view of section N shown in FIG. 20B. In the embodiment that follows, a detailed description of technical features repetitive to the semiconductor device discussed above with reference to FIGS. 1, 2A to 2C, and 3 will be omitted, and a difference thereof will be discussed in detail.

Referring to FIGS. 19, 20A, 20B, 21A, and 21B, a substrate 100 may be provided to include a first active region AR1 and a second active region AR2. In certain embodiments, the first and second active regions AR1 and AR2 may be a logic cell region on which logic transistors are disposed.

The first and second active regions AR1 and AR2 may be defined by a second trench TR2 formed on an upper portion of the substrate 100. The first active region AR1 may be provided thereon with first active patterns AN. The second active region AR2 may be provided thereon with second active patterns AP2. A first trench TR1 may be defined between neighboring first active patterns AP1 and between neighboring second active patterns AP2. The first trench TR1 may be shallower than the second trench TR2. A device isolation layer ST may fill the first and second trenches TR1 and TR2.

First source/drain patterns SD1 may be provided on upper portions of the first active patterns AN. Second source/drain patterns SD2 may be provided on upper portions of the second active patterns AP2. For example, the first source/drain patterns SD1 may have a first conductive type (e.g. p-type), and the second source/drain patterns SD2 may have the same first conductive type (e.g., p-type). For another example, the first source/drain patterns SD1 may have a first conductive type (e.g. p-type), and the second source/drain patterns SD2 may have a second conductive type (e.g., n-type). A first channel region CH1 may be interposed between a pair of first source/drain patterns SD1. A second channel region CH2 may be interposed between a pair of second source/drain patterns SD2.

A first gate electrode GE1 may be provided to run across the first active patterns AP1, and a second gate electrode GE2 may be provided to run across the second active patterns AP2. The first and second gate electrodes GE1 and GE2 may vertically overlap the first and second channel regions CH1 and CH2, respectively.

The first gate electrode GE1 may include a work function metal pattern WF and an electrode pattern EL on the work function metal pattern WF. The second gate electrode GE2 may include a first work function metal pattern WF1, a second work function metal pattern WF2 on the first work function metal pattern WF1, and an electrode pattern EL on the second work function metal pattern WF2.

The work function metal pattern WF of the first gate electrode GE1 may include one or more of a metal nitride layer, a metal nitride layer doped with either aluminum or silicon, and a metal oxide layer. Each of the first and second work function metal patterns WF1 and WF2 of the second gate electrode GE2 may include one or more of a metal nitride layer, a metal nitride layer doped with either aluminum or silicon, and a metal oxide layer. For example, the second work function metal pattern WF2 may include the same material as that of the work function metal pattern WF of the first gate electrode GE1. The second work function metal pattern WF2 may have a thickness substantially the same as that of the work function metal pattern WF of the first gate electrode GE1.

Referring back to FIGS. 21A and 21B, the work function metal pattern WF of the first gate electrode GE1 may contain substantially no impurities DPT. For example, the work function metal pattern WF of the first gate electrode GE1 may have an impurity concentration less than that of a high-k dielectric layer HK.

The first work function metal pattern WF1 of the second gate electrode GE2 may have an impurity concentration greater than that of the high-k dielectric layer HK. The second work function metal pattern WF2 of the second gate electrode GE2 may contain substantially no impurities DPT. For example, the second work function metal pattern WF2 may have an impurity concentration less than that of the first work function metal pattern WF1. The impurity concentration of the first work function metal pattern WF1 of the second gate electrode GE2 may be greater than that of the work function metal pattern WF of the first gate electrode GE.

Referring back to FIGS. 19, 20A, and 20B, a structure of work function metal of the first gate electrode GE1 may be different from that of work function metal of the second gate electrode GE2, and accordingly, a threshold voltage of a transistor on the first active region AR1 may be different from that of a transistor on the second active region AR2.

Figure 22:
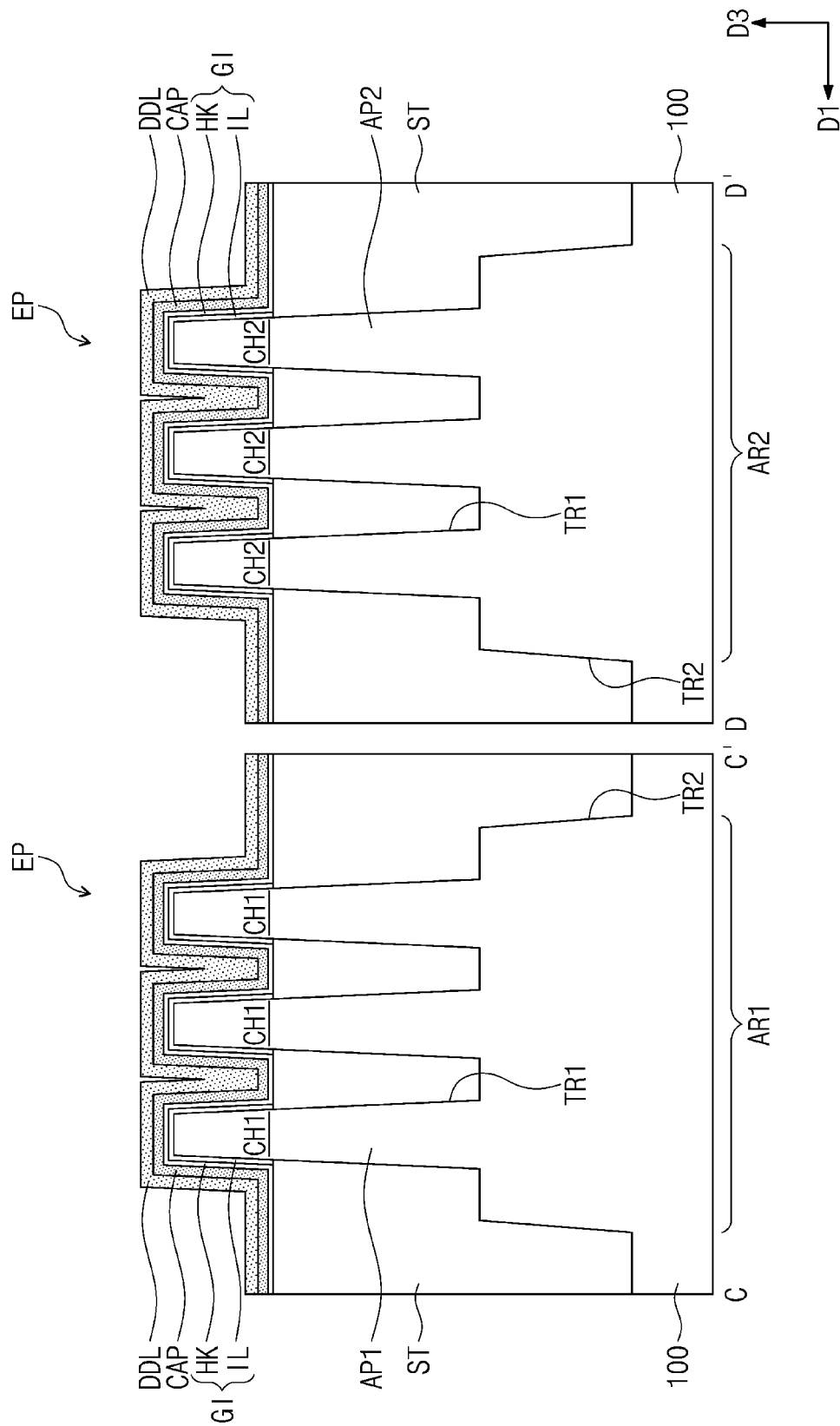
FIGS. 22, 23, and 24 illustrate cross-sectional views taken along lines C-C' and D-D' of FIG. 19, showing a method of fabricating a semiconductor device according to some example embodiments of the present disclosure.
Figure 23:
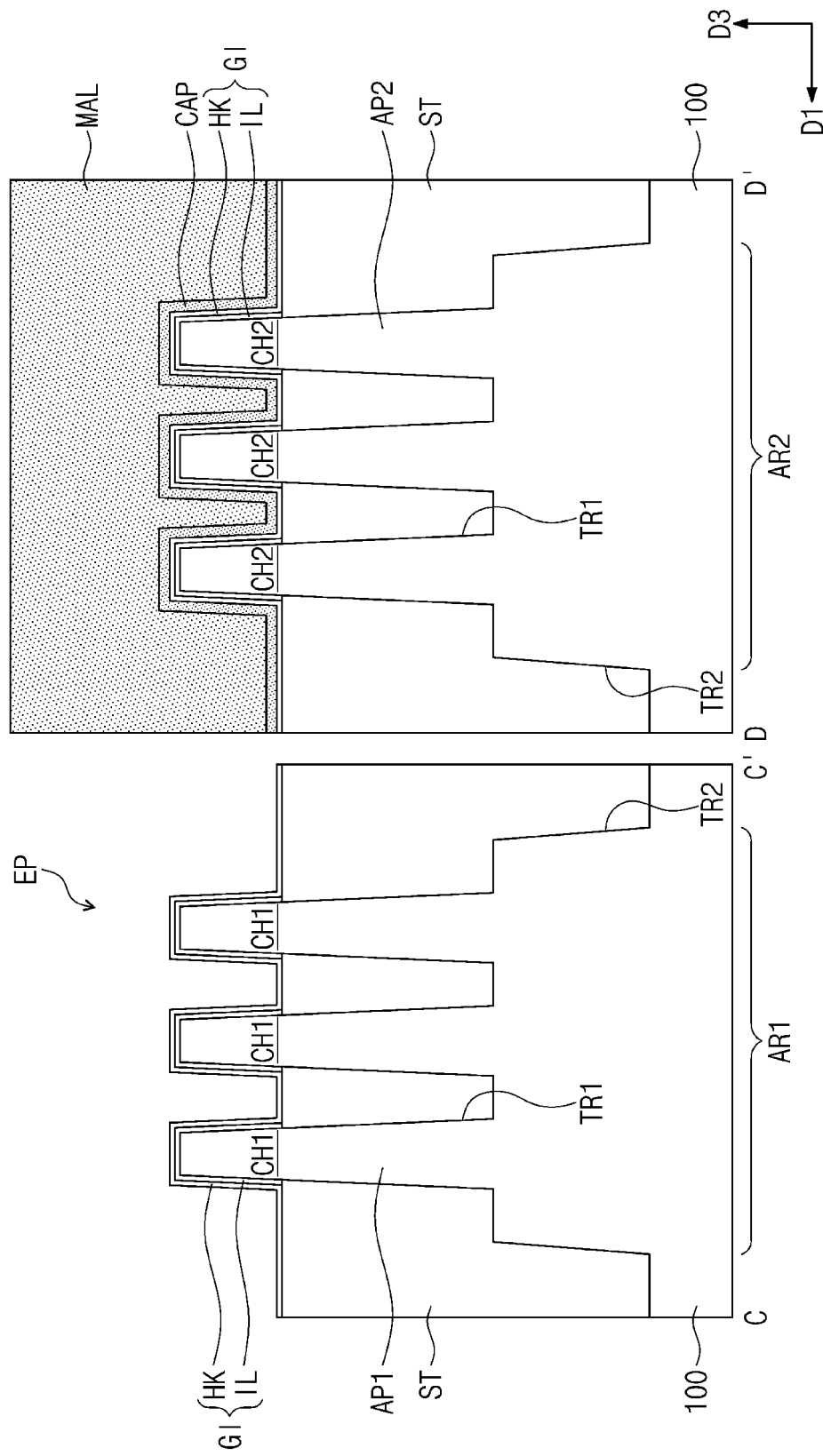
Figure 24:
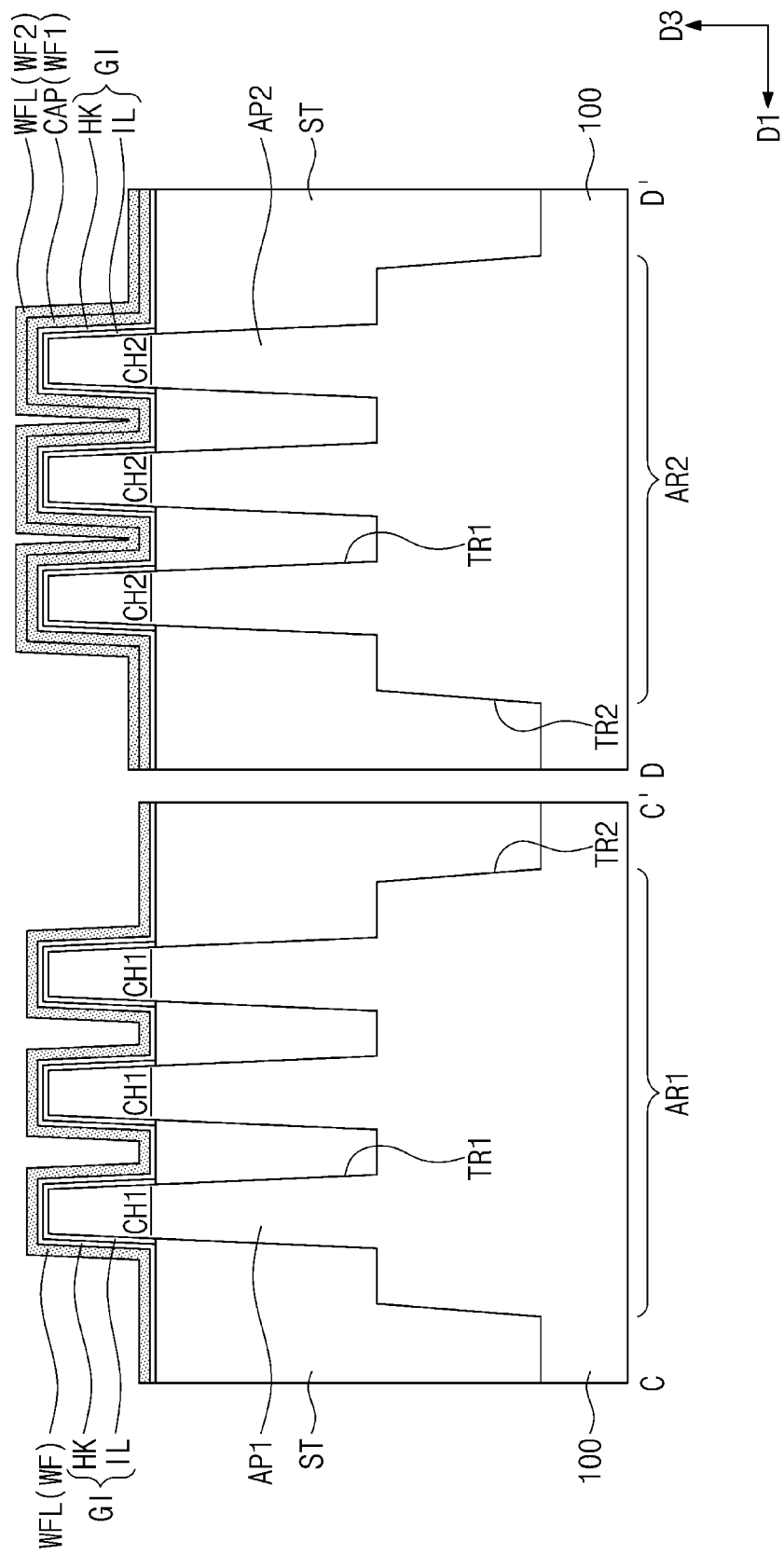

FIGS. 22, 23, and 24 illustrate cross-sectional views taken along lines C-C' and D-D' of FIG. 19, showing a method of fabricating a semiconductor device according to some example embodiments of the present disclosure. In the embodiment that follows, a detailed description of technical features repetitive to the fabrication method discussed above with reference to FIGS. 1 to 14B will be omitted, and a difference thereof will be discussed in detail.

Referring to FIGS. 19 and 22, empty spaces EP may be formed to expose the first channel regions CH1 and the second channel regions CH2. Gate dielectric patterns GI may be formed on the exposed first and second channel regions CH1 and CH2. A capping layer CAP and an impurity-doped layer DDL may be sequentially formed on the gate dielectric patterns GI. The impurity-doped layer DDL may undergo an annealing process to cause impurities to migrate from the impurity-doped layer DDL to the high-k dielectric layer HK.

Referring to FIGS. 19 and 23, the impurity-doped layer DDL may be removed. Thereafter, a mask layer MAL may be formed to fill the empty space EP on the second active region AR2. The mask layer MAL may not fill the empty space EP on the first active region AR1. The mask layer MAL may thus expose the first active region AR1.

The capping layer CAP exposed on the first active region AR1 may be selectively removed. The capping layer CAP on the second active region AR2 may be protected by the mask layer MAL and may thus not be removed.

Referring to FIGS. 19 and 24, the mask layer MAL may be removed. A work function metal layer WFL may be formed on the first and second active regions AR1 and AR2. The work function metal layer WFL on the first active region AR1 may constitute a work function metal pattern WF of the first gate electrode GE1. The capping layer CAP on the second active region AR2 may constitute a first work function metal pattern WF1 of the second gate electrode GE2. The work function metal layer WFL on the second active region AR2 may constitute a second work function metal pattern WF2 of the second gate electrode GE2.

Figure 26A:
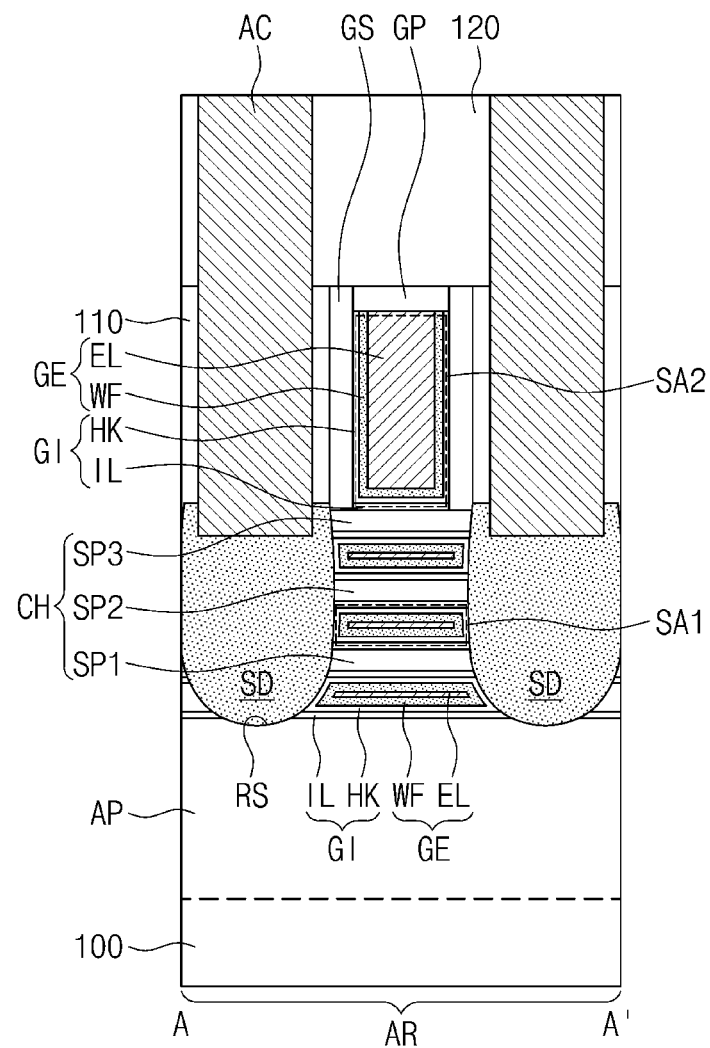
FIGS. 26A, 26B, and 26C illustrate cross-sectional views respectively taken along lines A-A', B-B', and C-C' of FIG. 25.
Figure 26B:
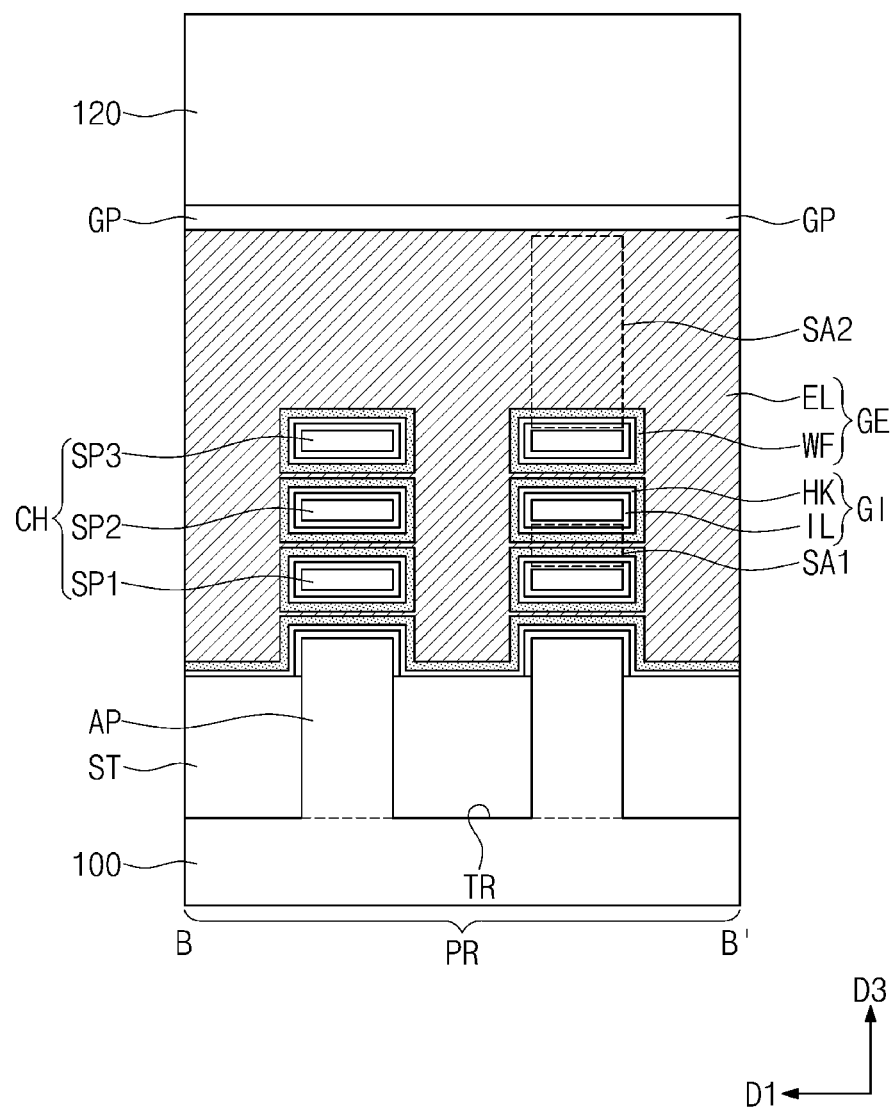
Figure 26C:
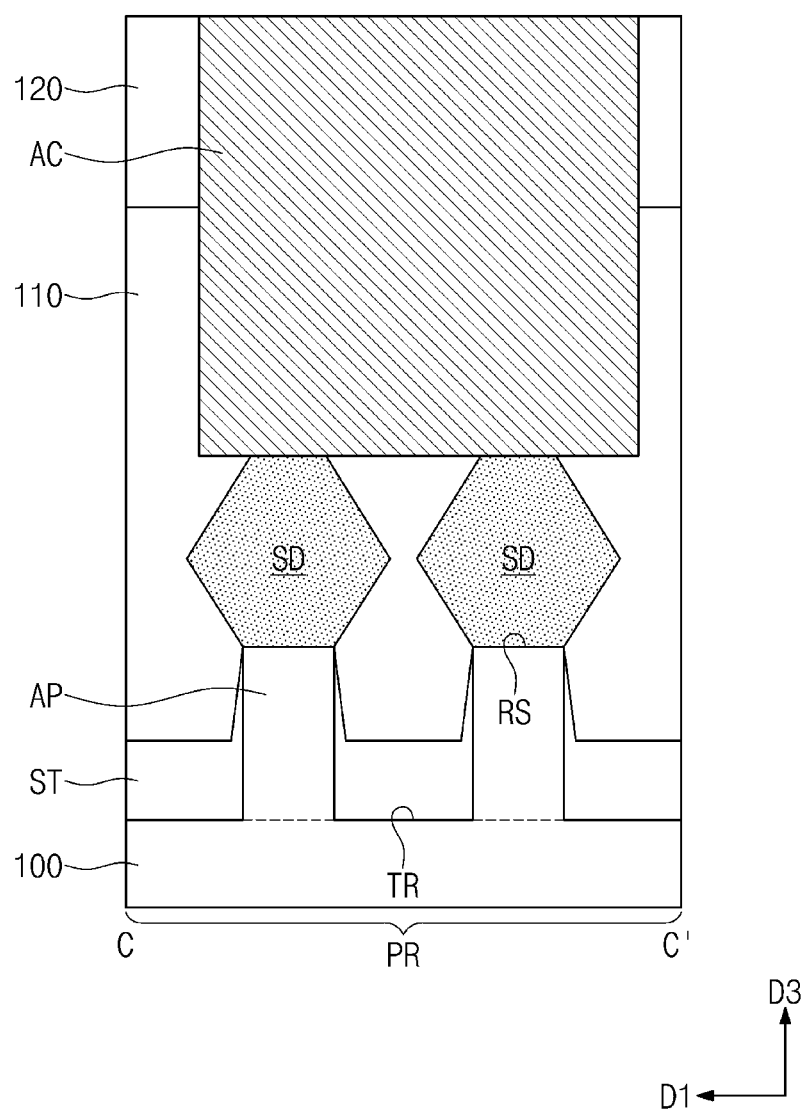

FIG. 25 illustrates a plan view showing a semiconductor device according to some example embodiments of the present disclosure. FIGS. 26A, 26B, and 26C illustrate cross-sectional views respectively taken along lines A-A', B-B', and C-C' of FIG. 25. In the embodiment that follows, a detailed description of technical features repetitive to the semiconductor device discussed above with reference to FIGS. 1, 2A to 2C, and 3 will be omitted, and a difference thereof will be discussed in detail.

Referring to FIGS. 25 and 26A to 26C, a substrate 100 may be provided to include an active region AR. A device isolation layer ST may be provided on the substrate 100. The device isolation layer ST may define active patterns AP on an upper portion of the substrate 100. The active patterns AP may each have a linear or bar shape extending in a first direction D1. The device isolation layer ST may fill a trench TR between a pair of neighboring active patterns AP. The device isolation layer ST may have a top surface lower than those of the active patterns AP.

A channel region CH and a pair of source/drain patterns SD may be provided on each of the active patterns AP. The channel region CH may be interposed between the pair of source/drain patterns SD. The channel region CH may include first, second, and third semiconductor patterns SP1, SP2, and SP3 that are sequentially stacked.

The first, second, and third semiconductor patterns SP1, SP2, and SP3 may be spaced apart from each other in a third direction D3 perpendicular to a top surface of the substrate 100. The first, second, and third semiconductor patterns SP1, SP2, and SP3 may vertically overlap each other. Each of the source/drain patterns SD may be in direct contact with a sidewall of each of the first, second, and third semiconductor patterns SP1, SP2, and SP3. For example, the first, second, and third semiconductor patterns SP1, SP2, and SP3 may be a multi-bridge channel that connects the pair of source/drain patterns SD to each other.

The first, second, and third semiconductor patterns SP1, SP2, and SP3 may have the same thickness as each other or different thicknesses from each other. The first, second, and third semiconductor patterns SP1, SP2, and SP3 may have different maximum lengths in a second direction D2. For example, a first length may refer to the maximum length in the second direction D2 of the first semiconductor pattern SP1. A second length may refer to the maximum length in the second direction D2 of the second semiconductor pattern SP2. The first length may be greater than the second length.

The first, second, and third semiconductor patterns SP1, SP2, and SP3 may include one or more of silicon (Si), germanium (Ge), and silicon-germanium (SiGe). In the present embodiment, the channel region CH is illustrated to include the first, second, and third semiconductor patterns SP1, SP2, and SP3, but the number of semiconductor patterns is not particularly limited.

The source/drain patterns SD may be epitaxial patterns formed from seed layers, or from a recess RS of the active pattern AP and from the first, second, and third semiconductor patterns SP1, SP2, and SP3. Each of the source/drain patterns SD may fill the recess RS of the active pattern AP. The recess RS may be defined on each of opposite sides of the channel region CH. The recess RS may have a bottom surface lower than a top surface of the active pattern AP.

The source/drain pattern SD may have a maximum width in the second direction D2 at a middle portion thereof (see FIG. 26A). A width in the second direction D2 of the source/drain pattern SD may increase as approaching the middle portion from an upper portion thereof. The width in the second direction D2 of the source/drain pattern SD may decrease as approaching a lower portion thereof from the middle portion.

A gate electrode GE may be provided to extend in the first direction D1, while running across the channel region CH. The gate electrode GE may surround the first, second, and third semiconductor patterns SP1, SP2, and SP3 (see FIG. 26B). For example, the gate electrode GE may surround top and bottom surfaces and opposite sidewalls of each of the first, second, and third semiconductor patterns SP1, SP2, and SP3. A transistor according to the present embodiment may be a gate-all-around type field effect transistor.

A gate dielectric pattern GI may be interposed between the gate electrode GE and the active pattern AP and between the gate electrode GE and the channel region CH. The gate dielectric pattern GI may include an interface layer IL and a high-k dielectric layer HK between the interface layer IL and the gate electrode GE.

The interface layer IL may directly cover the first, second, and third semiconductor patterns SP1, SP2, and SP3. The interface layer IL may cover an upper portion of the active pattern AP, which upper portion vertically protrudes from the device isolation layer ST. The interface layer IL may not cover the top surface of the device isolation layer ST. A high-k dielectric layer HK may be interposed between the interface layer IL and the gate electrode GE. As discussed above with reference to FIG. 3, the high-k dielectric layer HK may include the impurities DPT.

The gate electrode GE may include a work function metal pattern WF and an electrode pattern EL. The electrode pattern EL may be disposed on the work function metal pattern WF. The work function metal pattern WF may include one or more of a metal nitride layer, a metal nitride layer doped with either aluminum or silicon, and a metal oxide layer. In certain embodiments, as discussed above with reference to FIG. 3, the work function metal pattern WF may include the impurities DPT. In other embodiments, as discussed above with reference to FIG. 21A, the work function metal pattern WF may contain substantially no impurities DPT. The electrode pattern EL may include metal whose resistance is low.

A first space SA1 may be defined between the first and second semiconductor patterns SP1 and SP2 of the channel region CH. For example, the first space SA1 may be defined between a pair of vertically neighboring ones of the first, second, and third semiconductor patterns SP1, SP2, and SP3.

The first space SA1 may be filled with the interface layer IL, the high-k dielectric layer HK, and the work function metal pattern WF. Each of the high-k dielectric layer HK and the work function metal pattern WF may conformally fill the first space SAL The electrode pattern EL may completely fill a remaining portion of the first space SA1, which remaining portion is a space not occupied by the interface layer IL, the high-k dielectric layer HK, and the work function metal pattern WF.

A second space SA2 may be defined on an uppermost semiconductor pattern, or the third semiconductor pattern SP3 of the channel region CH. The second space SA2 may be surrounded by a pair of gate spacers GS, a gate capping pattern GP, and the third semiconductor pattern SP3.

The second space SA2 may be filled with the interface layer IL, the high-k dielectric layer HK, the work function metal pattern WF, and the electrode pattern EL. The interface layer IL, the high-k dielectric layer HK, the work function metal pattern WF, and the electrode pattern EL may be sequentially stacked in the second space SA2.

The substrate 100 may be provided on its entire surface with a first interlayer dielectric layer 110 and a second interlayer dielectric layer 120 on the first interlayer dielectric layer 110. Active contacts AC may be provided to penetrate the first and second interlayer dielectric layers 110 and 120 and to have electrical connection with the source/drain patterns SD.

FIGS. 27, 29, 31, 33, 35, 37, and 39 illustrate plan views showing a method of fabricating a semiconductor device according to some example embodiments of the present disclosure. FIGS. 28, 30A, 32A, 34A, 36A, 38A, and 40A illustrate cross-sectional views taken along line A-A' of FIGS. 27, 29, 31, 33, 35, 37, and 39, respectively. FIGS. 30B, 32B, 34B, 36B, 38B, and 40B illustrate cross-sectional views taken along line B-B' of FIGS. 29, 31, 33, 35, 37, and 39, respectively. FIGS. 32C, 34C, 36C, 38C, and 40C illustrate cross-sectional views taken along line C-C' of FIGS. 31, 33, 35, 37, and 39, respectively. In the embodiment that follows, a detailed description of technical features repetitive to the fabrication method discussed above with reference to FIGS. 1 to 14B will be omitted, and a difference thereof will be discussed in detail.

Referring to FIGS. 27 and 28, sacrificial layers SAC and semiconductor layers SEL may be alternately and repeatedly stacked on an entire surface of a substrate 100. It is illustrated that the semiconductor layers SEL are repeatedly stacked three times, but the present disclosure is not limited thereto. The sacrificial layers SAC may include, for example, a material having an etch selectivity with respect to the semiconductor layers SEL. In this sense, the semiconductor layers SEL may include a material that substantially cannot be etched in a process in which the sacrificial layers SAC are etched. For example, the sacrificial layers SAC may include silicon-germanium (SiGe) or germanium (Ge), and the semiconductor layers SEL may include silicon (Si).

The sacrificial layers SAC may be formed thicker than the semiconductor layers SEL. The sacrificial layers SAC and the semiconductor layers SEL may be formed by an epitaxial growth process in which the substrate 100 is used as a seed layer. The sacrificial layers SAC and the semiconductor layers SEL may be successively formed in the same chamber. The sacrificial layers SAC and the semiconductor layers SEL may be conformally grown on the entire surface of the substrate 100.

Figure 30A:
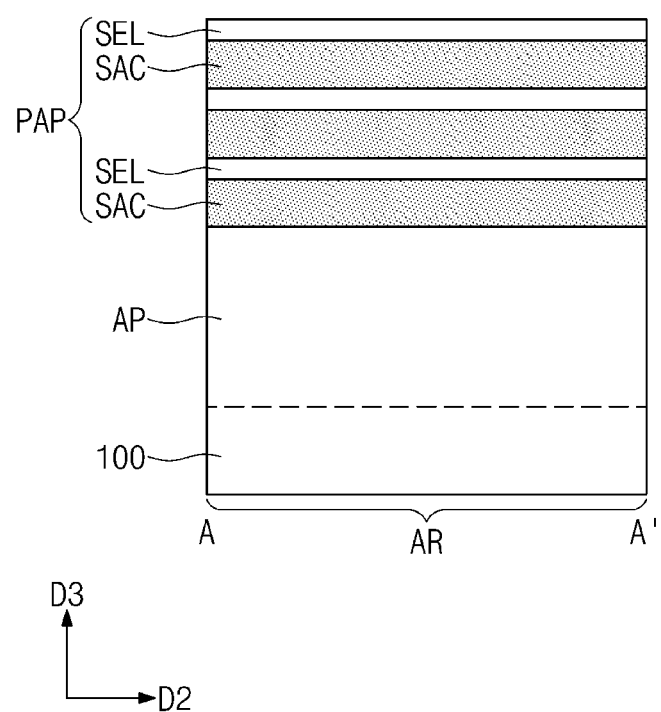
Figure 30B:
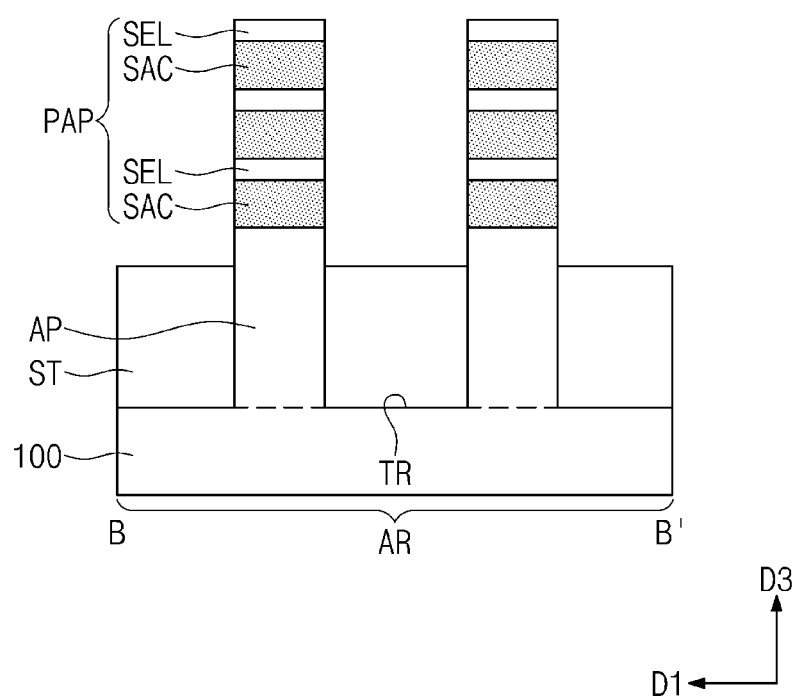
FIGS. 30B, 32B, 34B, 36B, 38B, and 40B illustrate cross-sectional views taken along line B-B' of FIGS. 29, 31, 33, 35, 37, and 39, respectively.
Figure 31:
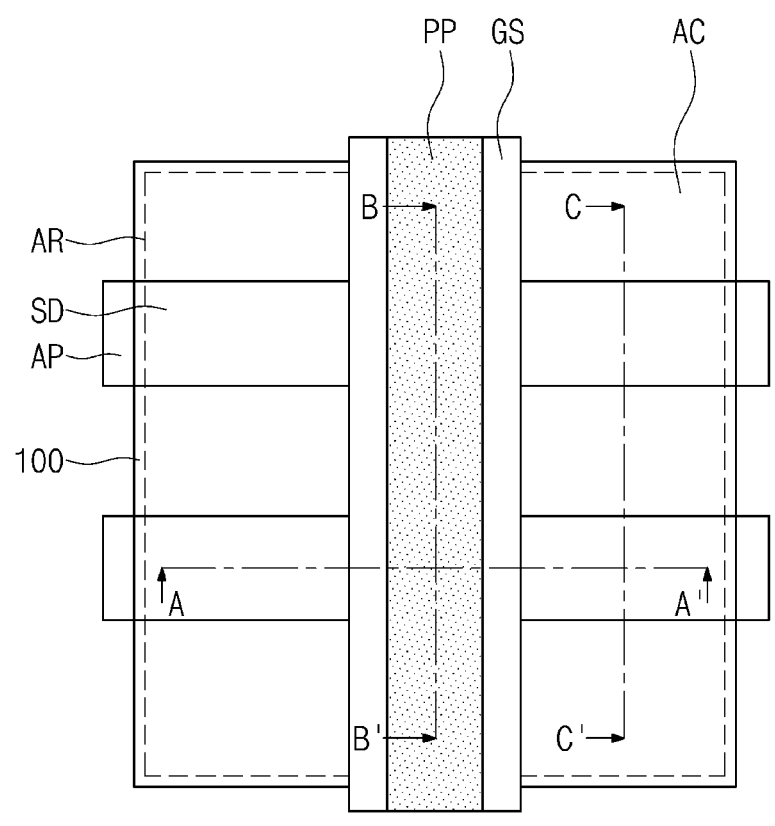
Figure 32B:
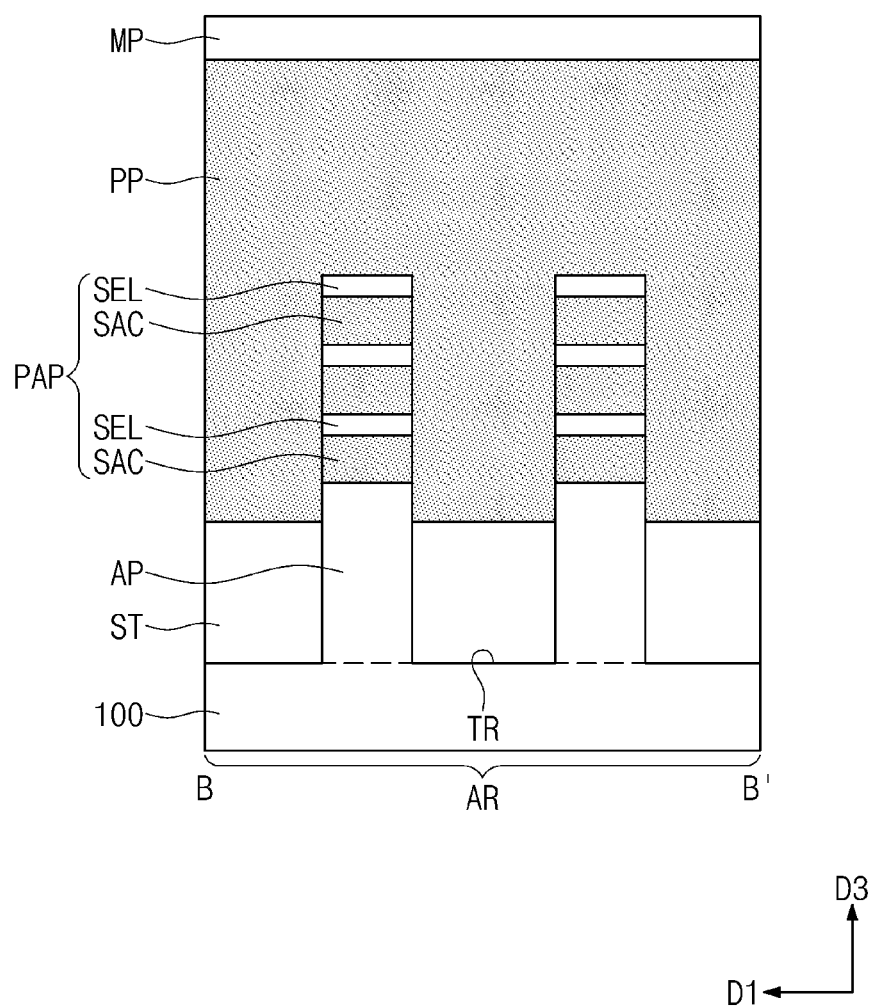
Figure 32C:
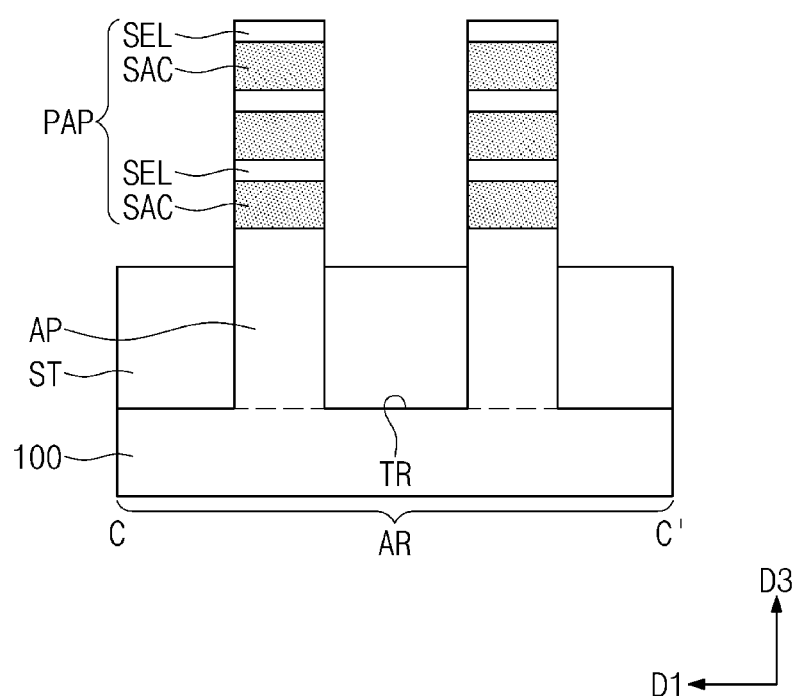
FIGS. 32C, 34C, 36C, 38C, and 40C illustrate cross-sectional views taken along line C-C' of FIGS. 31, 33, 35, 37, and 39, respectively.
Figure 33:
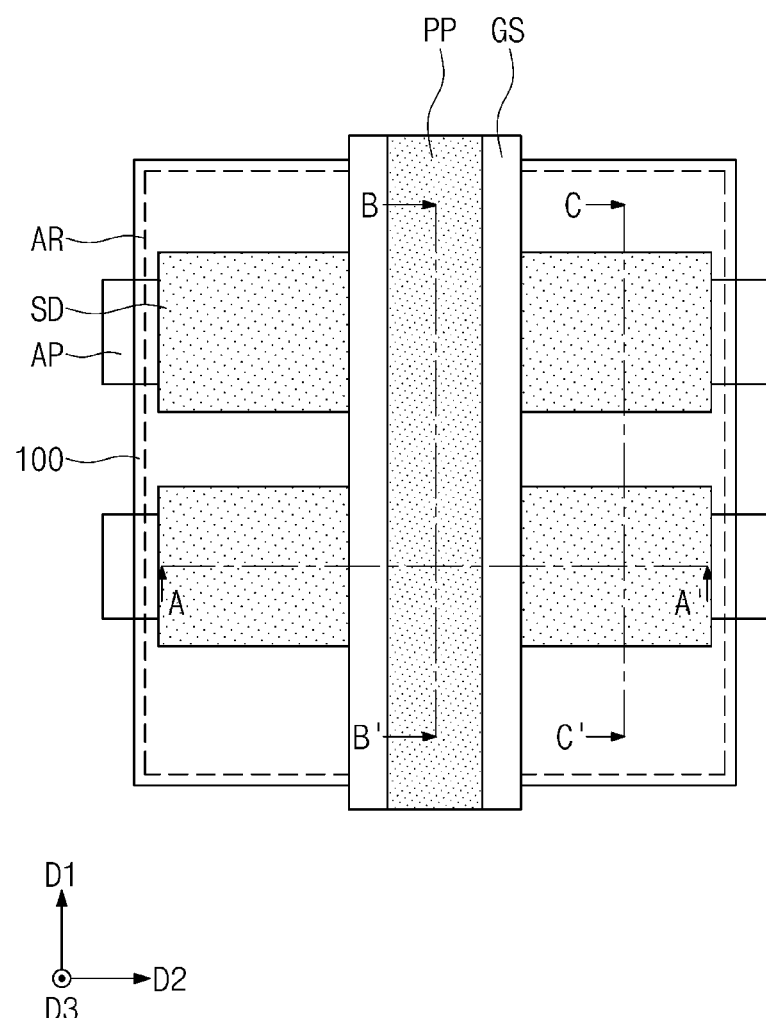
Figure 34A:
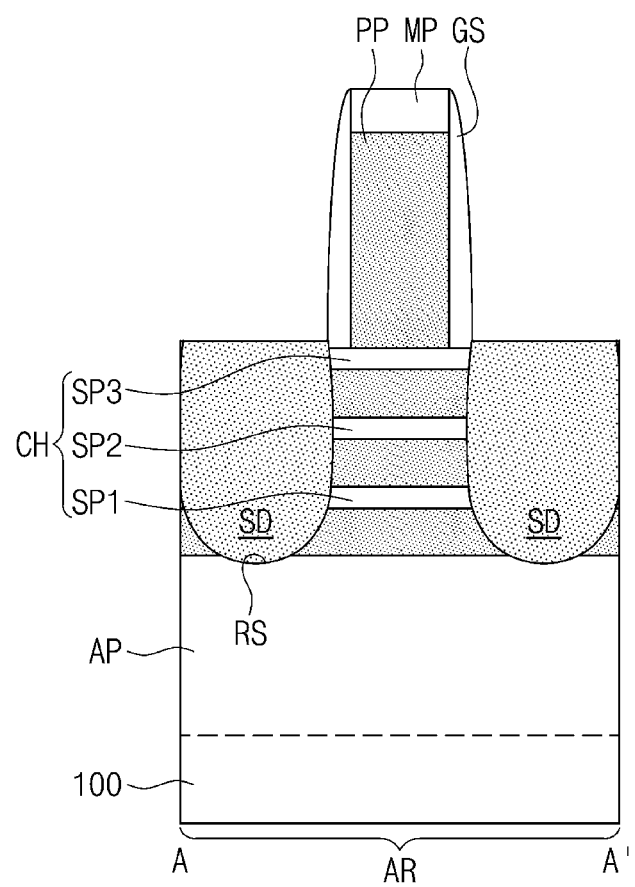
Figure 34B:
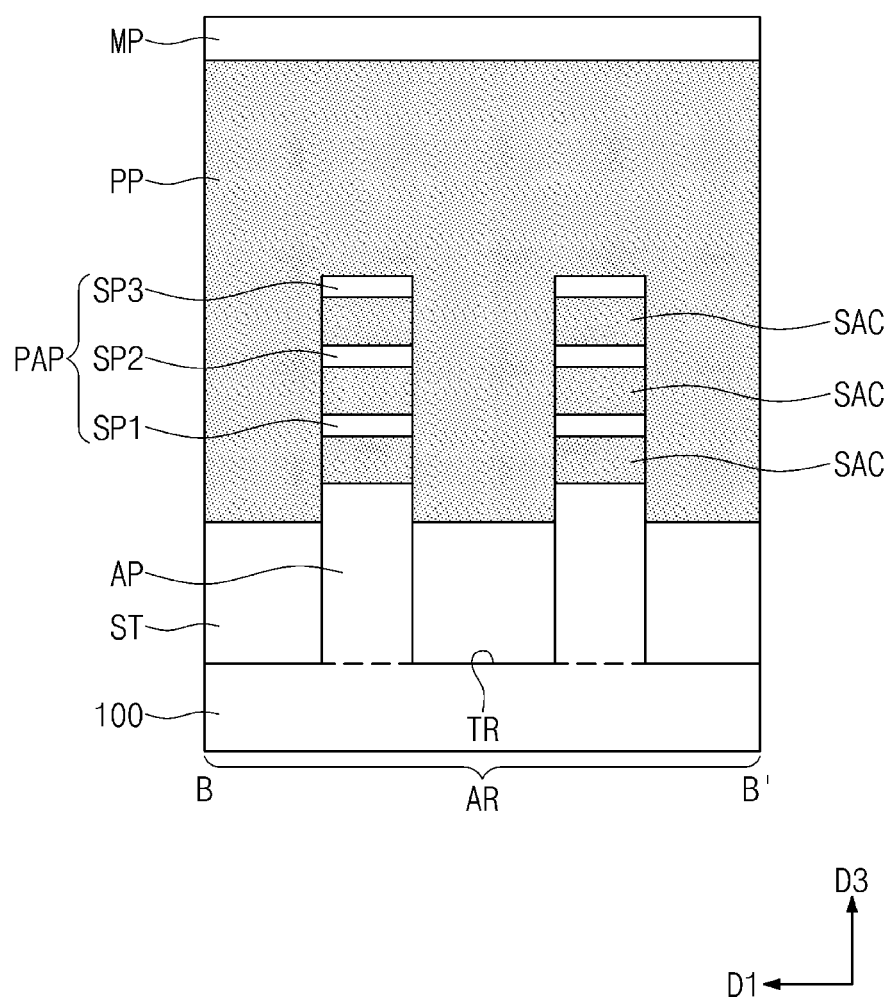
Figure 34C:
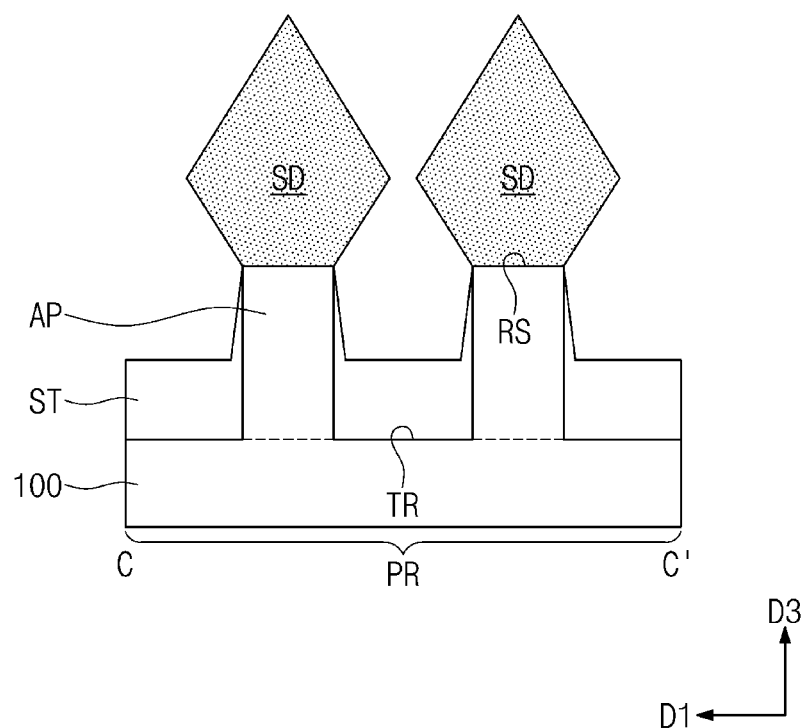
Figure 35:
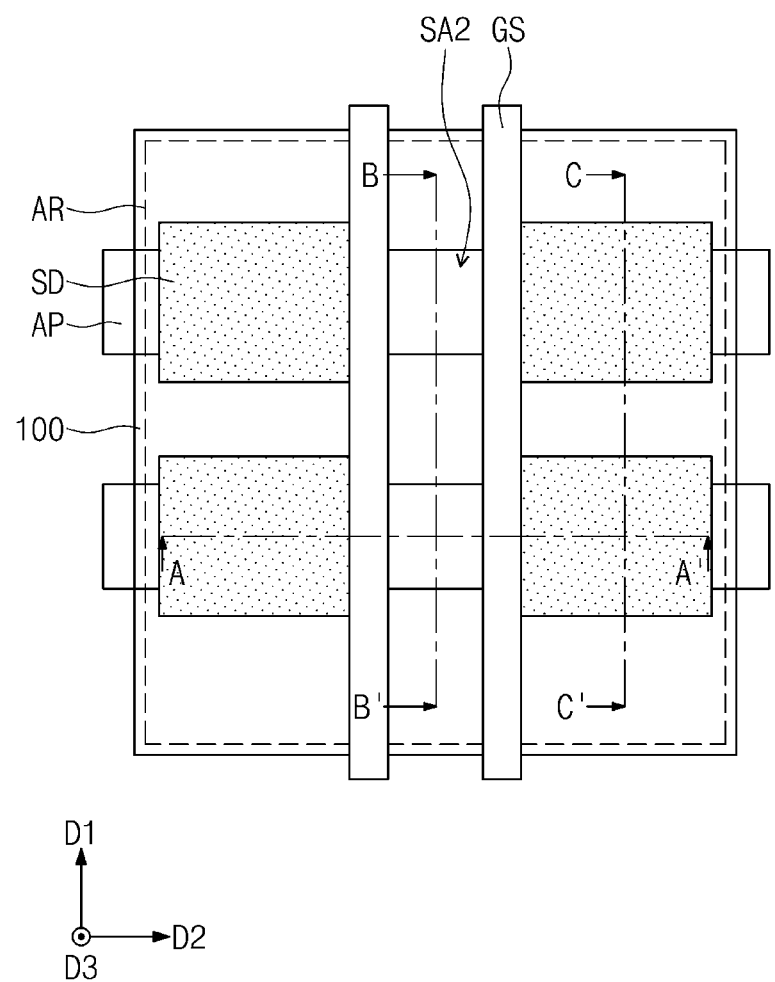
Figure 36A:
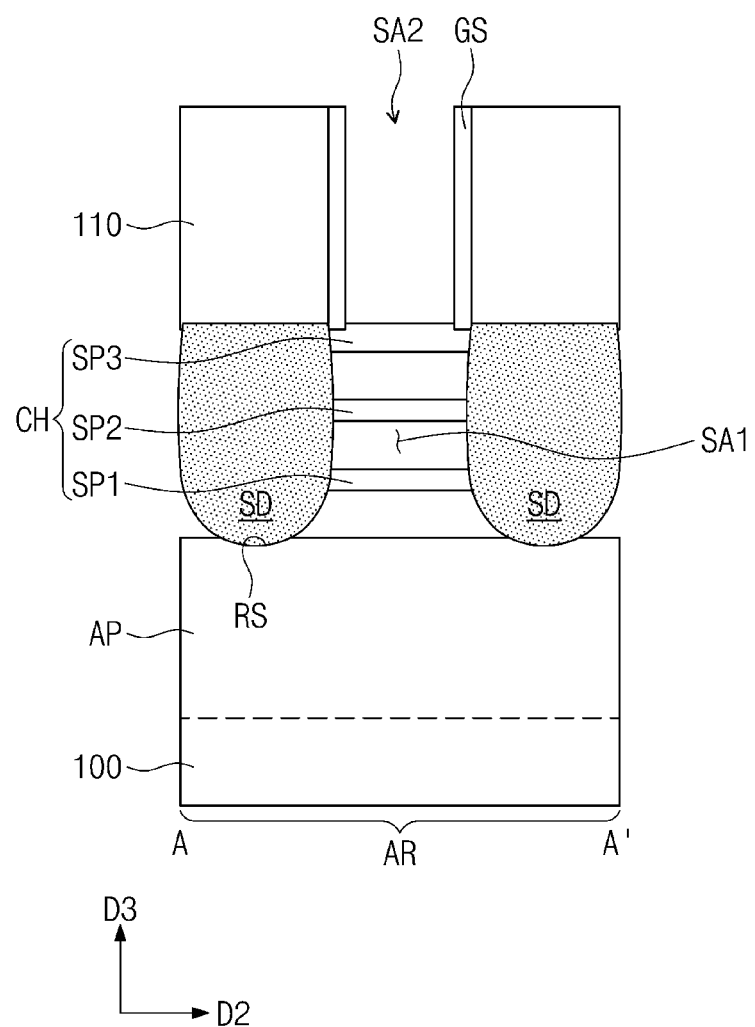
Figure 36B:
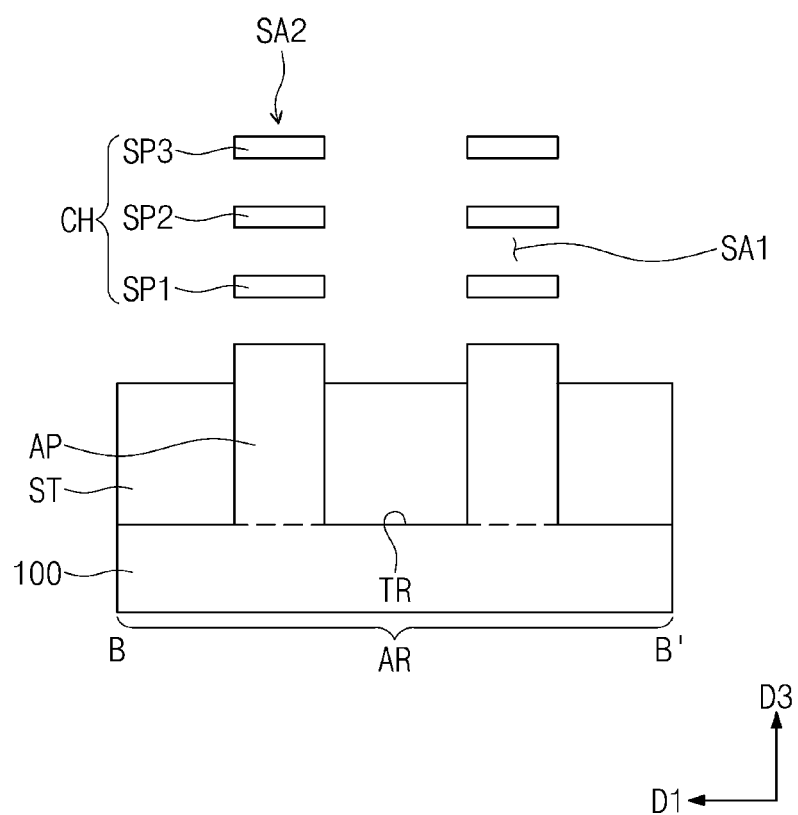
Figure 36C:
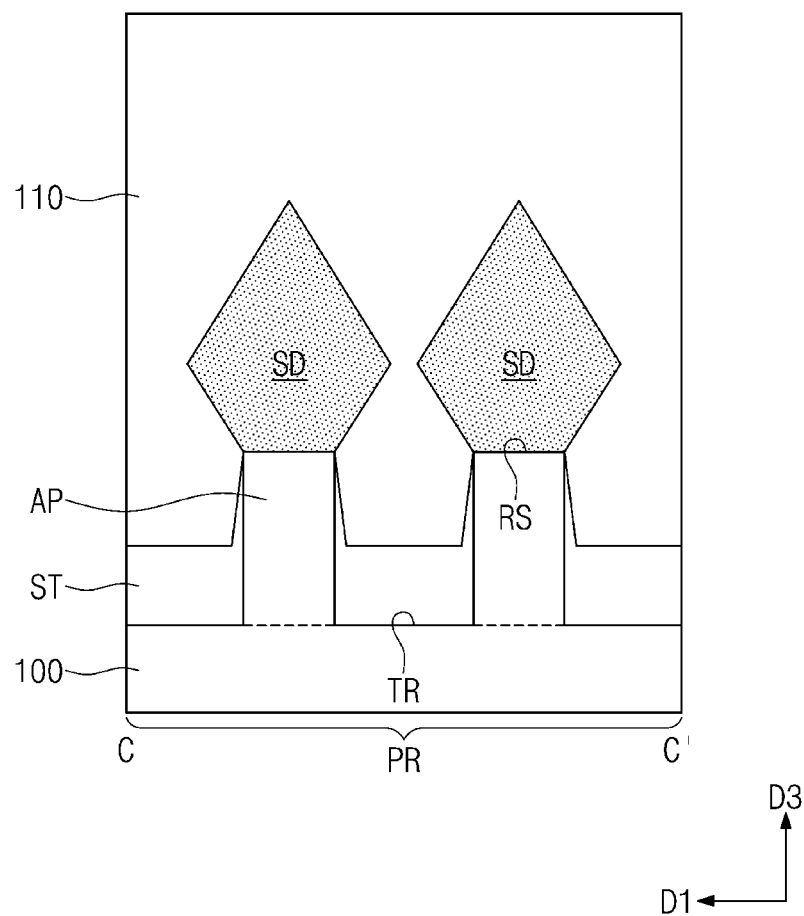
Figure 37:
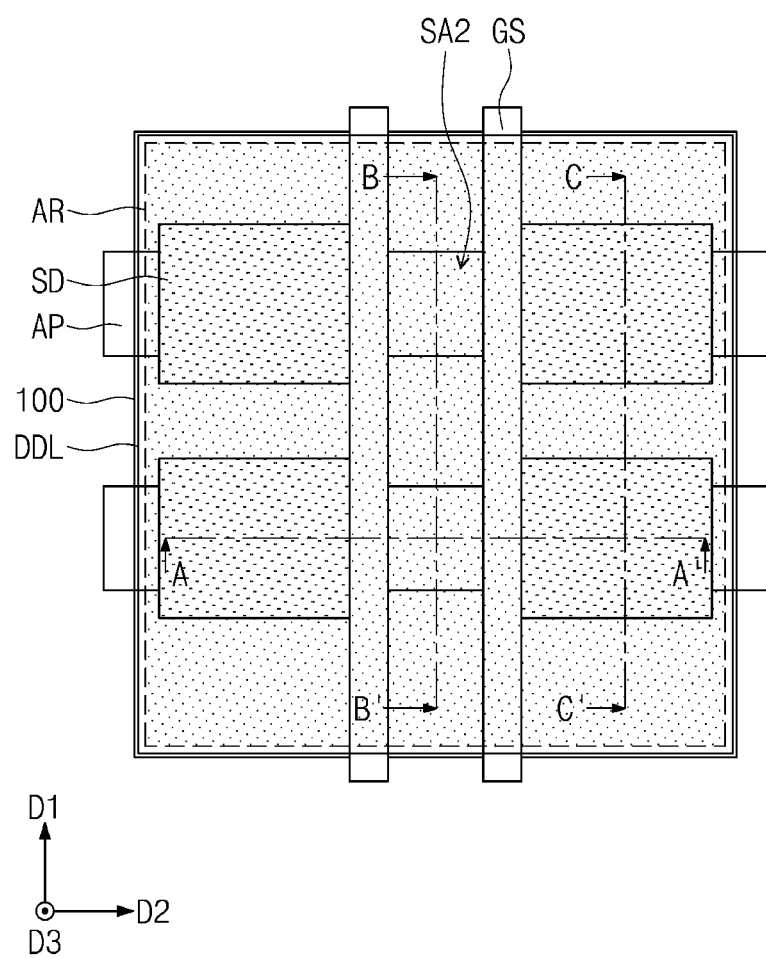
Figure 38A:
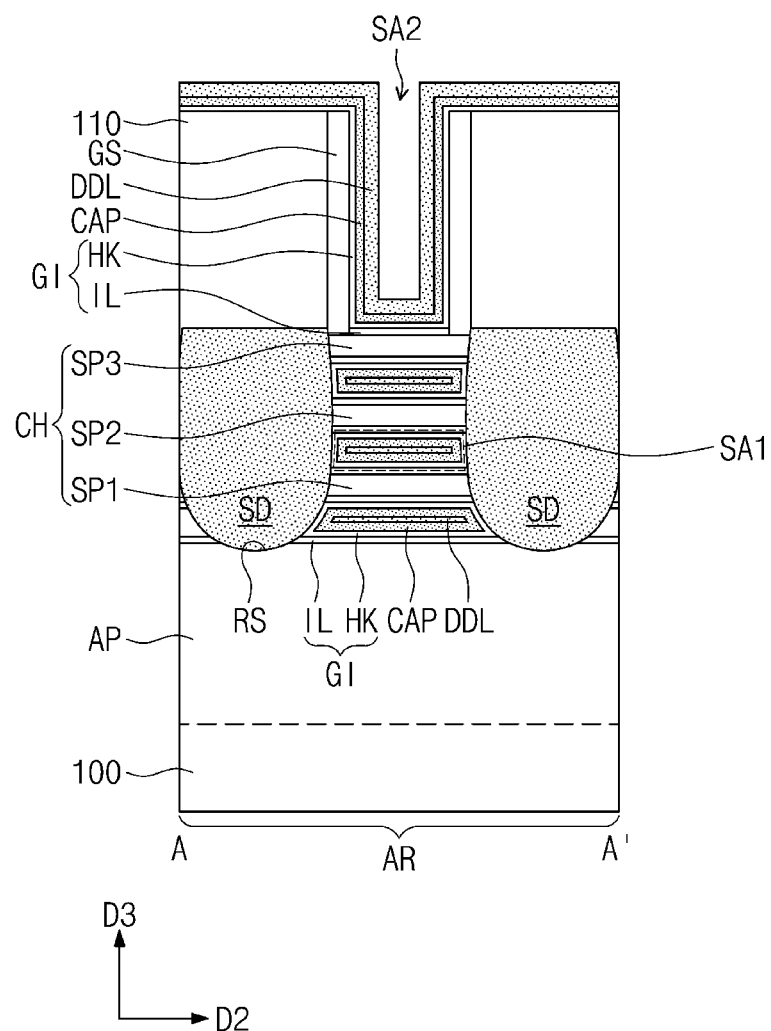
Figure 38B:
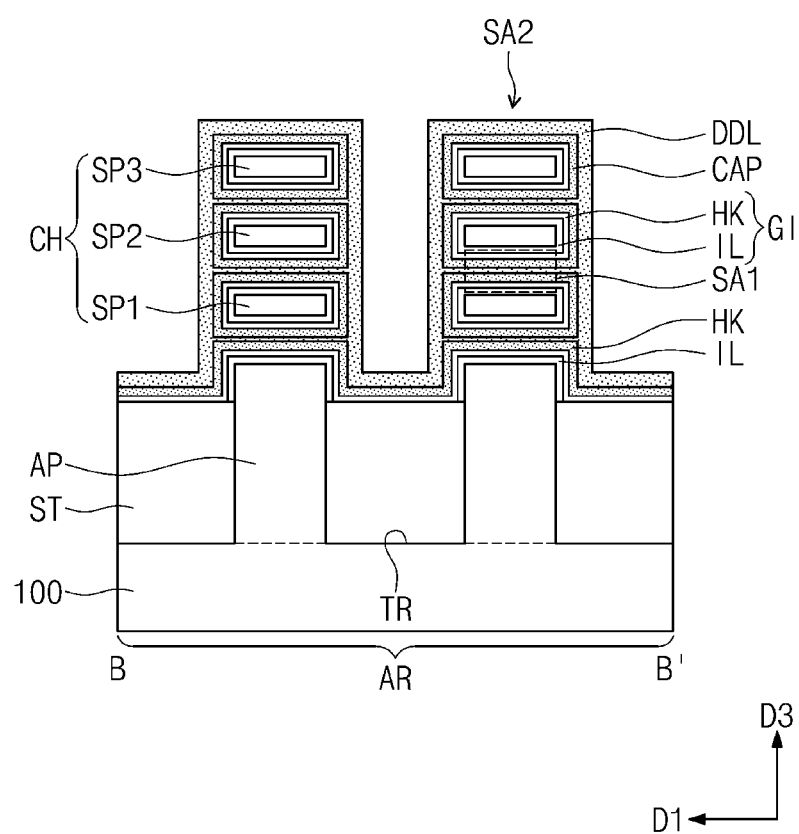
Figure 38C:
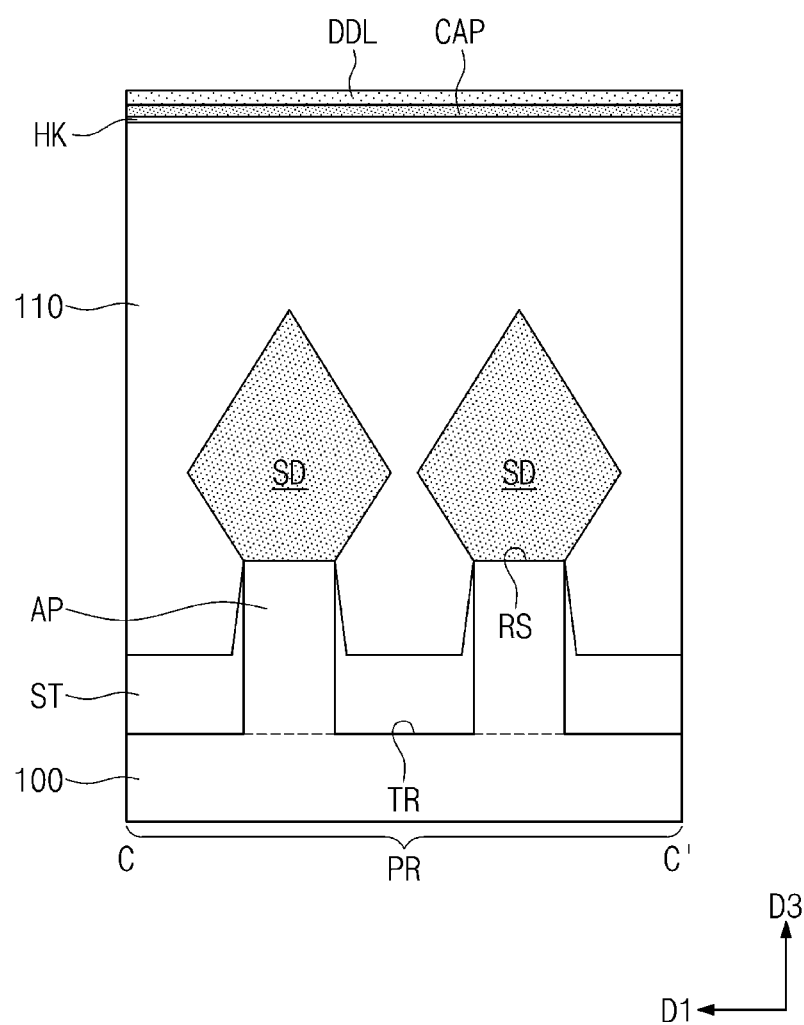
Figure 39:
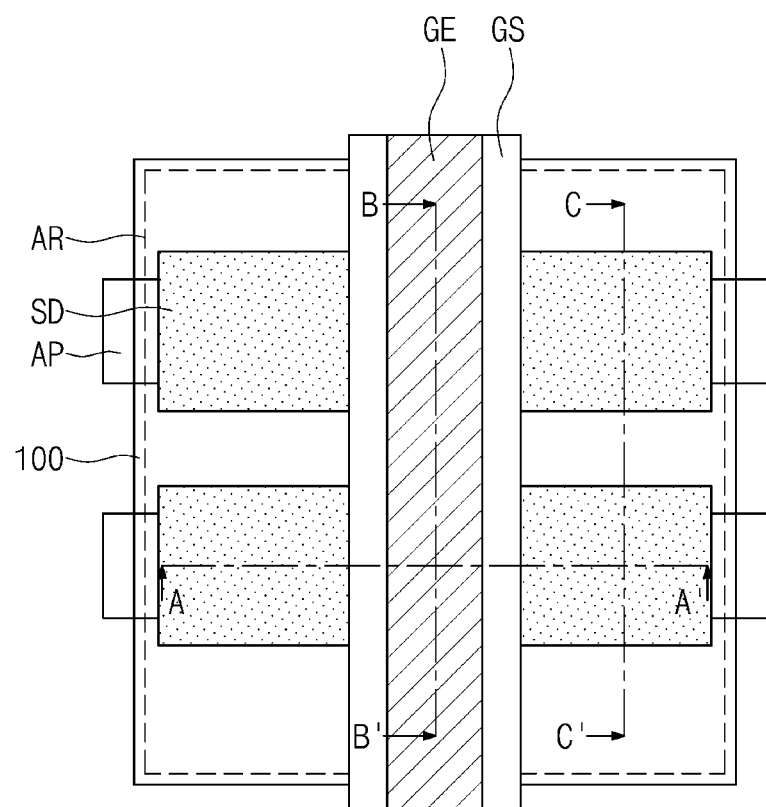
Figure 40A:
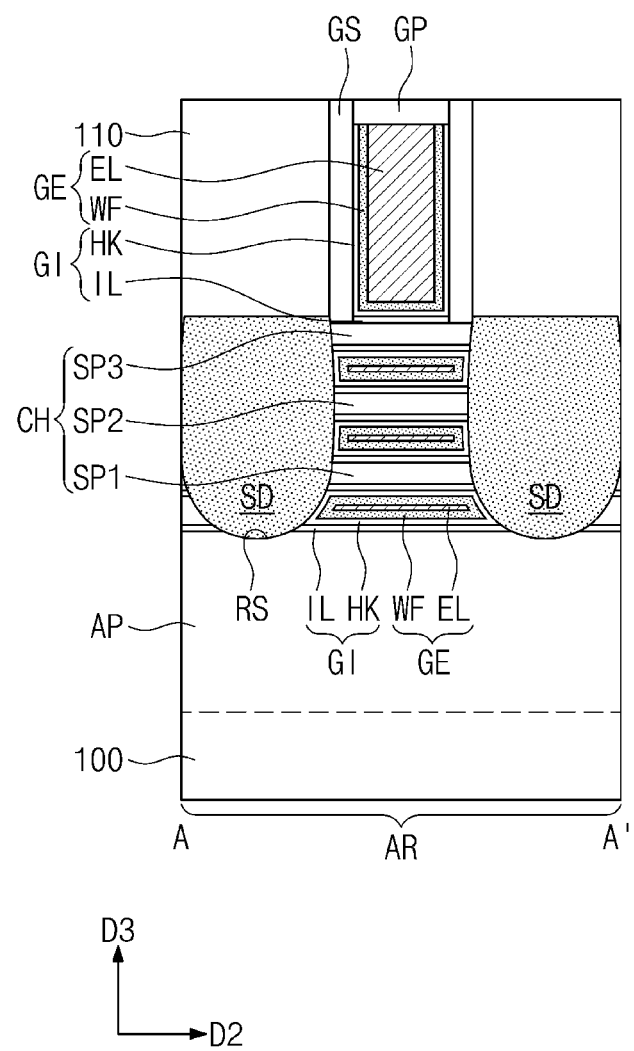
Figure 40B:
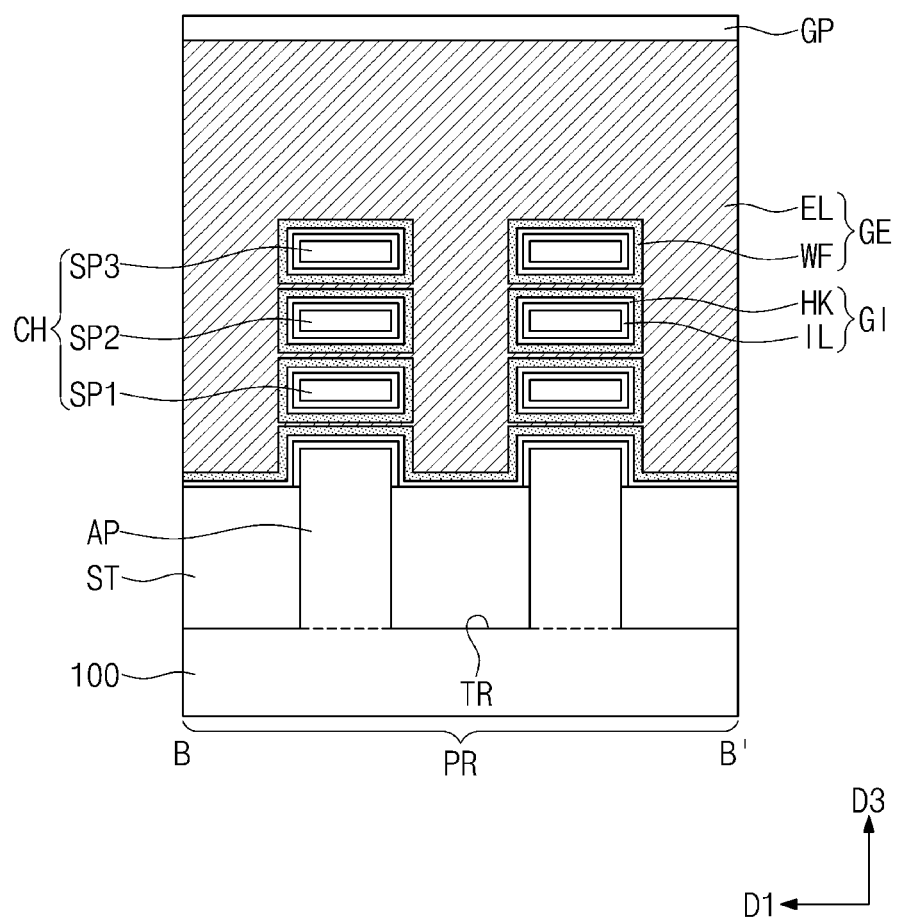
Figure 40C:
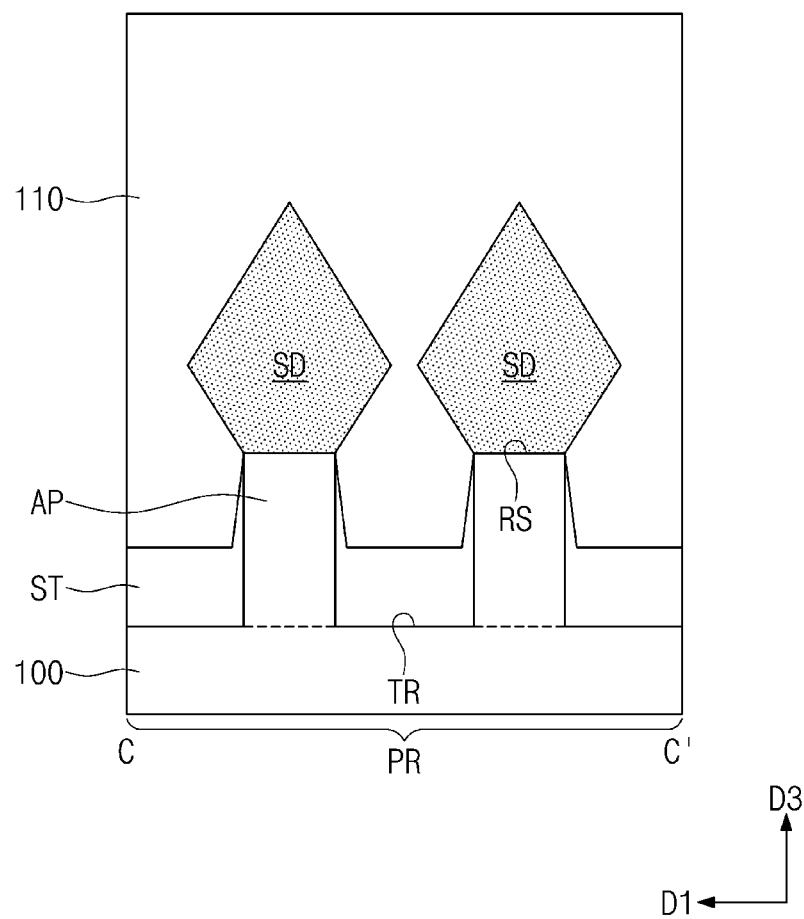

Referring to FIGS. 29, 30A, and 30B, the sacrificial layers SAC and the semiconductor layers SEL may be patterned to form preliminary patterns PAP on an active region AR of the substrate 100. When the sacrificial layers SAC and the semiconductor layers SEL are patterned, an upper portion of the substrate 100 may be etched to form a trench TR defining active patterns AP.

The trench TR may extend in a second direction D2 and define a sidewall in the second direction D2 of each of the active patterns AP. For example, the trench TR may be formed between a pair of active patterns AP that are adjacent to each other in a first direction D1.

The preliminary pattern PAP may be disposed on the active pattern AP. The preliminary pattern PAP may vertically overlap the active pattern AP. For example, the preliminary pattern PAP may have a planar shape substantially the same as that of the active pattern AP. The preliminary pattern PAP and the active pattern AP may each be formed to have a linear or bar shape extending in the second direction D2.

A device isolation layer ST may be formed to fill the trench TR. The formation of the device isolation layer ST may include forming a dielectric layer on the entire surface of the substrate 100 and recessing the dielectric layer until the preliminary pattern PAP is completely exposed. The device isolation layer ST may have a top surface lower than that of the active pattern AP.

Referring to FIGS. 31 and 32A to 32C, a sacrificial pattern PP may be formed to run across the preliminary patterns PAP. The sacrificial pattern PP may be formed to have a linear or bar shape extending in the first direction D1. A pair of gate spacers GS may be formed on opposite sidewalls of the sacrificial pattern PP.

Referring to FIGS. 33 and 34A to 34C, mask patterns MP and the gate spacers GS may be used as an etching mask to etch the preliminary pattern PAP to form a channel region CH. The semiconductor layers SEL of the preliminary pattern PAP may be patterned to form first, second, and third semiconductor patterns SP1, SP2, and SP3. The channel region CH may include the first, second, and third semiconductor patterns SP1, SP2, and SP3.

The preliminary pattern PAP may be etched to form a pair of recesses on opposite sides of the channel region CH. Source/drain patterns SD may be formed to fill the recesses RS. The formation of the source/drain patterns SD may include performing a selective epitaxial growth process in which the active pattern AP and the first, second, and third semiconductor pattern SP1, SP2 and SP3 are used as seed layers.

Referring to FIGS. 35 and 36A to 36C, a first interlayer dielectric layer 110 may be formed on the substrate 100. Afterwards, a planarization process may be performed on the first interlayer dielectric layer 110 until a top surface of the sacrificial pattern PP is exposed. When the first interlayer dielectric layer 110 is planarized, the mask patterns MP may also be removed.

The exposed sacrificial pattern PP may be selectively removed. The removal of the sacrificial pattern PP may form an empty space between a pair of neighboring gate spacers GS. The empty space may expose the sacrificial layers SAC and the first, second, and third semiconductor patterns SP1, SP2, and SP3.

A selective removal process may be performed on the sacrificial layers SAC exposed to the empty space. For example, when the sacrificial layers SAC include silicon-germanium (SiGe), and when the first, second, and third semiconductor patterns SP1, SP2, and SP3 include silicon (Si), the selective removal process may use an etchant including peracetic acid. The etchant may further include hydrofluoric acid (HF) solution and deionized water.

The selective removal of the sacrificial layers SAC may define a first space SA1 between a pair of vertically neighboring ones of the first, second, and third semiconductor patterns SP1, SP2, and SP3. For example, the first space SA1 may be defined between the first and second semiconductor patterns SP1 and SP2. A second space SA2 may be defined on an uppermost semiconductor pattern, or the third semiconductor pattern SP3. The empty space may include the first space SA1 and the second space SP2. The selective removal of the sacrificial layers SAC may cause the empty space to expose top and bottom surfaces and sidewalls of each of the first, second, and third semiconductor patterns SP1, SP2, and SP3.

Referring to FIGS. 37 and 38A to 38C, an interface layer IL may be conformally formed on the exposed first, second, and third semiconductor patterns SP1, SP2, and SP3 and on an exposed upper portion of the active pattern AP. For example, the interface layer IL may be formed by performing an oxidation process on the exposed first, second, and third semiconductor patterns SP1, SP2, and SP3 and on the exposed active pattern AP.

A high-k dielectric layer HK may be conformally formed on the entire surface of the substrate 100. The high-k dielectric layer HK may partially fill the first space SAL The high-k dielectric layer HK may partially fill the second space SA2. A capping layer CAP may be formed on the high-k dielectric layer HK. The capping layer CAP may partially fill the first space SAL The capping layer CAP may partially fill the second space SA2.

An impurity-doped layer DDL may be formed on the capping layer CAP. The impurity-doped layer DDL may be formed to completely fill the first space SAL The impurity-doped layer DDL may partially fill the second space SA2.

According to some example embodiments of the present disclosure, the high-k dielectric layer HK may be doped through the impurity-doped layer DDL. The impurity-doped layer DDL may undergo an annealing process to cause impurities to migrate from the impurity-doped layer DDL to the high-k dielectric layer HK.

Referring to FIGS. 39 and 40A to 40C, the impurity-doped layer DDL may be selectively removed. A gate electrode GE may be formed to fill the first space SA1 and the second space SA2. A gate capping pattern GP may be formed on the gate electrode GE. The formation of the gate electrode GE may include forming a work function metal pattern WF on the high-k dielectric layer HK and forming an electrode pattern EL on the work function metal pattern WF.

In certain embodiments, the capping layer CAP may not be removed, but may remain. The remaining capping layer CAP may constitute the work function metal pattern WF. In other embodiments, after the impurity-doped layer DDL is removed, the capping layer CAP may be selectively removed. The work function metal pattern WF and the electrode pattern EL may be sequentially formed on the exposed high-k dielectric layer HK.

Figure 41:
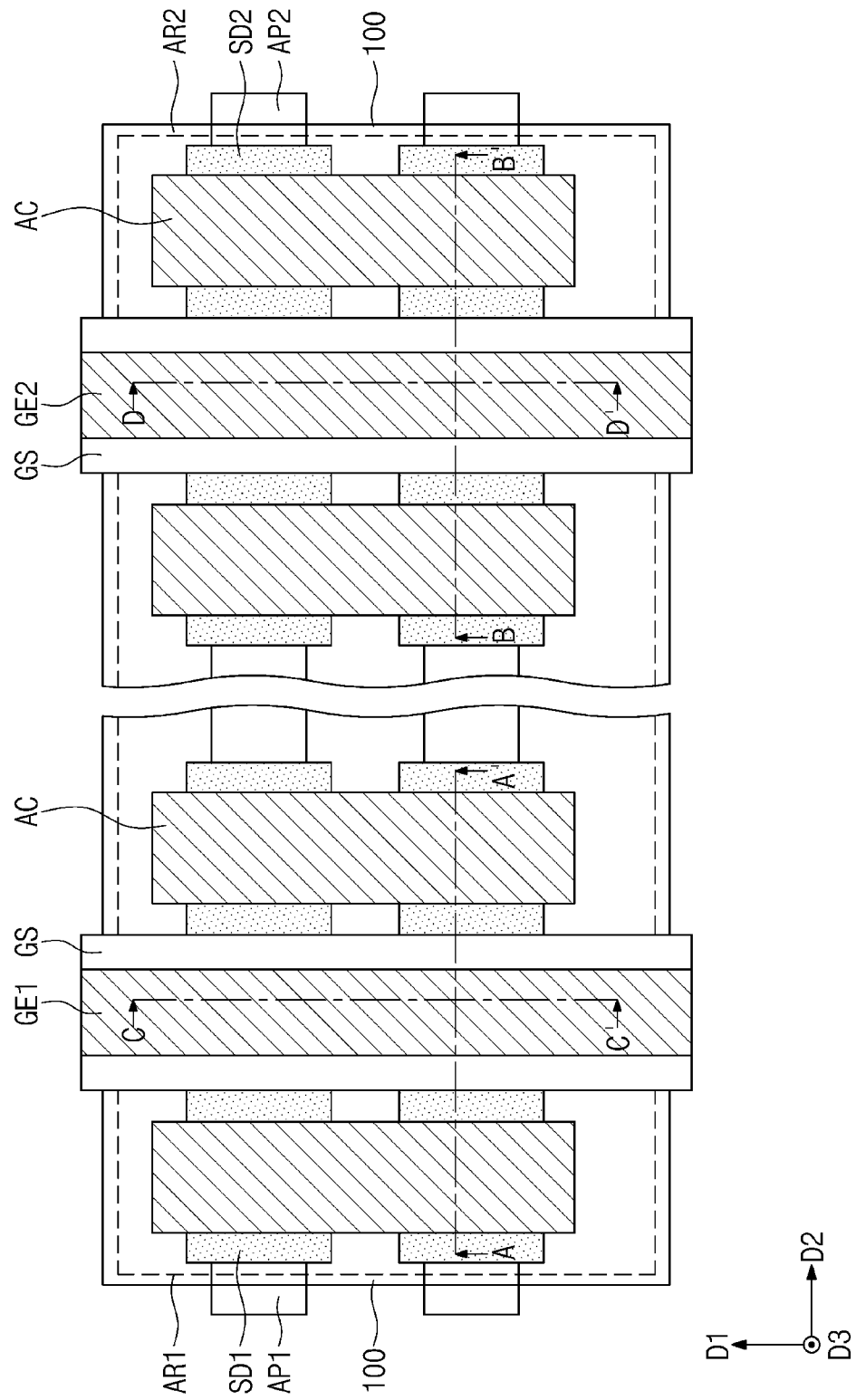
FIG. 41 illustrates a plan view showing a semiconductor device according to some example embodiments of the present disclosure.
Figure 42A:
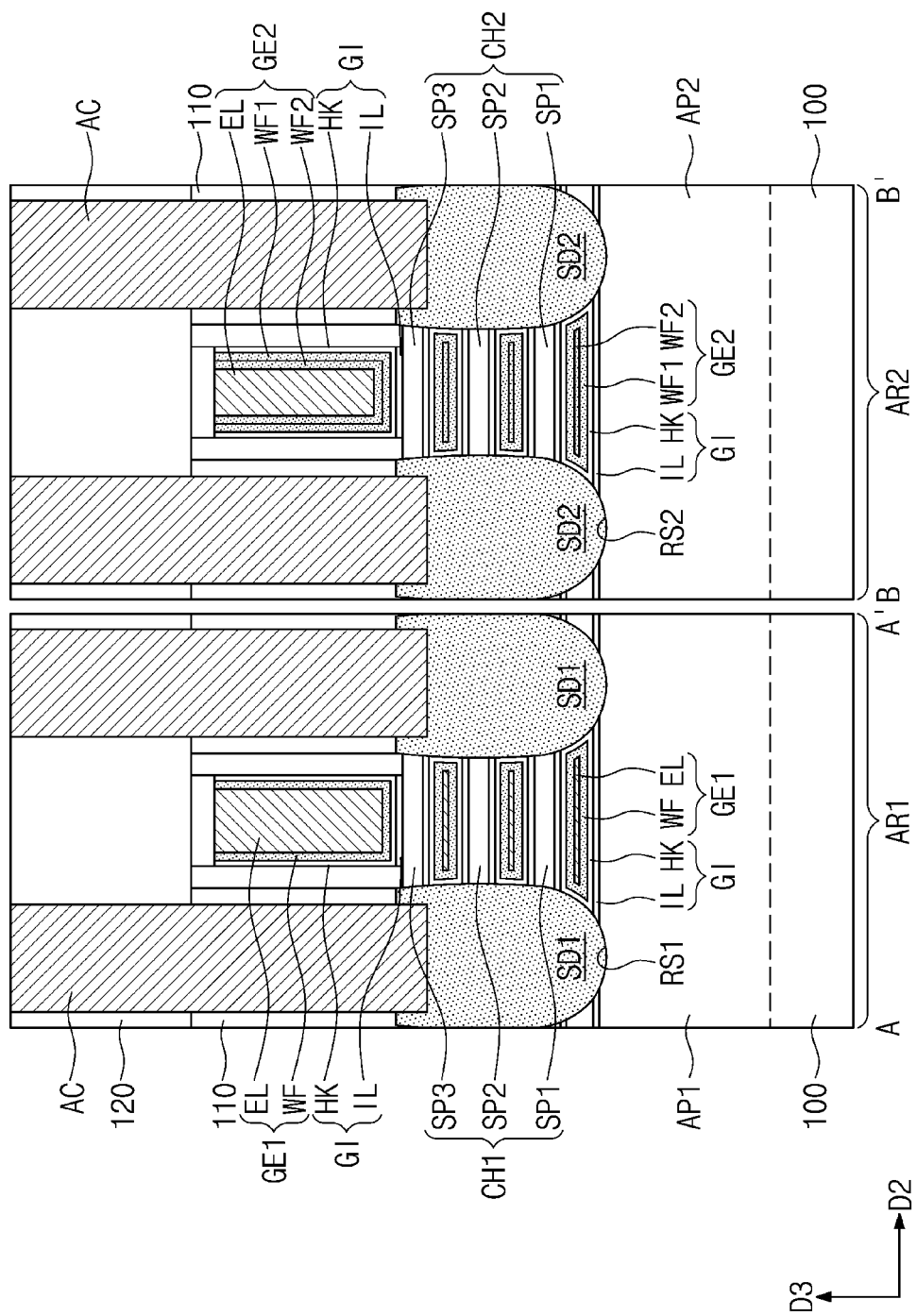
FIG. 42A illustrates a cross-sectional view taken along lines A-A' and B-B' of FIG. 41.
Figure 42B:
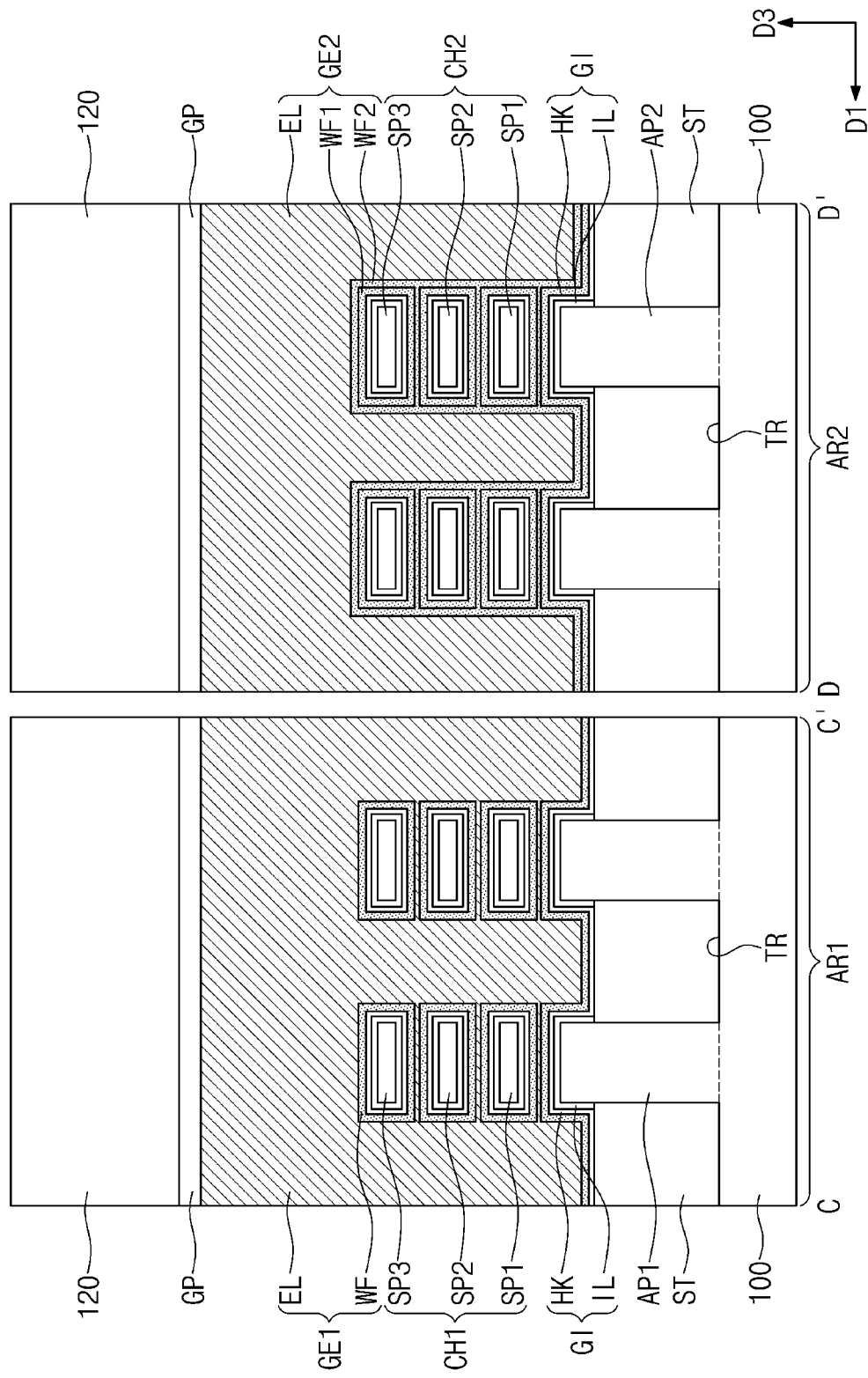
FIG. 42B illustrates a cross-sectional view taken along lines C-C' and D-D' of FIG. 41.

FIG. 41 illustrates a plan view showing a semiconductor device according to some example embodiments of the present disclosure. FIG. 42A illustrates a cross-sectional view taken along lines A-A' and B-B' of FIG. 41. FIG. 42B illustrates a cross-sectional view taken along lines C-C' and D-D' of FIG. 41. In the embodiment that follows, a detailed description of technical features repetitive to the semiconductor device discussed above with reference to FIGS. 25 and 26A to 26C will be omitted, and a difference thereof will be discussed in detail.

Referring to FIGS. 41, 42A, and 42B, a substrate 100 may be provided to include a first active region AR1 and a second active region AR2. First active patterns AP1 may be provided on the first active region AR1, and second active patterns AP2 may be provided on the second active region AR2.

A first channel region CH1 and a pair of first source/drain patterns SD1 may be provided on each of the first active patterns AP1. A second channel region CH2 and a pair of second source/drain patterns SD2 may be provided on each of the second active patterns AP2. Each of the first and second channel regions CH1 and CH2 may include first, second, and third semiconductor patterns SP1, SP2, and SP3 that are sequentially stacked. Each of the first source/drain patterns SD1 may fill a first recess RS1 of the first active pattern AP1. Each of the second source/drain patterns SD2 may fill a second recess RS2 of the second active pattern AP2.

For example, the first source/drain patterns SD1 may have a first conductive type (e.g. p-type), and the second source/drain patterns SD2 may have the same first conductive type (e.g., p-type). For another example, the first source/drain patterns SD1 may have a first conductive type (e.g. p-type), and the second source/drain patterns SD2 may have a second conductive type (e.g., n-type).

A first gate electrode GE1 may be provided to run across the first channel region CH1, and a second gate electrode GE2 may be provided to run across the second channel region CH2. The first gate electrode GE1 may include a work function metal pattern WF and an electrode pattern EL on the work function metal pattern WF. The second gate electrode GE2 may include a first work function metal pattern WF1, a second work function metal pattern WF2 on the first work function metal pattern WF1, and an electrode pattern EL on the second work function metal pattern WF2.

An interface layer IL, a high-k dielectric layer HK, the first work function metal pattern WF1, and the second work function metal pattern WF2 may fill a first space SA1 on the second active region AR2. The electrode pattern EL of the second gate electrode GE2 may not fill the first space SA1. The electrode pattern EL of the second gate electrode GE2 may be provided in a second space SA2 on the third semiconductor pattern SP3.

The work function metal pattern WF of the first gate electrode GE1 may include one or more of a metal nitride layer, a metal nitride layer doped with either aluminum or silicon, and a metal oxide layer. Each of the first and second work function metal patterns WF1 and WF2 of the second gate electrode GE2 may include one or more of a metal nitride layer, a metal nitride layer doped with either aluminum or silicon, and a metal oxide layer. For example, the second work function metal pattern WF2 may include the same material as that of the work function metal pattern WF of the first gate electrode GE1.

As discussed above with reference to FIGS. 21A and 21B, the work function metal pattern WF of the first gate electrode GE1 may contain substantially no impurities DPT. The first work function metal pattern WF1 of the second gate electrode GE2 may have an impurity concentration greater than that of the high-k dielectric layer HK. The second work function metal pattern WF2 of the second gate electrode GE2 may contain substantially no impurities DPT.

A structure of work function metal of the first gate electrode GE1 may be different from that of work function metal of the second gate electrode GE2, and accordingly, a threshold voltage of a transistor on the first active region AR1 may be different from that of a transistor on the second active region AR2.

A semiconductor device according to the present disclosure may include a three-dimensionally structured high-k dielectric layer covering a three-dimensionally structured channel. Although the high-k dielectric layer of the present disclosure has the three-dimensional structure, the high-k dielectric layer may have a uniform impurity concentration. Accordingly, it may be possible to prevent current leakage through the high-k dielectric layer and to improve characteristics of the high-k dielectric layer. In conclusion, the semiconductor device may improve in performance and reliability.

Although some example embodiments of the present disclosure have been discussed with reference to accompanying figures, it will be understood that various changes in form and details may be made therein without departing from the spirit and scope of the present disclosure. It therefore will be understood that the example embodiments described above are just illustrative but not limitative in all aspects.

What is claimed is:

1. A semiconductor device comprising:
a substrate having a first active region and a second active region;
a first active pattern and a second active pattern respectively on the first active region and the second active region;
a first gate electrode and a second gate electrode respectively running across the first active pattern and the second active pattern; and
a high-k dielectric layer between the first active pattern and the first gate electrode and between the second active pattern and the second gate electrode, wherein:
the first gate electrode includes:
 a work function metal pattern on the high-k dielectric layer; and
 an electrode pattern on the work function metal pattern,
the second gate electrode includes:
 a first work function metal pattern on the high-k dielectric layer;
 a second work function metal pattern on the first work function metal pattern; and
 an electrode pattern on the second work function metal pattern,
the first work function metal pattern contains an impurity identical to an impurity of the high-k dielectric layer, and
an impurity concentration of the first work function metal pattern of the second gate electrode is greater than an impurity concentration of the work function metal pattern of the first gate electrode.

2. The semiconductor device of claim 1, wherein a threshold voltage of a transistor on the first active region is different from a threshold voltage of a transistor on the second active region.

3. The semiconductor device of claim 1, wherein the impurity concentration of the first work function metal pattern is greater than an impurity concentration of the high-k dielectric layer.

4. The semiconductor device of claim 1, wherein the impurity is selected from the group consisting of nitrogen (N), fluorine (F), phosphorous (P), boron (B), and a combination thereof.

5. The semiconductor device of claim 1, wherein:
the work function metal pattern of the first gate electrode includes one or more of a metal nitride layer, a metal nitride layer doped with aluminum or silicon, and a metal oxide layer,
each of the first and second work function metal patterns of the second gate electrode includes one or more of a metal nitride layer, a metal nitride layer doped with aluminum or silicon, and a metal oxide layer, and
the second work function metal pattern of the second gate electrode includes a material identical to a material of the work function metal pattern of the first gate electrode.

6. The semiconductor device of claim 1, wherein a thickness of the work function metal pattern of the first gate electrode is substantially a same as a thickness of the second work function metal pattern of the second gate electrode.

7. The semiconductor device of claim 1, further comprising:
a device isolation layer on the substrate and defining the first and second active patterns, wherein
a channel region of each of the first and second active patterns vertically protrudes beyond the device isolation layer.

8. The semiconductor device of claim 7, wherein:
the high-k dielectric layer includes:
a first part on a sidewall of the channel region; and
a second part on a top surface of the channel region, and
an impurity concentration of the first part is substantially a same as an impurity concentration of the second part.

9. The semiconductor device of claim 1, further comprising:
a plurality of semiconductor patterns vertically stacked on each of the first and second active patterns, wherein:
the semiconductor patterns are vertically spaced apart from each other,
the high-k dielectric layer and the first gate electrode fill a first space between the semiconductor patterns on the first active pattern, and
the high-k dielectric layer and the second gate electrode fill a second space between the semiconductor patterns on the second active pattern.

10. The semiconductor device of claim 9, wherein each of the high-k dielectric layer and the work function metal pattern of the first gate electrode partially fills the first space.

11. A semiconductor device comprising:
a substrate;
a device isolation layer on the substrate and defining an active pattern, a channel region of the active pattern vertically protruding beyond the device isolation layer;
a gate electrode running across the channel region; and
a high-k dielectric layer between the channel region and the gate electrode, wherein:
the gate electrode includes:
a work function metal pattern on the high-k dielectric layer; and
an electrode pattern on the work function metal pattern, the high-k dielectric layer includes:
a first part on a sidewall of the channel region; and
a second part on a top surface of the channel region,
the work function metal pattern and the high-k dielectric layer contain a same impurity, and
an impurity concentration of the first part of the high-k dielectric layer is less than an impurity concentration of the work function metal pattern.

12. The semiconductor device of claim 11, wherein the first part extends from the second part along the sidewall of the channel region to a top surface of the device isolation layer.

13. The semiconductor device of claim 11, wherein the impurity concentration of the first part is substantially a same as an impurity concentration of the second part.

14. The semiconductor device of claim 11, wherein the impurity is selected from the group consisting of nitrogen (N), fluorine (F), phosphorous (P), boron (B), and a combination thereof.

15. The semiconductor device of claim 11, wherein the work function metal pattern is in direct contact with the high-k dielectric layer.

16. A semiconductor device comprising:
a substrate;
a first semiconductor pattern and a second semiconductor pattern vertically stacked on the substrate, the first and second semiconductor patterns being vertically spaced apart from each other;
a gate electrode on the first and second semiconductor patterns; and
a high-k dielectric layer between the gate electrode and the first and second semiconductor patterns, wherein:
the gate electrode includes:
a first work function metal pattern on the high-k dielectric layer; and
an electrode pattern on the first work function metal pattern,
the high-k dielectric layer and the gate electrode fill a first space between the first and second semiconductor patterns,
the first work function metal pattern and the high-k dielectric layer contain a same impurity, and
an impurity concentration of the high-k dielectric layer is less than an impurity concentration of the first work function metal pattern.

17. The semiconductor device of claim 16, wherein each of the high-k dielectric layer and the first work function metal pattern partially fills the first space.

18. The semiconductor device of claim 16, wherein:
the gate electrode further includes a second work function metal pattern, and
the high-k dielectric layer, the first work function metal pattern, the second work function metal pattern, and the electrode pattern sequentially fill a second space between a pair of gate spaces on the second semiconductor pattern.

19. The semiconductor device of claim 18, wherein:
the high-k dielectric layer, the first work function metal pattern, and the second work function metal pattern fill the first space, and
the electrode pattern does not fill the first space.

20. The semiconductor device of claim 16, wherein the impurity is selected from the group consisting of nitrogen (N), fluorine (F), phosphorous (P), boron (B), and a combination thereof.

* * * * *